(12) United States Patent
Kobayashi et al.

(10) Patent No.: US 12,120,918 B2
(45) Date of Patent: Oct. 15, 2024

(54) DISPLAY DEVICE

(71) Applicant: Semiconductor Energy Laboratory Co., Ltd., Kanagawa-ken (JP)

(72) Inventors: Hidetomo Kobayashi, Kanagawa (JP); Takayuki Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 385 days.

(21) Appl. No.: 17/619,790

(22) PCT Filed: Jun. 15, 2020

(86) PCT No.: PCT/IB2020/055557
§ 371 (c)(1),
(2) Date: Dec. 16, 2021

(87) PCT Pub. No.: WO2020/261036
PCT Pub. Date: Dec. 30, 2020

(65) Prior Publication Data
US 2022/0352279 A1    Nov. 3, 2022

(30) Foreign Application Priority Data
Jun. 28, 2019  (JP) .................................. 2019-121482

(51) Int. Cl.
*H10K 59/121*  (2023.01)
*H10K 59/131*  (2023.01)

(52) U.S. Cl.
CPC ....... *H10K 59/1213* (2023.02); *H10K 59/131* (2023.02)

(58) Field of Classification Search
CPC .. H10K 59/1213; H10K 59/131; H10K 59/12; H10K 50/00; H10K 59/00;
(Continued)

(56) References Cited

U.S. PATENT DOCUMENTS 8,022,905 B2   9/2011   Yamashita et al.
8,319,528 B2   11/2012  Kimura et al.
(Continued)

FOREIGN PATENT DOCUMENTS

CN   108877663 A    11/2018
JP   2012-042569 A   3/2012
(Continued)

OTHER PUBLICATIONS

International Search Report (Application No. PCT/IB2020/055557) Dated Sep. 24, 2020.
(Continued)

*Primary Examiner* — Yasser A Abdelaziz
(74) *Attorney, Agent, or Firm* — Husch Blackwell LLP

(57) ABSTRACT

A display device with less display unevenness is provided. The display device includes a first layer and a second layer over the first layer; the first layer includes first circuits arranged in m rows and n columns; the second layer includes pixel blocks arranged in the m rows and the n columns; the pixel blocks each comprise pixels arranged in a rows and b columns; the pixel block includes a first wiring and a second wiring electrically connected to the pixel; the first wiring and the second wiring included in the pixel block in the i-th row and the j-th column are each electrically connected to the first circuit in the i-th row and the j-th column; the first wiring has a function of supplying an input signal from the first circuit to the pixel; and the second wiring has a function of supplying an output signal from the pixel to the first circuit.

10 Claims, 35 Drawing Sheets

(58) Field of Classification Search
CPC .. G09G 2300/023; G09G 3/3225; G09G 3/20; H01L 27/088; H01L 21/8234; H01L 29/786; H01L 27/1225; H05B 33/02; H05B 33/14; G09F 9/30
See application file for complete search history.

(56) References Cited

U.S. PATENT DOCUMENTS

| | | |
|---|---|---|
| 8,378,403 B2 | 2/2013 | Kato |
| 8,541,846 B2 | 9/2013 | Saito |
| 8,637,865 B2 | 1/2014 | Kato |
| 9,041,453 B2 | 5/2015 | Miyake et al. |
| 9,070,323 B2 | 6/2015 | Cok |
| 9,287,258 B2 | 3/2016 | Saito |
| 9,336,709 B2 | 5/2016 | Lin et al. |
| 9,478,187 B2 | 10/2016 | Miyake et al. |
| 9,501,960 B2 | 11/2016 | Park et al. |
| 9,685,131 B2 | 6/2017 | Tanaka et al. |
| 9,760,102 B2 | 9/2017 | Tanaka et al. |
| 10,586,495 B2 | 3/2020 | Kobayashi et al. |
| 2010/0265224 A1 | 10/2010 | Cok |
| 2010/0309233 A1 | 12/2010 | Choi |
| 2011/0031491 A1 | 2/2011 | Yamazaki et al. |
| 2011/0216876 A1 | 9/2011 | Amano et al. |
| 2012/0327060 A1 | 12/2012 | Ohhashi et al. |
| 2013/0169351 A1 | 7/2013 | Chang et al. |
| 2013/0249857 A1 | 9/2013 | Kimura |
| 2014/0078123 A1 | 3/2014 | Park et al. |
| 2014/0132491 A1 | 5/2014 | Kim et al. |
| 2014/0138778 A1 | 5/2014 | Kato |
| 2014/0145625 A1 | 5/2014 | Yamazaki et al. |
| 2015/0206490 A1 | 7/2015 | Lim et al. |
| 2015/0206492 A1 | 7/2015 | Lee et al. |
| 2015/0279278 A1 | 10/2015 | Park et al. |
| 2015/0293546 A1 | 10/2015 | Tanaka et al. |
| 2015/0310801 A1 | 10/2015 | Lin et al. |
| 2016/0019856 A1 | 1/2016 | Tanaka et al. |
| 2016/0190149 A1 | 6/2016 | Saito |
| 2016/0275912 A1 | 9/2016 | Lee et al. |
| 2016/0307488 A1 | 10/2016 | Kim et al. |
| 2016/0370635 A1 | 12/2016 | Tanaka et al. |
| 2017/0039976 A1 | 2/2017 | Miyake et al. |
| 2017/0047032 A1 | 2/2017 | Nishiyama et al. |
| 2017/0047033 A1 | 2/2017 | Tanaka et al. |
| 2017/0047038 A1 | 2/2017 | Noma et al. |
| 2017/0110459 A1 | 4/2017 | Saito |
| 2017/0140679 A1 | 5/2017 | Tomoda et al. |
| 2017/0178586 A1 | 6/2017 | Kim et al. |
| 2017/0186778 A1 | 6/2017 | Miyake et al. |
| 2017/0221429 A1 | 8/2017 | Kobayashi et al. |
| 2017/0287381 A1 | 10/2017 | Park et al. |
| 2017/0287387 A1 | 10/2017 | Eguchi |
| 2018/0012536 A1 | 1/2018 | Shishido |
| 2018/0012549 A1 | 1/2018 | Lee et al. |
| 2018/0026218 A1* | 1/2018 | Kobayashi ........... G09G 3/3266 349/143 |
| 2018/0047326 A1* | 2/2018 | Tsuchida ............... G09G 3/2059 |
| 2018/0061307 A1* | 3/2018 | Inoue ..................... H10K 59/12 |
| 2021/0383762 A1 | 12/2021 | Kobayashi et al. |

FOREIGN PATENT DOCUMENTS

| | | |
|---|---|---|
| JP | 2014-007399 A | 1/2014 |
| JP | 2018-022143 A | 2/2018 |
| KR | 2016-0111823 A | 9/2016 |
| KR | 2017-0075618 A | 7/2017 |

OTHER PUBLICATIONS

Written Opinion (Application No. PCT/IB2020/055557) Dated Sep. 24, 2020.

\* cited by examiner

FIG. 33A
|  | Intermediate state<br>New crystalline phase |  |
|---|---|---|
| Amorphous | Crystalline | Crystal |
| • completely amorphous | • CAAC<br>• nc<br>• CAC<br>excluding single crystal and poly crystal | • single crystal<br>• poly crystal |
FIG. 33B
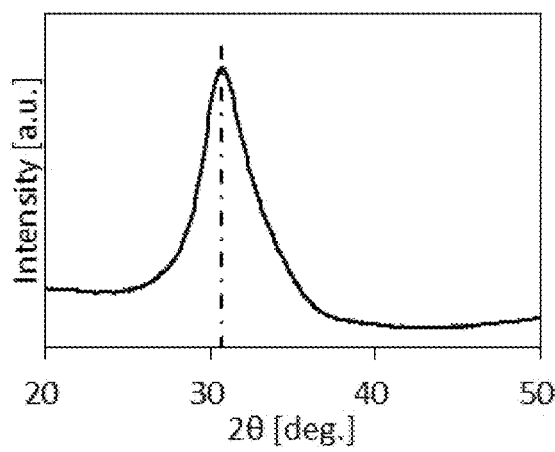
FIG. 33C
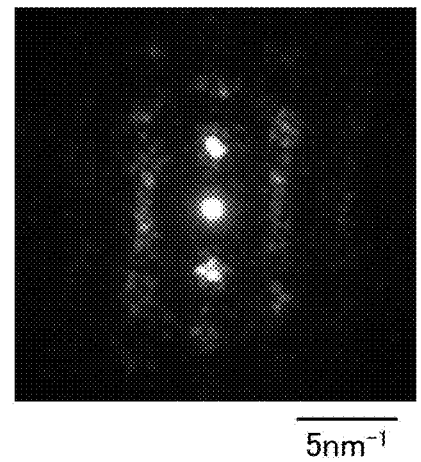

FIG. 35A
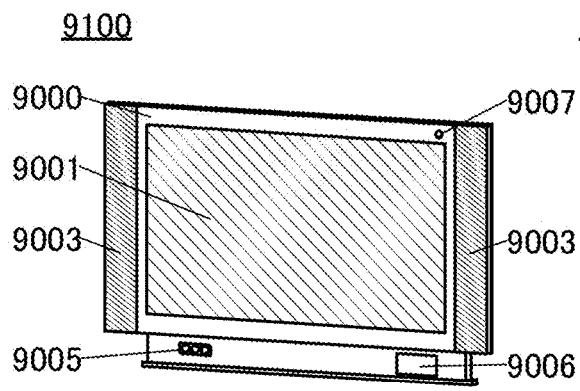
FIG. 35B
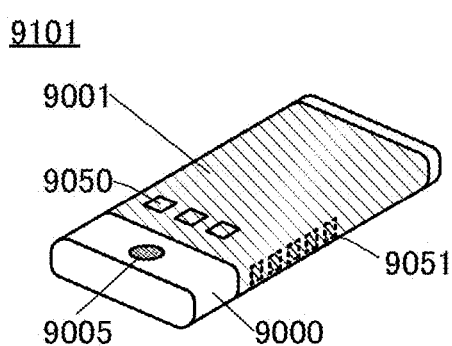
FIG. 35C
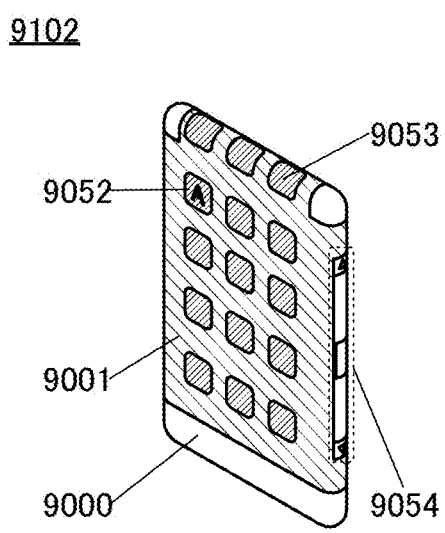
FIG. 35D
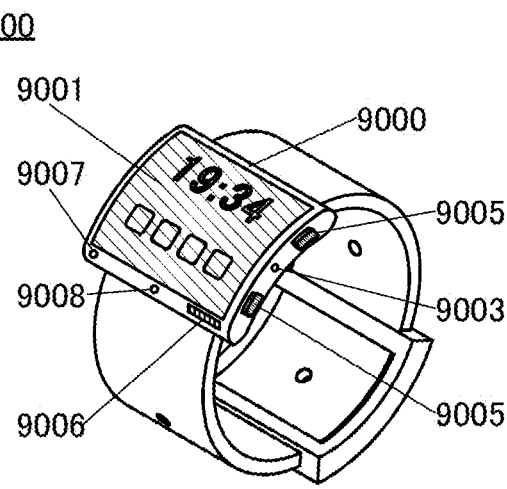
FIG. 35E
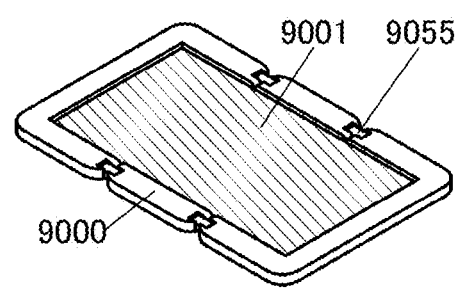
FIG. 35F
FIG. 35G
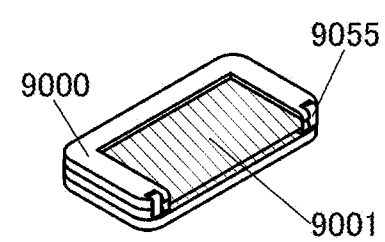

DISPLAY DEVICE

This application is a 371 of international application PCT/IB2020/055557 filed on Jun. 15, 2020 which is incorporated herein by reference.

This application is based on Japanese Patent Application Serial No. 2019-121482 filed on Jun. 28, 2019, the entire contents of which are hereby incorporated herein by reference.

TECHNICAL FIELD

One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device that achieves increased field-effect mobility (simply referred to as mobility or µFE in some cases) by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for transistors using polycrystalline silicon or amorphous silicon can be retrofitted and utilized. A transistor using a metal oxide has field-effect mobility higher than that in the case where amorphous silicon is used; thus, a high-functional display device provided with a driver circuit can be obtained.

In addition, as display devices for augmented reality (AR) or virtual reality (VR), wearable display devices and stationary display devices are becoming widespread. Examples of wearable display devices include a head mounted display (HMD) and an eyeglass-type display device. Examples of stationary display devices include a head-up display (HUD).

In an electronic device having an imaging device such as a digital camera, a viewfinder is used to check an image to be captured before capturing the image. An electronic viewfinder is used as the viewfinder. A display portion is provided in the electronic viewfinder, and an image obtained by an image-pickup device can be displayed as an image on the display portion. For example, Patent Document 2 discloses an electronic viewfinder that can provide a good visibility state from a central portion of an image to a peripheral portion of the image.

REFERENCE

Patent Document

[Patent Document 1] Japanese Published Patent Application No. 2014-7399
[Patent Document 2] Japanese Published Patent Application No. 2012-42569

SUMMARY OF THE INVENTION

Problems to be Solved by the Invention

With a display device, such as a head mounted display (HMD), where the display surface and a user are close to each other, the user is likely to perceive pixels and strongly feel granularity, which might diminish the sense of immersion or realistic feeling of AR or VR. In an electronic viewfinder, as in an optical finder, an eyepiece is provided, and when the user brings his/her eyes closer to the eyepiece, an image displayed on a display portion of the electronic viewfinder is perceived. This makes the distance between the user and the display portion of the electronic viewfinder short. Accordingly, the user is likely to perceive pixels provided in the display portion and thus sometimes feels granularity strongly. In view of the foregoing, an HMD and an electronic viewfinder require a display device including fine pixels such that the user does not perceive the pixels. For example, the resolution is preferably 1000 ppi or higher, further preferably 2000 ppi or higher, still further preferably 5000 ppi or higher. Moreover, it is preferable that in a display device provided in an electronic viewfinder, for example, an image having a resolution of 4K (the number of pixels: 3840×2160), 5K (the number of pixels: 5120×2880), or higher can be displayed.

As the number of pixels in a display device becomes larger, the number of transistors and display elements included in the display device increases; thus, display unevenness due to characteristic variation of the transistors and characteristic variation of the display elements becomes noticeable.

An object of one embodiment of the present invention is to provide a display device with less display unevenness. Another object of one embodiment of the present invention is to provide a display device with a small bezel. Another object of one embodiment of the present invention is to provide a small-size display device. Another object of one embodiment of the present invention is to provide a display device with high layout flexibility. Another object of one embodiment of the present invention is to provide a display device with a high resolution. Another object of one embodiment of the present invention is to provide a display device that can display a high-quality image. Another object of one embodiment of the present invention is to provide a display device that can display a highly realistic image. Another object of one embodiment of the present invention is to provide a display device that can display a high-luminance image. Another object of one embodiment of the present invention is to provide a display device that operates at high speed. Another object of one embodiment of the present invention is to provide a display device with low power consumption. Another object of one embodiment of the present invention is to provide an inexpensive display device. Another object of one embodiment of the present invention is to provide a highly reliable display device. Another object of one embodiment of the present invention is to provide a novel display device. Another object of one embodiment of the present invention is to provide a method for operating the display device. Another object of one embodiment of the present invention is to provide an electronic device including the display device.

Note that the description of these objects does not preclude the existence of other objects. One embodiment of the present invention does not have to achieve all of these objects. Objects other than these can be derived from the description of the specification, the drawings, the claims, and the like.

Means for Solving the Problems

One embodiment of the present invention is a display device including a first layer and a second layer over the first layer. The first layer includes first circuits arranged in m rows and n columns (m and n are each an integer greater than or equal to 1 and a product of m and n is an integer greater than or equal to 2). The second layer includes pixel blocks arranged in the m rows and the n columns; the pixel blocks each include pixels arranged in a rows and b columns (a and b are each an integer greater than or equal to 1). The pixel block includes a first wiring and a second wiring electrically connected to the pixel. Preferably, the first wiring and the second wiring included in the pixel block in the i-th row and the j-th column (i is an integer greater than or equal to 1 and less than or equal to m, and j is an integer greater than or equal to 1 and less than or equal to n) are each electrically connected to the first circuit in the i-th row and the j-th column. Preferably, the first wiring has a function of supplying an input signal from the first circuit to the pixel and the second wiring has a function of supplying an output signal from the pixel to the first circuit.

In the above-described display device, each of the first circuits includes a correction data generation circuit, a logic circuit, and a source driver circuit. The correction data generation circuit preferably has a function of converting the output signal into correction data. The logic circuit preferably has a function of correcting a video signal input to the first circuit on the basis of the correction data and generating the corrected video signal. The source driver circuit preferably has a function of converting the corrected video signal into the input signal.

In the above-described display device, the pixel block in the i-th row and the j-th column has a region overlapping with the first circuit in the i-th row and the j-th column.

In the above-described display device, preferably, the pixel block in the p-th row and the q-th column (p is an integer different from i and is greater than or equal to 1 and less than or equal to m, and q is an integer different from j and is greater than or equal to 1 and less than or equal to n) does not overlap with the first circuit in the p-th row and the q-th column.

In the above-described display device, the second layer preferably further includes m second circuits arranged in the column direction. Preferably, the pixel block includes a third wiring electrically connected to a plurality of pixels arranged in the row direction, and the third wiring included in the pixel block in the i-th row is electrically connected to the i-th second circuit.

In the above-described display device, the first layer preferably further includes m second circuits arranged in the column direction. Preferably, the pixel block includes a third wiring electrically connected to a plurality of pixels arranged in the row direction, and the third wiring included in the pixel block in the i-th row is electrically connected to the i-th second circuit. In addition, the pixel block in the i-th row and the j-th column preferably has a region overlapping with any one or more of the second circuits.

In the above-described display device, the correction data generation circuit preferably includes a memory circuit. The first layer preferably includes a first circuit layer and a second circuit layer over the first circuit layer. Preferably, the first circuit layer includes the logic circuit and the logic circuit includes a transistor including silicon in a channel formation region. Preferably, the second circuit layer includes the memory circuit and the memory circuit includes a transistor including a metal oxide in a channel formation region, and the metal oxide includes In, an element M (M is any one or more of Al, Ga, Y, and Sn), and Zn.

In the above-described display device, preferably, the pixel includes a transistor including a metal oxide in a channel formation region, and the metal oxide includes In, the element M (M is any one or more of Al, Ga, Y, and Sn), and Zn.

In the above-described display device, the pixel preferably includes a transistor including silicon in a channel formation region.

Effect of the Invention

A display device with less display unevenness can be provided in accordance with one embodiment of the present invention. A display device with a small bezel can be provided in accordance with one embodiment of the present invention. A small-size display device can be provided in accordance with one embodiment of the present invention. A display device with high layout flexibility can be provided in accordance with one embodiment of the present invention. A display device with a high resolution can be provided in accordance with one embodiment of the present invention. A display device that can display a high-quality image can be provided in accordance with one embodiment of the present invention. A display device that can display a highly realistic image can be provided in accordance with one embodiment of the present invention. A display device that can display a high-luminance image can be provided in accordance with one embodiment of the present invention. A display device that operates at high speed can be provided in accordance with one embodiment of the present invention. A display device with low power consumption can be provided in accordance with one embodiment of the present invention. An inexpensive display device can be provided in accordance with one embodiment of the present invention. A highly reliable display device can be provided in accordance with one embodiment of the present invention. A novel display device can be provided in accordance with one embodiment of the present invention. A method for operating the display device can be provided in accordance with one embodiment of the present invention. An electronic device including the display device can be provided in accordance with one embodiment of the present invention.

Note that the description of these effects does not preclude the existence of other effects. One embodiment of the present invention does not have to have all of these effects. Other effects can be derived from the description of the specification, the drawings, the claims, and the like.

BRIEF DESCRIPTION OF THE DRAWINGS

FIG. 33A is a diagram showing the classification of crystal structures of IGZO. FIG. 33B is a graph showing an XRD spectrum of a CAAC-IGZO film. FIG. 33C is an image showing a nanobeam electron diffraction pattern of a CAAC-IGZO film.

FIG. 35A, FIG. 35B, FIG. 35C, FIG. 35D, FIG. 35E, FIG. 35F, and FIG. 35G are perspective views of examples of electronic devices.

MODE FOR CARRYING OUT THE INVENTION

Figure 1A:
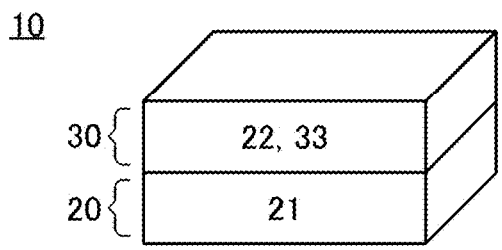
FIG. 1A is a schematic view illustrating a structure example of a display device.

Hereinafter, embodiments will be described with reference to the drawings. Note that the embodiments can be implemented in many different modes and it is readily understood by those skilled in the art that modes and details thereof can be changed in various ways without departing from the spirit and scope thereof. Therefore, the present invention should not be interpreted as being limited to the description of the embodiments below.

In each drawing described in this specification, the size, the layer thickness, or the region of each component is exaggerated for clarity in some cases.

Ordinal numbers such as "first," "second," and "third" used in this specification are used in order to avoid confusion among components and do not limit the components numerically.

In this specification and the like, terms for describing arrangement such as "over" and "under" are used for convenience to describe the positional relation between components with reference to drawings. The positional relation between components is changed as appropriate in accordance with the direction in which each component is described. Thus, without limitation to terms described in this specification, the description can be changed appropriately depending on the situation.

In this specification and the like, functions of a source and a drain of a transistor are sometimes switched from each other depending on the polarity of the transistor, the case where the direction of current flow is changed in circuit operation, or the like. Therefore, the terms "source" and "drain" can be used interchangeably.

In this specification and the like, the terms "electrode," "wiring," and "terminal" do not functionally limit those components. For example, an "electrode" is used as part of a "wiring" in some cases, and vice versa. Furthermore, the term "electrode" or "wiring" can also mean the case where a plurality of "electrodes" or "wirings" are formed in an integrated manner, for example. For example, a "terminal" is used as part of a "wiring" or an "electrode" in some cases, and vice versa. Furthermore, the term "terminal" can also mean the case where a plurality of "electrodes," "wirings," "terminals," or the like are formed in an integrated manner, for example. Therefore, for example, an "electrode" can be part of a "wiring" or a "terminal," and a "terminal" can be part of a "wiring" or an "electrode." The term "electrode," "wiring," or "terminal" is sometimes replaced with the term "region," for example.

In this specification and the like, as for a "resistor", a resistance value depends on a length of a wiring. Alternatively, a resistor includes a case where it can be formed by connection between a conductor used for a wiring and another conductor with a low efficiency different from that of the conductive layer through a contact. Alternatively, the resistance value is sometimes determined by connection to a conductor with resistivity different from that of a conductor used for a wiring. Alternatively, the resistance value is sometimes determined by doping a semiconductor with an impurity.

In this specification and the like, the expression "electrically connected" includes the case where components are directly connected to each other and the case where components are connected through an "object having any electric function." Here, there is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit. In addition, the expression "directly connected" includes the case where a wiring is formed in different conductive layers through a contact. Note that a wiring may be formed of conductors that contain one or more of the same elements or may be formed of conductors that contain different elements.

In this specification and the like, the term "film" and the term "layer" can be interchanged with each other. For example, in some cases, the term "conductive layer" and the term "insulating layer" can be interchanged with the term "conductive film" and the term "insulating film," respectively.

Unless otherwise specified, off-state current in this specification and the like refers to drain current of a transistor in an off state (also referred to as a non-conduction state or a cutoff state). Unless otherwise specified, an off state refers to a state where the voltage $V_{gs}$ between its gate and source is lower than the threshold voltage $V_{th}$ in an n-channel transistor (higher than $V_{th}$ in a p-channel transistor).

In the drawings, the size, the layer thickness, or the region is exaggerated for clarity in some cases. Therefore, they are not limited to the illustrated scale. Note that the drawings are schematic illustrations, and embodiments of the present invention are not limited to shapes or values illustrated in the drawings. For example, in an actual manufacturing process, a layer, a resist mask, or the like might be unintentionally reduced in size by treatment such as etching, which might not be reflected in the drawings for easy understanding. In the drawings, the same portions or portions having similar functions and materials are denoted by the same reference numerals in different drawings, and explanation thereof is not repeated in some cases. Furthermore, the same hatch pattern is used for the portions having similar functions and materials, and the portions are not especially denoted by reference numerals in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when an OS transistor is described, it can also be referred to as a transistor including an oxide or an oxide semiconductor.

Embodiment 1

In this embodiment, a display device that is one embodiment of the present invention is described.

One embodiment of the present invention is a display device including a first layer and a second layer over the first layer. The first layer includes first circuits that are arranged in m rows and n columns (m and n are each an integer greater than or equal to 1 and a product of m and n is an integer greater than or equal to 2). The second layer includes pixel blocks that are arranged in m rows and n columns and each of the pixel blocks includes pixels that are arranged in a rows and b columns (a and b are each an integer greater than or equal to 1). Preferably, the pixel block includes a first wiring and a second wiring that are each electrically connected to a pixel, and the first wiring and the second wiring included in the pixel block in the i-th row and the j-th column (i is an integer greater than or equal to 1 and less than or equal to m, and j is an integer greater than or equal to 1 and less than or equal to n) are each electrically connected to the first circuit in the i-th row and the j-th column. Preferably, the first wiring has a function of supplying an input signal from the first circuit to the pixel, and the second wiring has a function of supplying an output signal from the pixel to the first circuit.

In the above-described display device, the first circuits each include a correction data generation circuit, a logic circuit, and a source driver circuit. The correction data generation circuit preferably has a function of converting an output signal into correction data. The logic circuit preferably has a function of correcting a video signal input to the first circuit on the basis of the correction data and generating the corrected video signal. The source driver circuit preferably has a function of converting the corrected video signal into an input signal.

Note that in this specification and the like, an operation in which the first circuit corrects the video signal on the basis of the output signal from a pixel and outputs the corrected video signal to the pixel as an input signal is described as a correction or a correction operation in some cases. Correcting a signal (input signal) input to the pixel on the basis of the current value (output signal) flowing to the pixel can reduce variation in luminance between pixels.

In a display device of one embodiment of the present invention, a display device with less display unevenness can be obtained by the correction operation performed by the first circuit. The display device of one embodiment of the present invention includes a plurality of first circuits, and the plurality of first circuits can conduct correction operations in parallel. The time required for the correction operation in the whole display portion can be shortened when the plurality of first circuits perform the correction operations in parallel, as compared with when the correction operation are sequentially performed row by row to the display portion. Thus, the display device of one embodiment of the present invention can operate at high speed. For example, the time required for writing an input signal corresponding to an image of one frame to a pixel can be shortened. Thus, even the display device with a large number of pixels can operate at high speed and thus can be a display device with a high resolution. For example, the resolution of the display device of one embodiment of the present invention can be 1000 ppi or higher, 2000 ppi or higher, or 5000 ppi or higher.

The pixel block in the i-th row and the j-th column preferably includes a region overlapping with the first circuit in the i-th row and the j-th column. When the pixel block includes a region overlapping with the first circuit, the area of a bezel where the pixel blocks are not provided can be reduced. Therefore, a display device with a small bezel can be obtained. In addition, by narrowing the bezel of the display device, a small-size display device can be obtained. Note that a structure may be employed in which the pixel block in the p-th row and the q-th column (p is an integer that is different from i and is greater than or equal to 1 and less than or equal to m, and q is an integer that is different from j and is greater than or equal to 1 and less than or equal to n) does not overlap with the first circuit in the p-th row and the q-th column.

The second layer preferably includes m second circuits arranged in the column direction. The pixel block includes a third wiring electrically connected to a plurality of pixels arranged in the row direction. The third wiring included in the pixel block in the i-th row is preferably electrically connected to the i-th second circuit. Alternatively, the first layer may include m second circuits arranged in the column direction. Moreover, the pixel block in the i-th row and the j-th column preferably includes a region overlapping with any one or more of the second circuits. When the pixel block includes a region overlapping with the second circuit, a small-size display device can be obtained.

The correction data generation circuit preferably includes a memory circuit. The first layer includes a first circuit layer and a second circuit layer over the first circuit layer. The first circuit layer preferably includes a logic circuit, and the logic circuit preferably includes a transistor including silicon in a channel formation region. The second circuit layer includes a memory circuit, and the memory circuit preferably includes a transistor including a metal oxide in a channel formation region. Furthermore, the metal oxide preferably contains In, an element M (M is one or more of Al, Ga, Y, and Sn), and Zn. In addition, it is more preferable that one or both of Ga and Sn be contained as the element M.

A display device of one embodiment of the present invention will be described below in detail.

Structure Example 1 of Display Device

FIG. 1A is a schematic diagram illustrating a display device 10 that is one embodiment of the present invention. The display device 10 has a stacked-layer structure of a first layer 20 and a second layer 30 over the first layer 20 as illustrated in FIG. 1A. Although FIG. 1A illustrates a structure in which the second layer 30 is provided over the first layer 20, one embodiment of the present invention is not limited to the structure. The first layer 20 may be provided over the second layer 30. One or more of an interlayer insulating layer and a wiring layer may be provided between the first layer 20 and the second layer 30. Each of the interlayer insulating layer and the wiring layer provided between the first layer 20 and the second layer 30 may have a plurality of layers.

The first layer 20 includes the first circuit 21. The second layer 30 includes the second circuit 22 and the display portion 33. The first circuit 21 and the second circuit 22 are circuits for driving the display device 10. Therefore, these circuits can each be referred to as a driver circuit. The first circuit 21 has a function of generating an input signal input to a pixel 34. The second circuit 22 has a function of selecting the pixel 34 to which the input signal generated by the first circuit 21 is to be written and can also be referred to as a gate driver circuit.

Figure 1B:
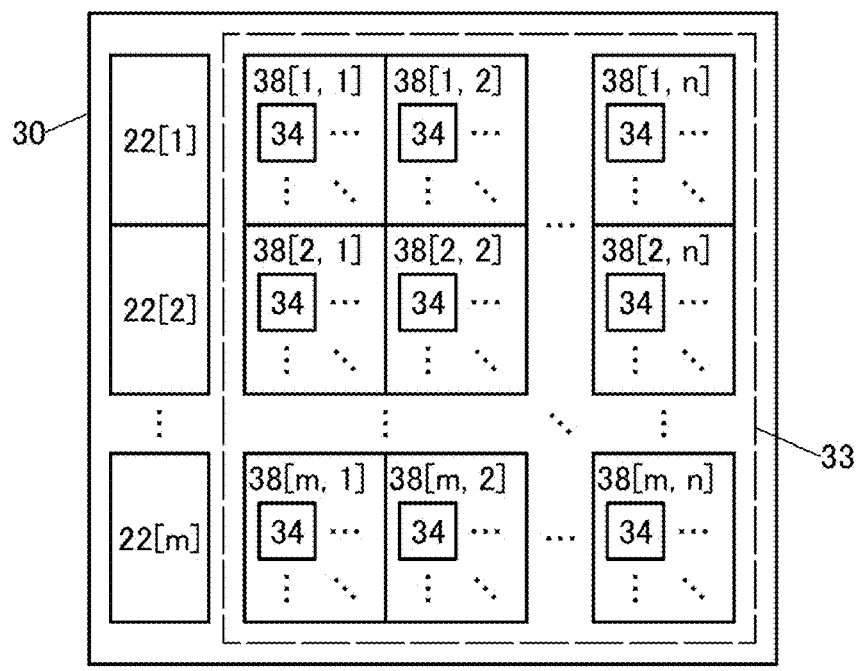
FIG. 1B is a block diagram illustrating the structure example of the display device.
Figure 1B:
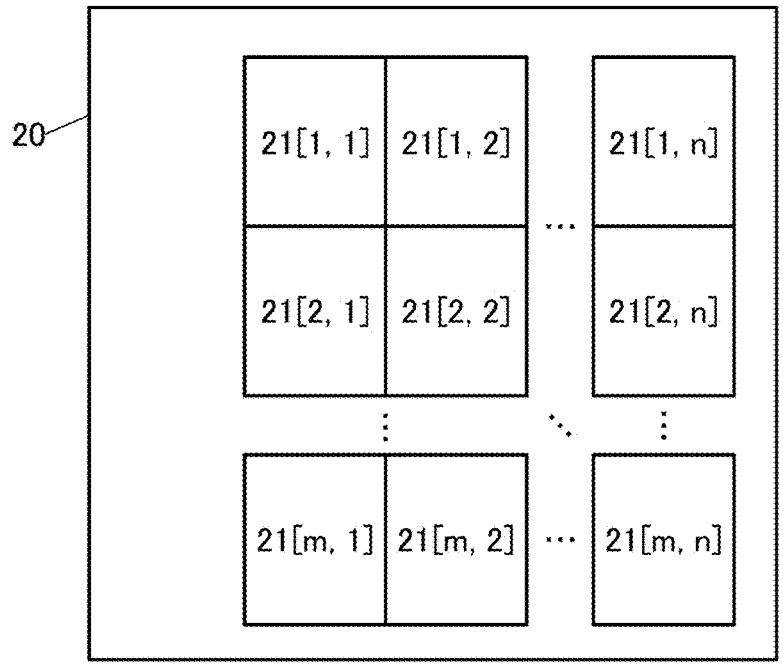

FIG. 1B is a block diagram illustrating a structure example of the display device 10. The first layer 20 includes first circuits 21[1, 1] to 22[m, n] that are arranged in them rows and the n columns. The second layer 30 includes the display portion 33, and the display portion 33 includes pixel blocks 38[1, 1] to 38[m, n] that are arranged in them rows and then columns. Each of the pixel blocks 38[1, 1] to 38[m, n] includes a plurality of pixels 34. The second layer 30 includes m second circuits 22[1] to 22[m] arranged in the column direction.

In this specification and the like, when a plurality of components are denoted by the same reference numerals, and in particular need to be distinguished from each other, an identification sign such as "[m,n]" or "[m]" is sometimes added to the reference numerals. For example, the pixel block 38 in the first row and the first column is referred to as the pixel block 38[1, 1], and the pixel block 38 in the m-th row and the n-th column is referred to as the pixel block 38[m, n]. For example, the first second circuit 22 and the m-th second circuit 22 are referred to as the second circuit 22[1] and the second circuit 22[m], respectively.

Figure 2:
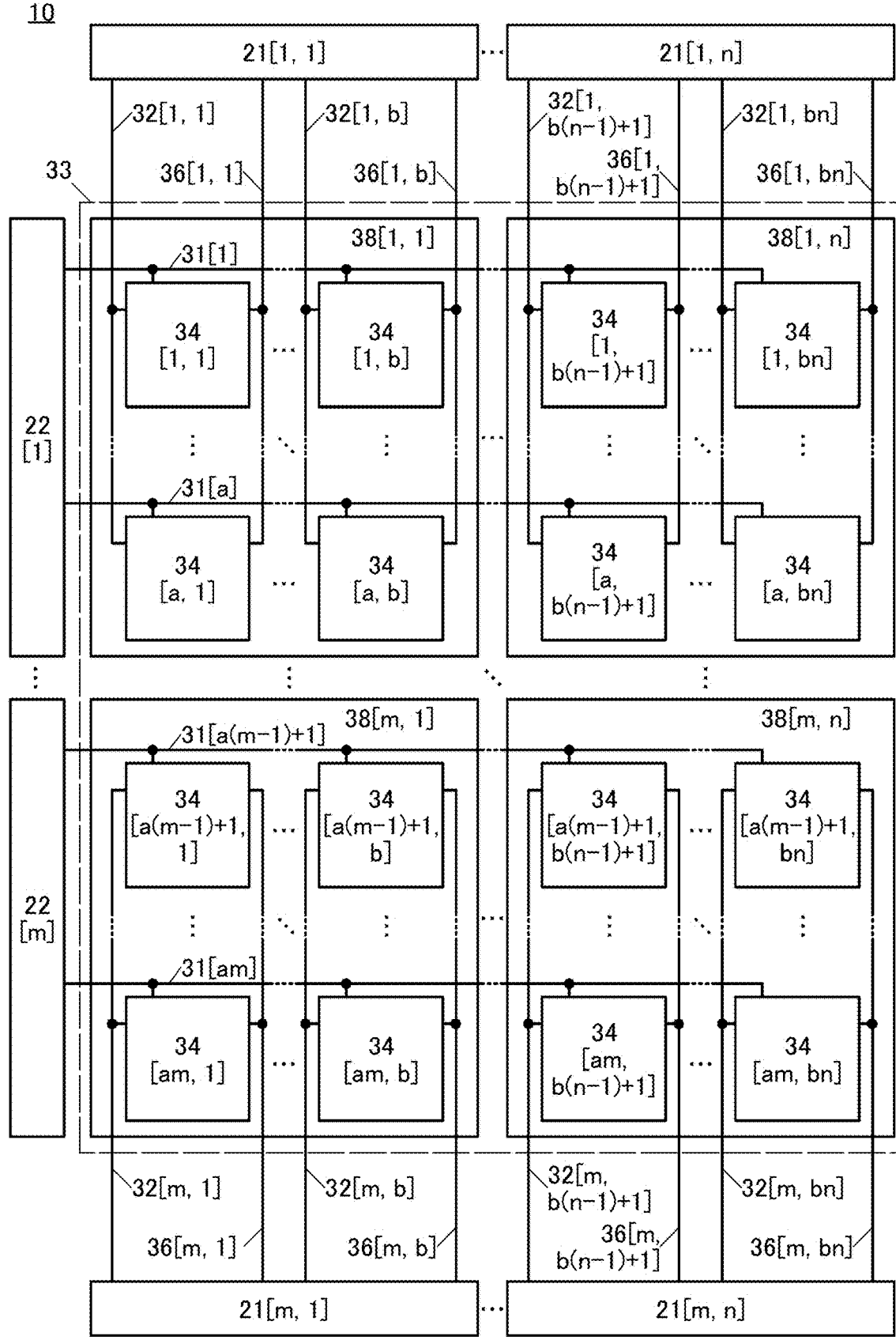
FIG. 2 is a block diagram illustrating a structure example of the display device.

FIG. 2 is a block diagram illustrating a structure example of the display device 10. As illustrated in FIG. 2, the pixels blocks 38[1, 1] to 38[m, n] each include the pixels 34 arranged in a rows and b columns (a and b are each an integer greater than or equal to 1). That is, the display portion 33 includes pixels 34[1, 1] to 34[am, bn] arranged in am rows and bn columns. The pixel block 38 includes a wiring 32 and a wiring 36 that are electrically connected to the pixel 34. The pixel block 38 further includes a wiring 31 that is electrically connected to the pixel 34. The wiring 32 has a function of supplying an input signal from the first circuit 21 to the pixel 34 and can also be referred to as a source line or a signal line. The wiring 36 has a function of supplying an output signal from the pixel 34 to the first circuit 21 and can also be referred to as a monitor line. The wiring 31 has a function of supplying a signal from the second circuit 22 to the pixel 34 and can also be referred to as a gate line or a scan line.

Figure 3:
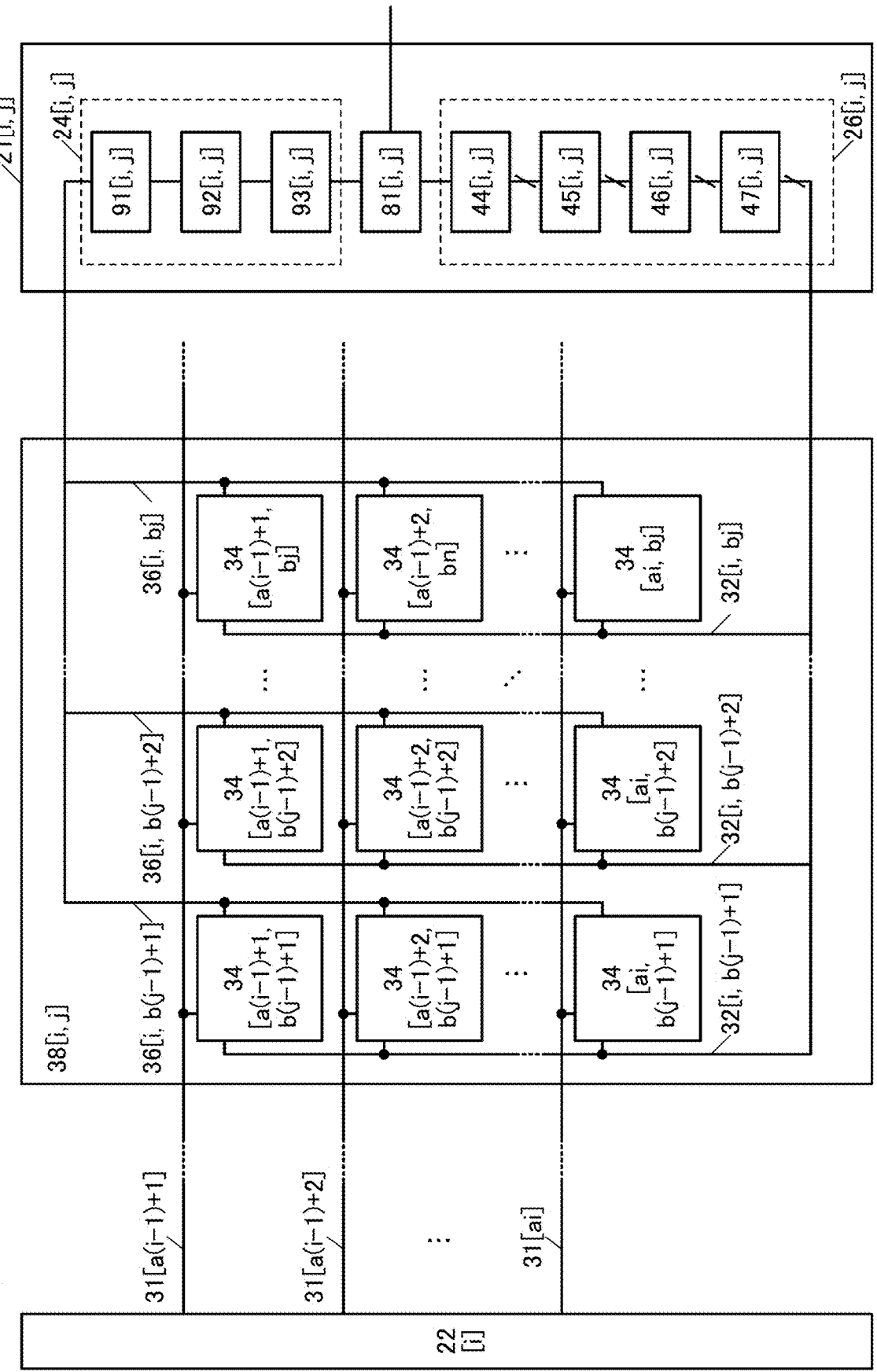
FIG. 3 is a block diagram illustrating a structure example of the display device.

The connection relation between the components will be described with reference to FIG. 3, representing the pixel block 38[i, j] in the i-th row and the j-th column as an example.

The wirings 32[i, b(j−1)+1] to 32[i, bj] included in the pixel block 38[i,j] are electrically connected to the first circuit 21[i, j] in the i-th row and the j-th column. The wirings 32[i, b(j−1)+1] to 32[i, bj] are electrically connected to a pixels 34 arranged in the column direction in the pixel block 38[i, j]. For example, the wiring 32[i, b(j−1)+1] is electrically connected to the pixels 34[a(i−1)+1, b(j−1)+1] to [ai, b(j−1)+1], for example.

The wirings 36[i, b(j-1)+1] to 36[i, bj] included in the pixel block 38[i,j] are electrically connected to the first circuit 21[i, j] in the i-th row and the j-th column. The wirings 36[i, b(j−1)+1] to 36[i,bj] are electrically connected to a pixels 34 arranged in the column direction in the pixel block 38[i, j]. For example, the wiring 36[i, b(j−1)+1] is electrically connected to the pixels 34[a(i−1)+1, b(j−1)+1] to [ai, b(j−1)+1].

The wirings 31 [a(i−1)+1] to 31 [ai] included in the pixel block 38[i, j] are electrically connected to the i-th second circuit 22[i]. The wirings 31 [a(i−1)+1] to 31 [ai] are each electrically connected to bn pixels 34 arranged in the row direction in the display portion 33 (see FIG. 2). For example, the wiring 31 [a(i−1)+1] is electrically connected to the pixels 34[a(i−1)+1, 1] to [a(i−1)+1, bn] in the display portion 33. The wiring 31 [a(i−1)+1] is electrically connected to the pixels 34[a(i−1)+1, b(j−1)+1] to [a(i−1)+1, bj] in the pixel block 38[i, j].

Structure Example of First Circuit 21

The first circuits 21[1, 1] to 21 [m, n] each include a correction data generation circuit 24, a logic circuit 81, and a source driver circuit 26.

As illustrated in FIG. 3, the first circuit 21[i, j] includes a correction data generation circuit 24[i, j], a logic circuit 81[i, j], and a source driver circuit 26[i, j].

The correction data generation circuit 24[i, j] has a function of converting an output signal from the first circuit 21[i, j] into correction data. The output signal is supplied to the first circuit 21[i, j] from a pixel 34[i, j] through the wiring 36. The wiring 36 has a function of a monitor line.

The logic circuit 81[i, j] has a function of correcting a video signal input to the first circuit 21[i, j] on the basis of the correction data and generating the corrected video signal.

The source driver circuit 26[i, j] has a function of converting the corrected video signal into an input signal. The input signal is supplied to the pixel block 38[i, j] from the first circuit 21[i, j] through the wiring 32. The wiring 32 has a function of a data line.

A structure example of the correction data generation circuit 24 is described.

The correction data generation circuits 24[1, 1] to 24[m, n] each include a current-voltage converter circuit 91, an analog-digital converter circuit 92, and a memory circuit 93.

As illustrated in FIG. 3, the correction data generation circuit 24[i, j] includes a current-voltage converter circuit 91[i, j], an analog-digital converter circuit 92[i, j], and a memory circuit 93 [i, j].

The current-voltage converter circuit 91 has a function of converting a value of current flowing through the wiring 36 into a voltage value and outputting the voltage value to the analog-digital converter circuit 92.

The analog-digital converter circuit 92 has a function of converting the analog voltage value output from the current-voltage converter circuit 91 into a digital voltage value and outputting the digital voltage value to the memory circuit 93.

The memory circuit 93 has a function of storing the digital voltage value output from the analog-digital converter circuit 92. Note that the voltage value based on the value of the current flowing (output) to the wiring 36 from the pixel 34 can be used as correction data for correcting the value of the current flowing to the pixel 34. The memory circuit 93 also has a function of outputting the stored correction data to the logic circuit 81.

The logic circuit 81 has a function of correcting a video signal input to the first circuit 21 on the basis of the correction data output from the memory circuit 93 and generating the corrected video signal.

Note that the display device 10 may include a receiver circuit (not illustrated). The receiver circuit has a function of receiving a video signal being a base of the corrected video signal generated by the first circuit 21. The video signal can be single-ended digital data. The receiver circuit may have a function of receiving data with the use of a data transmitting signal of LVDS (Low Voltage Differential Signaling) or the like, and further may have a function of converting the received signal into a signal based on a standard that can undergo internal processing.

A structure example of the source driver circuit 26 will be described.

The source driver circuits 26[1, 1] to 26[m, n] each include a shift register circuit 44, a latch circuit 45, a digital-analog converter circuit 46, and an amplifier circuit 47.

As illustrated in FIG. 3, the source driver circuit[i, j] includes a shift register circuit 44[i, j], a latch circuit 45[i, j], a digital-analog converter circuit 46[i, j], and an amplifier circuit 47[i, j].

The shift register circuit 44 has a function of generating a signal for controlling the operation of the latch circuit 45.

The latch circuit 45 has a function of retaining or outputting correction data output from the logic circuit 81. Whether the latch circuit 45 retains or outputs data is selected on the basis of a signal supplied from the shift register circuit 44.

The digital-analog converter circuit 46 has a function of converting the digital corrected video signal retained by the latch circuit 45, into an analog corrected image signal.

The amplifier circuit 47 has a function of amplifying the analog corrected video signal output from the digital-analog converter circuit 46 and outputting the amplified signal as an input signal to the wiring 32. By providing the amplifier circuit 47, the corrected video signal represented by an analog signal can be stably supplied to the pixel 34. As the amplifier circuit 47, a voltage follower circuit including an operational amplifier or the like can be used, for example. Note that in the case where a circuit including a differential input circuit is used as the amplifier circuit, the offset voltage of the differential input circuit is preferably 0 V or a voltage that is as close to 0 V as possible.

Structure Example of Second Circuit 22

The second circuit 22 functioning as a gate driver circuit has a function of selecting the pixel 34 to which a potential corresponding to image data generated by the first circuit 21 is applied. For example, the second circuit 22 can generate a selection signal and can supply the selection signal to the pixel 34 in a specific row. To the pixel 34 to which the selection signal is supplied, a potential corresponding to the image data can be applied.

The pixel block 38 includes the wiring 31 electrically connected to the plurality of pixels 34 arranged in the row direction. The wiring 31 included in the pixel block 38 in the i-th row is electrically connected to the i-th second circuit 22.

Here, for example, the second circuit 22[i] selects the pixels 34 in the first row, then selects the pixels 34 in the second row, selects the pixels 34 up to the a-th row in sequence, and then selects the pixels 34 in the first row again in the pixel block 38[i, j]. In other words, it can be said that the second circuit 22 has a function of scanning the pixels 34. The selection signal can be supplied from the second circuit 22 to the pixels 34 through the wiring 31. From the above, it can be said that the wiring 31 functions as a scan line. Note that in the case of interlace driving, after the pixels 34 in the first row are selected, the pixels 34 not in the second row but in the third row or the fourth and subsequent rows are selected, for example. In the case where m is an even number, for example, the pixels 34 in the even-numbered rows can be sequentially selected after sequentially selecting the pixels 34 in the odd-numbered rows.

The display portion 33 has a function of displaying an image corresponding to image data supplied to the pixels 34. Specifically, light with luminance corresponding to the image data is emitted from the pixels 34, whereby an image is displayed on the display portion 33.

Note that the color of light emitted from the pixel 34 can be, for example, red, green, or blue. For example, the pixel 34 that emits red light, the pixel 34 that emits green light, and the pixel 34 that emits blue light are provided in the display portion 33, whereby the display device 10 can perform full-color display. In that case, the pixels 34 can be called subpixels.

<Example of correction operation in display device 10>

Figure 4:
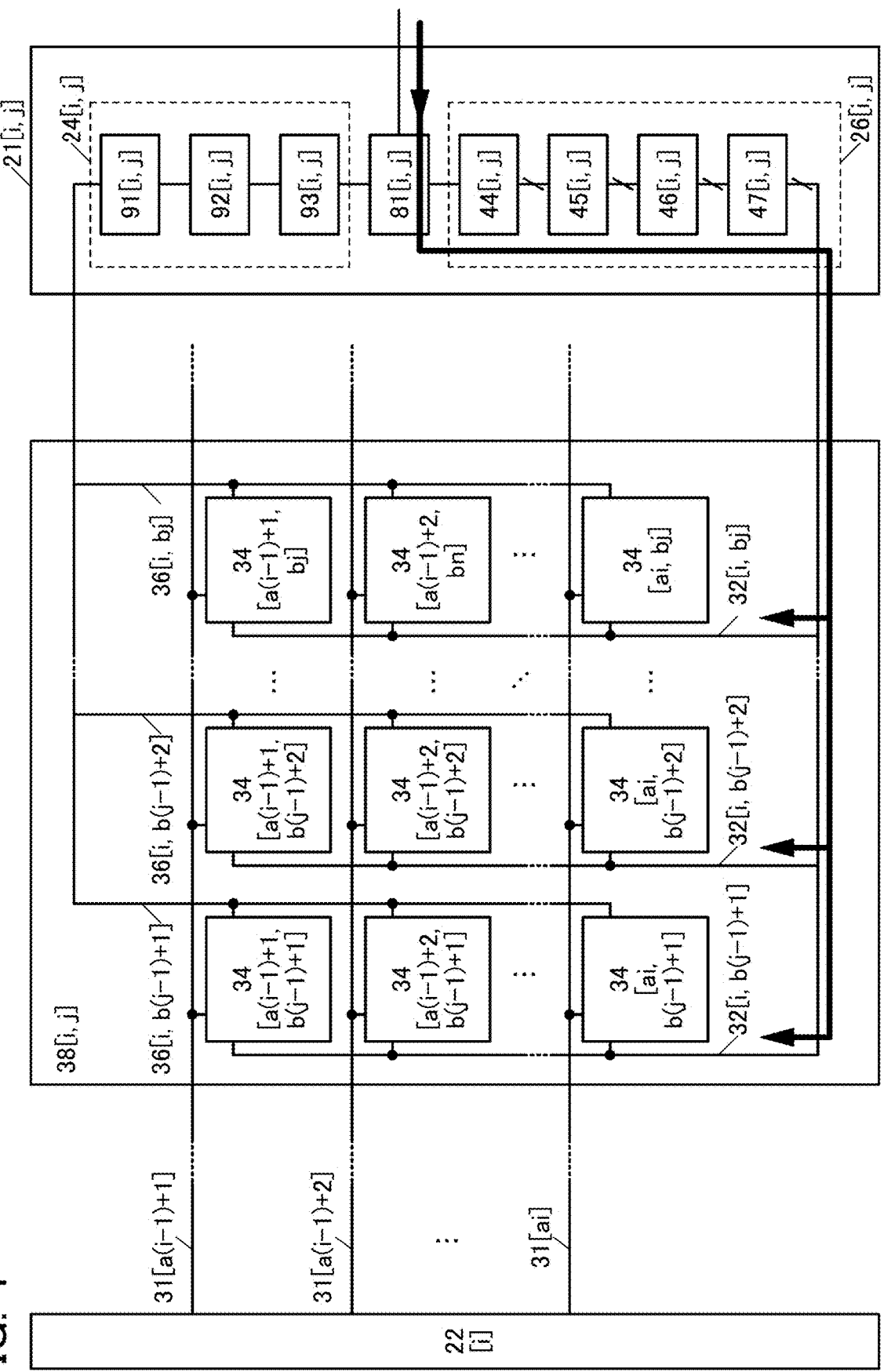
FIG. 4 is a block diagram illustrating a structure example of the display device.
Figure 5:
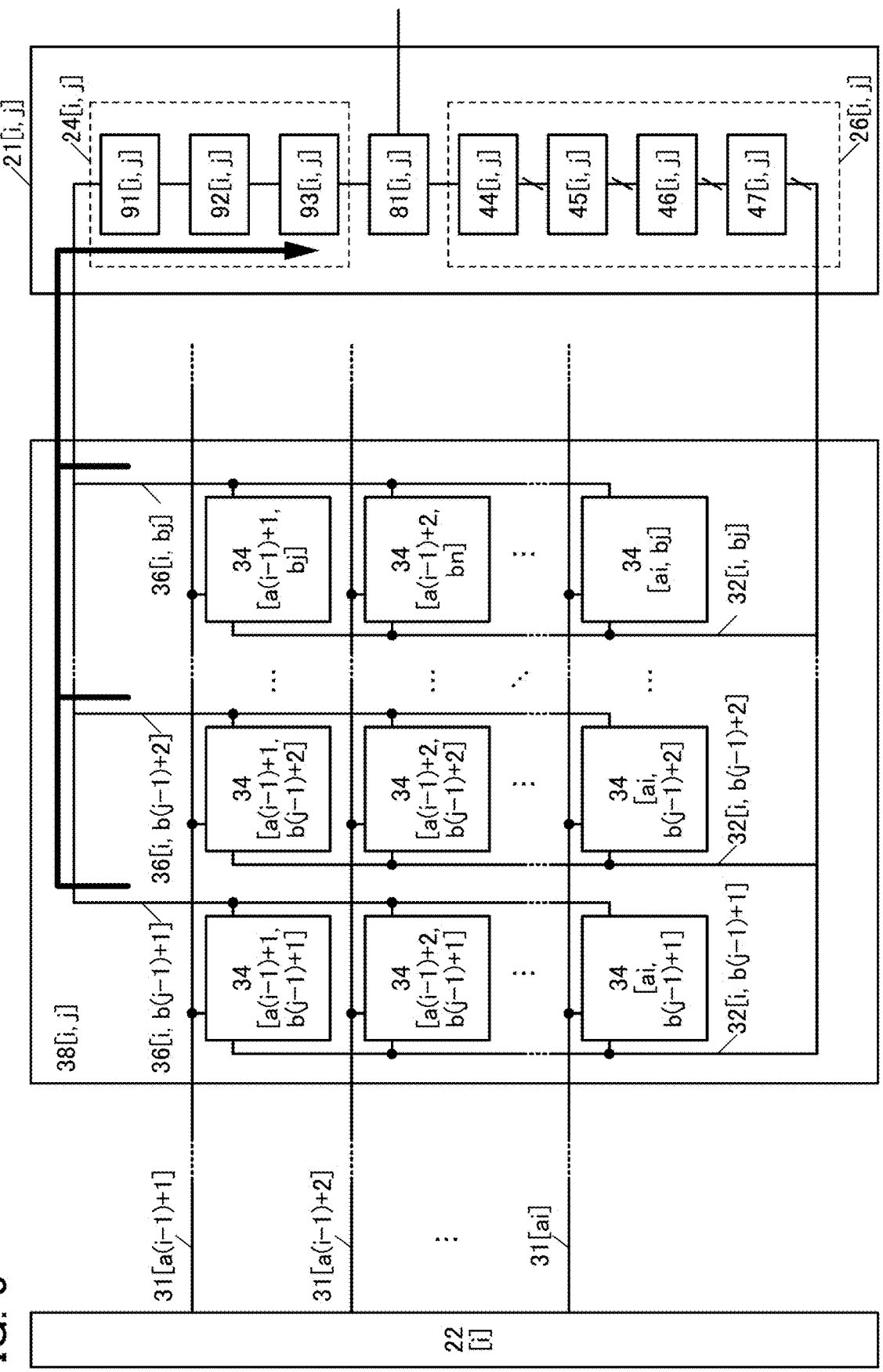
FIG. 5 is a block diagram illustrating a structure example of the display device.
Figure 6:
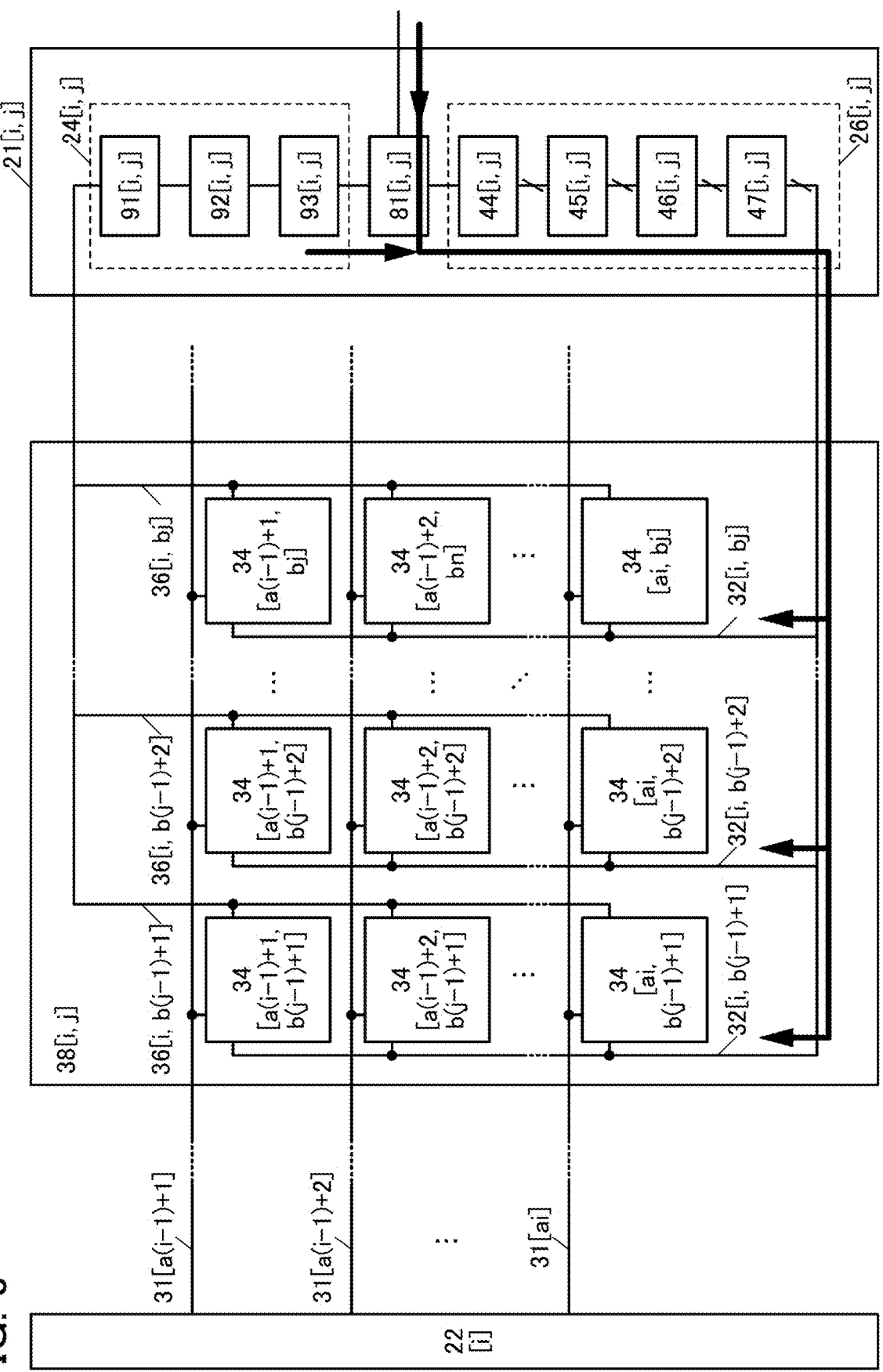
FIG. 6 is a block diagram illustrating a structure example of the display device.

An example of correction operation in the display device 10 is described with reference to FIG. 4 to FIG. 6. FIG. 4 to FIG. 6 illustrate an example of a correction operation in the pixel block 38[i, j]. The correction operation can be performed with three steps of reference data writing operation, correction data acquisition operation, and display operation.

FIG. 4 illustrates an example of the reference data writing operation.

The reference data writing operation refers to an operation in which reference data for correction (hereinafter also referred to as a reference video signal) is written to the pixel 34. First, the reference video signal is input to the first circuit 21[i, j] and the reference video signal is supplied to the source driver circuit 26[i, j] through the logic circuit 81. The reference video signal is converted into an input signal in the source driver circuit 26[i, j], and the input signal is supplied to the pixel block 3 8[i, j] through the wiring 32.

The reference data writing operation can be performed in the plurality of first circuits 21 in parallel. For example, all the first circuits 21[1, 1] to 21 [m, n] included in the display device 10 may perform the reference data writing operation in parallel. The plurality of first circuits perform the reference data writing operation in parallel, whereby time required for the reference data writing operation in the whole display portion 33 can be shortened.

Note that in the period during which the reference data is written, the operation of the correction data generation circuit 24 can be stopped. The operation of the correction data generation circuit 24 can be stopped, so that the display device 10 can have low power consumption.

Note that one or more grayscale values can be used as the reference video signal. For example, any one or more of the maximum grayscale value, the minimum grayscale value, and the intermediate grayscale value can be used as the reference video signal. For example, in the case of 8-bit grayscale, the maximum grayscale value 255, the minimum grayscale value 0, the intermediate grayscale value 125, or the like can be used as the reference video signal.

Because the size of the pixel 34 is reduced in a high-resolution display device, the transistor included in the pixel 34 has a small size, which might reduce the value of current flowing through the transistor. Thus, the use of the reference video signal (e.g., the maximum grayscale value) that can increase the value of current flowing through the transistor can increase the accuracy of correction operation. A plurality of grayscale values may be used as the reference video signal. For example, the use of three kinds of the maximum grayscale value, the minimum grayscale value, and the intermediate grayscale value as the reference video signal allows correction operation in a wide grayscale range, so that the accuracy of correction operation can be increased.

FIG. 5 illustrates an example of the correction data acquisition operation.

The correction data acquisition operation refers to an operation of inputting a current value (also referred to as an output signal) to the first circuit 21[i, j] from the pixel 34 to which reference data is written, and generating correction data. The output signal from the pixel 34 is supplied to the correction data generation circuit 24[0] through the wiring 36. An output current is converted into correction data in the correction data generation circuit 24[i, j] and the correction data corresponding to reference data is retained in the correction data generation circuit 24[i, j].

The plurality of first circuits 21 can perform the correction data acquisition operation in parallel. For example, all the first circuits 21[1, 1] to 21 [m, n] included in the display device 10 may perform the correction data acquisition operation in parallel. The time required for the correction data acquisition operation in the whole display portion 33 can be shortened when the plurality of first circuits perform the correction data acquisition operations in parallel, as compared with when the correction data acquisition operations are sequentially performed row by row to the display portion 33.

Note that in a period during which the correction data acquisition operation is performed, operations of the logic circuit 81 and the source driver circuit 26 can be stopped. The operations of the logic circuit 81 and the source driver circuit 26 are stopped, so that the power consumption of the display device 10 can be lowered.

In the case where the correction operation is not performed, the correction data generation circuit 24 can be stopped. The correction data generation circuit 24 is stopped, so that the power consumption of the display device 10 can be lowered.

FIG. 6 illustrates an example of the display operation.

The display operation refers to an operation in which a video signal input to the first circuit 21 is corrected and an image is displayed on the display portion 33. Specifically, the correction data retained in the correction data generation circuit 24[i, j] and the video signal input to the first circuit 21 are supplied to the logic circuit 81. The logic circuit 81 corrects the video signal on the basis of the correction data and generates the corrected video signal. The corrected video signal is converted into an input signal in the source driver circuit 26 and the input signal is supplied to the pixel block 38[i, j] through the wiring 32.

Through the above-described correction operation, the display device 10 of one embodiment of the present invention can be a display device with less display unevenness.

Note that the reference data writing operation and the correction data acquisition operation are not necessarily performed for each frame. For example, the reference data writing operation and the correction data acquisition operation are performed only at the startup of the display device 10, and only display operation is performed in the subsequent frames. For example, when the reference data writing operation and the correction data acquisition operation are performed only at the startup of the display device 10, correction data acquired at the startup is retained in the correction data generation circuit 24[i, j] and the correction data is used to perform the display operation in the subsequent frames.

Because the display device of one embodiment of the present invention includes the plurality of first circuits 21, the number of pixels 34 provided in one first circuit 21 can be reduced. Moreover, because the display device includes the plurality of second circuits 22, the number of pixels 34 provided in one second circuit 22 can be reduced. The plurality of first circuits 21 can operate in parallel or the plurality of second circuits 22 can operate in parallel; thus, for example, the time required for writing image data corresponding to an image of one frame to the pixel 34 can be shortened. Thus, the length of one frame period can be shortened, and the display device 10 can operate at high speed. Furthermore, the number of the pixels 34 included in the display device 10 can be increased, resulting in a higher resolution of the display device 10. The resolution of the display device 10 can be, for example, full high vision, 4K2K, 8K4K, 16K8K, or higher.

For example, the resolution of the display device 10 can be higher than or equal to 1000 ppi, higher than or equal to 2000 ppi, or higher than or equal to 5000 ppi. Consequently, the display device 10 can display high-quality images with little graininess and highly realistic images. Thus, the display device 10 can be suitably used for, in particular, a device that is used with a short distance between its display surface and a user, especially a portable electronic device, a wearable electronic device (a wearable device), an e-book reader, or the like. Furthermore, the display device 10 can be suitably used for a VR device, an AR device, or the like. Moreover, the display device 10 can be suitably used for a viewfinder such as an electronic viewfinder that is provided in a digital camera or the like that is an electronic device including an imaging device.

The pixel block 38 includes the pixels 34 arranged in the a rows and the b columns (a and b are each an integer greater than or equal to 1). The increase in the number of pixels 34 included in one pixel block 38 can reduce the number of first circuits 21 provided in the display device 10, so that the display device 10 can have low power consumption. Furthermore, the number of pixels 34 included in one pixel block 38 is reduced, whereby the number of first circuit 21 provided in the display device 10 is increased and thus correction can be performed efficiently. Therefore, the display device 10 with less display unevenness can be obtained.

Figure 7:
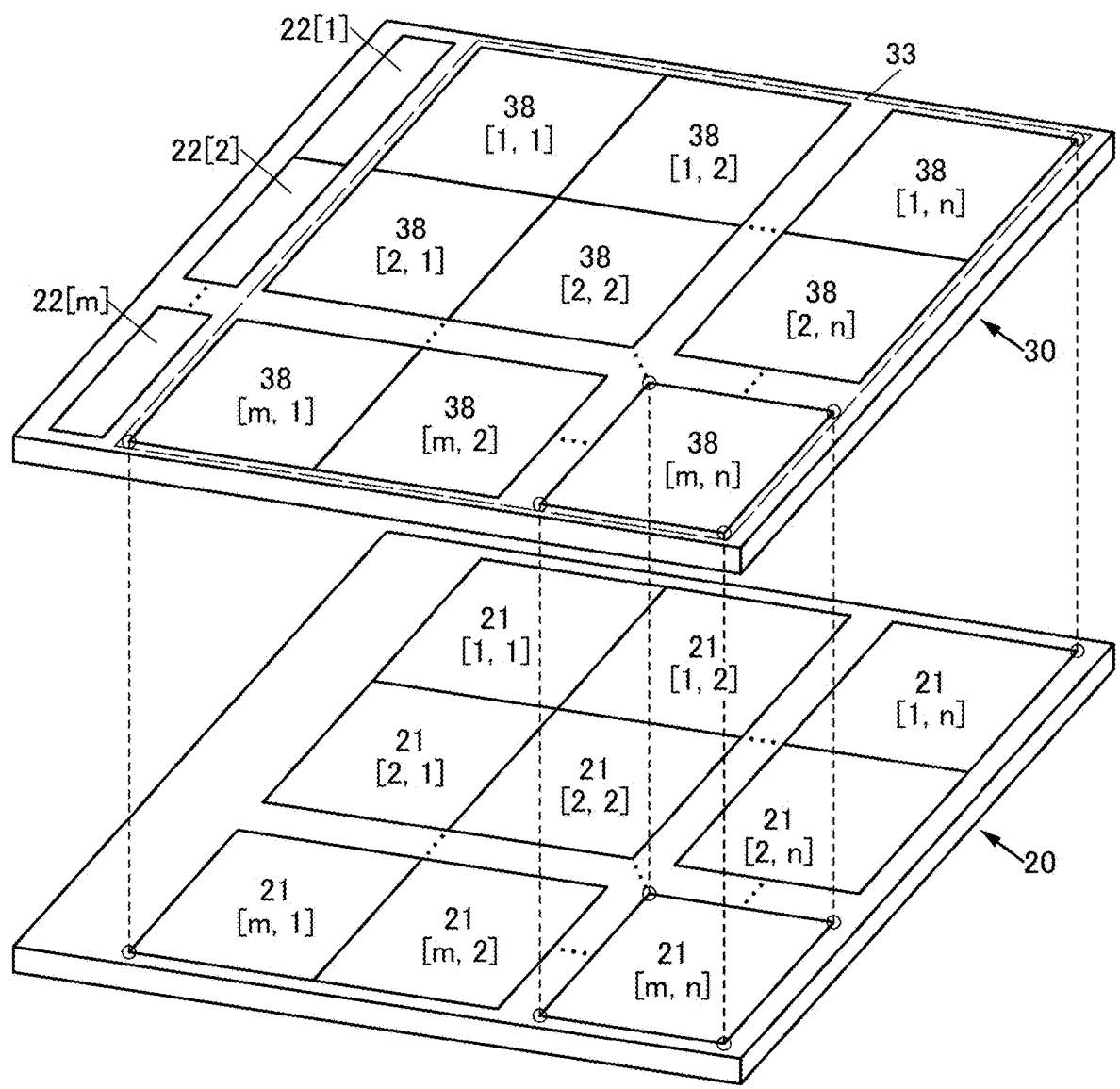
FIG. 7 is a block diagram illustrating a structure example of the display device.

FIG. 7 illustrates structure examples of the first layer 20 and the second layer 30 illustrated in FIG. 1A. In FIG. 7, the positional relation between the first layer 20 and the second layer 30 is denoted by hollow circles and dashed lines and the hollow circles in the first layer 20 and the hollow circles in the second layer 30, which are connected with the dashed lines, overlap with each other. Note that the similar illustration is also made in other drawings. For simplification of the drawing, the wiring 31, the wiring 32, and the wiring 36 are omitted in FIG. 7.

The display device 10 preferably has a region where the first circuit 21 provided in the first layer 20 overlaps with the display portion 33. FIG. 7 illustrates an example of the display device 10 including regions where the pixel blocks 38[1, 1] to 38[m, n] overlap with the first circuit 21[1, 1] to 21 [m, n], respectively. The display portion 33 and the first circuit 21 are stacked to have an overlapping region, whereby the area of the bezel where the display portion 33 is not provided can be reduced. Thus, the bezel of the display device 10 can be narrowed. In addition, the bezel of the display device 10 is narrowed, so that the display device 10 can be downsized.

In the example illustrated in FIG. 7, the size of the pixel block 38 is substantially the same as the size of the first circuit 21 and the regions where the pixel blocks 38[1, 1] to 38[m, n] overlap with the first circuits 21[1, 1] to 21[m, n], respectively, are provided. However, the present invention is not limited to the example. The size of the pixel block 38 may be different from that of the first circuit 21. When the first circuit 21 is larger than the pixel block 38, the bezel of the display device 10 might be widened. Accordingly, the size of the first circuit 21 is substantially the same as or smaller than the size of the pixel block 38, whereby the bezel of the display device 10 becomes narrowed and the display device 10 can be downsized.

Figure 8:
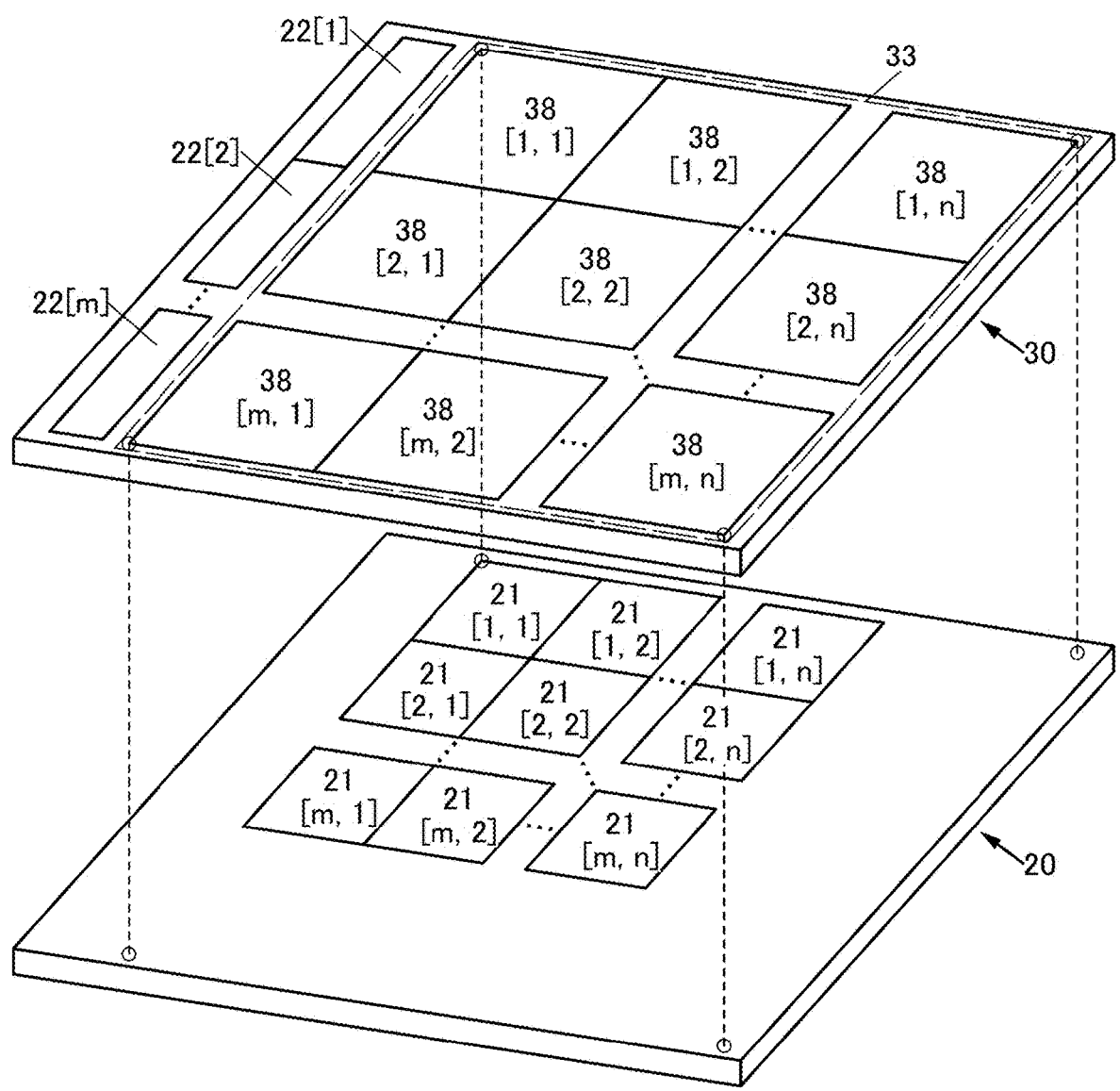
FIG. 8 is a block diagram illustrating a structure example of the display device.
Figure 9:
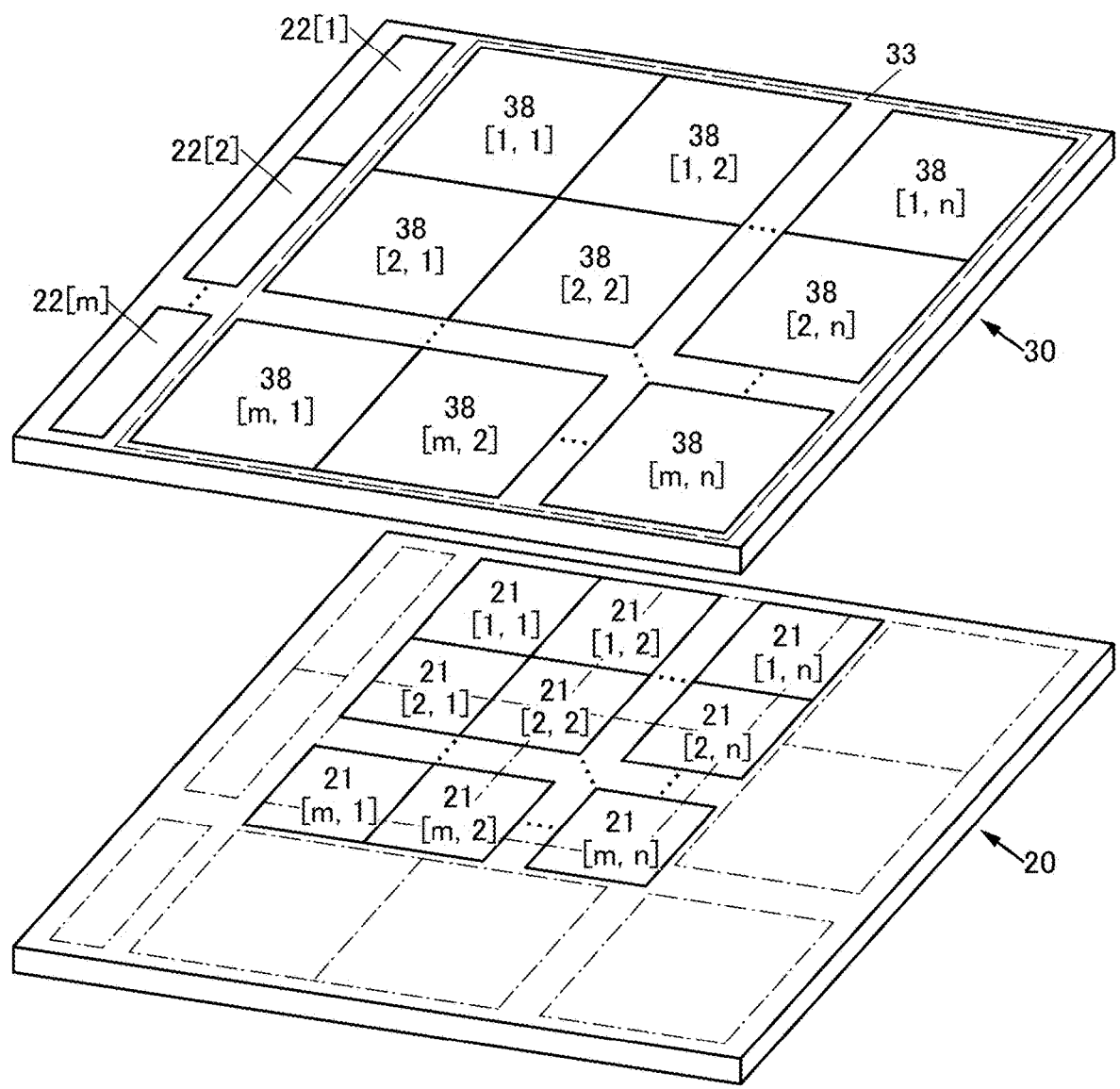
FIG. 9 is a block diagram illustrating a structure example of the display device.

A structure example different from that of the display device 10 illustrated in FIG. 7 is illustrated in FIG. 8 and FIG. 9. The display device 10 illustrated in FIG. 8 and FIG. 9 is different from the display device 10 illustrated in FIG. 7 mainly in that the first circuit 21 is smaller than the pixel block 38. In FIG. 9, the pixel blocks 38 and the second circuits 22 included in the second layer 30 illustrated in FIG. 8 are illustrated by dashed-dotted lines on the first layer 20.

In the example of the display device 10 illustrated in FIG. 8 and FIG. 9, some of the pixel blocks 38 overlap with the first circuits 21 to which the pixel blocks 38 are electrically connected, and the others of the pixel blocks 38 do not overlap with the first circuits 21 to which the pixel blocks 38 are electrically connected. In other words, it can also be said that in the display device 10 illustrated in FIG. 8 and FIG. 9, the pixel block 38[i, j] in the i-th row and the j-th column has a region overlapping with the first circuit 21[i, j] in the i-th row and the j-th column, and the pixel block 38[p, q] in the p-th row and the q-th column does not overlap with the first circuit 21 [p, q] in the p-th row and the q-th column.

In the structure of the display device 10 illustrated in FIG. 8 and FIG. 9, the layout of the first circuit 21 can be used without being changed even if the layout of the display portion 33 is changed. The first circuit 21 can be used in common to a plurality of kinds of the display devices 10 with different layouts of the display portion 33, so that the productivity of the display device 10 can be increased.

Figure 10:
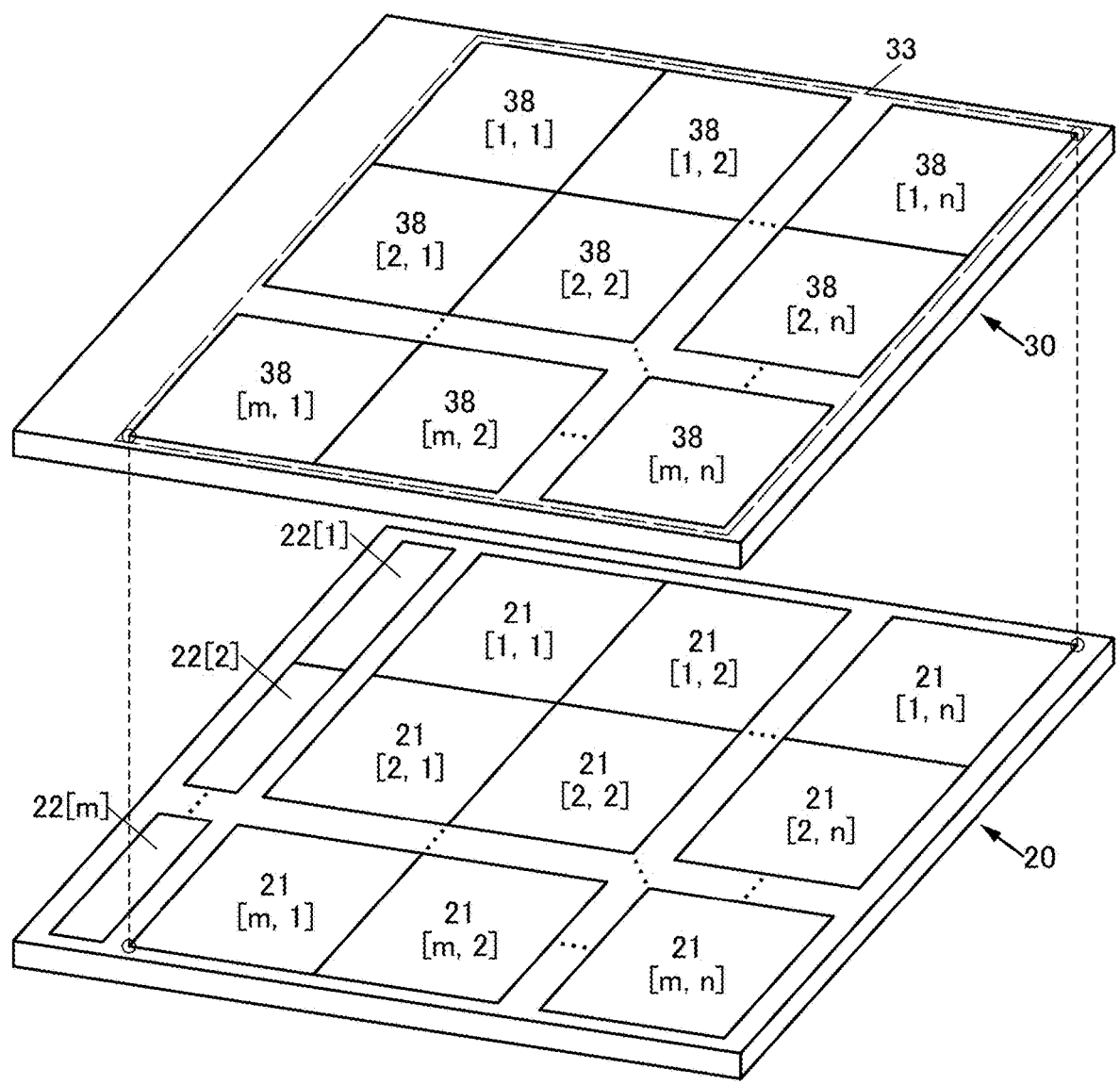
FIG. 10 is a block diagram illustrating a structure example of the display device.

FIG. 10 illustrates a structure example different from that of the display device 10 illustrated in FIG. 7. The display device 10 illustrated in FIG. 10 is different from the display device 10 illustrated in FIG. 7 mainly in that the first layer 20 includes the second circuit 22. The first circuit 21 and the second circuit 22 are provided in the same layer (the first layer 20), whereby the manufacturing process can be common to the first circuit 21 and the second circuit 22 and the productivity can be increased.

Figure 11:
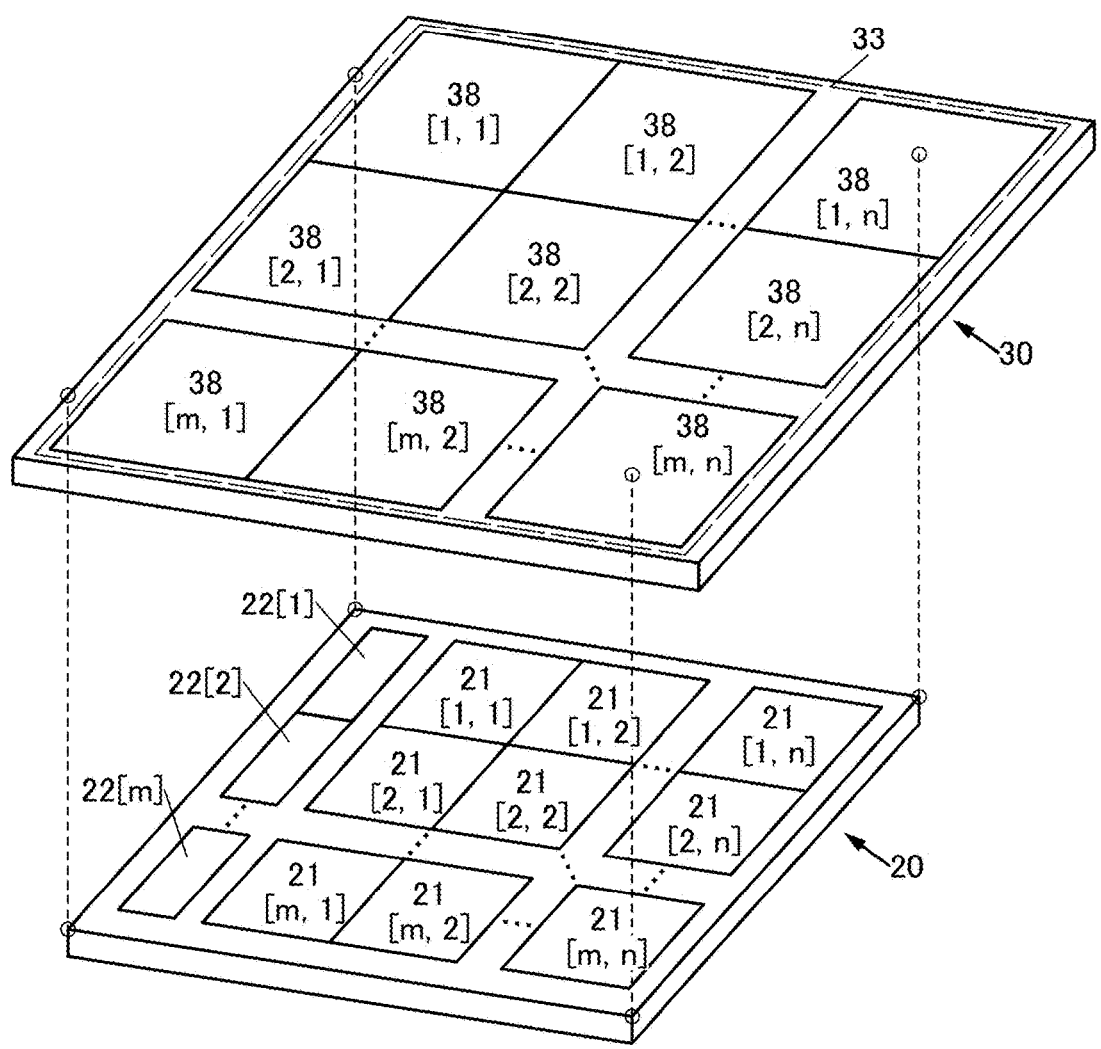
FIG. 11 is a block diagram illustrating a structure example of the display device.

FIG. 11 illustrates a structure example different from those of the display devices 10 illustrated in FIG. 7 to FIG. 10. In the example of the display device 10 illustrated in FIG. 11, some of the pixel blocks 38 overlap with the first circuits 21 to which the pixel blocks 38 are electrically connected, the others of the pixel blocks 38 do not overlap with the first circuits 21 to which the pixel blocks 38 are electrically connected, and the first layer 20 includes the second circuit 22.

In the display device 10 illustrated in FIG. 11, the pixel block 38 in the i-th row and the j-th column preferably includes a region overlapping with any one or more of the second circuits 22[1] to 22[m]. Providing the region where the second circuit 22 overlap with the pixel block 38 allows the bezel of the display device 10 to be narrower, so that the display device 10 can be downsized.

Note that although FIG. 11 illustrates an example where the first layer 20 is smaller than the second layer 30, one embodiment of the present invention is not limited thereto. The size of the first layer 20 may be different from that of the second layer 30. For example, the first layer 20 may have substantially the same size as or be larger than the second layer 30.

The second layer 30 is formed over the first layer 20 after the first layer 20 is formed, whereby the display device 10 can be manufactured. The second layer 30 is formed over the first layer 20, whereby the alignment accuracy of the first layer 20 and the second layer 30 can be improved. Thus, the productivity of the display device 10 can be improved.

The first layer 20 and the second layer 30 may each be formed and then bonded to each other, whereby the display device 10 is manufactured. In the case where the display device 10 is formed in such a manner that the first layer 20 and the second layer 30 are bonded to each other, the first layer 20 and the second layer 30 may have different sizes. Thus, the first layer 20 and the second layer 30 can be formed without being influenced by each other's size. For example, the display device 10 can be manufactured in such a manner that the plurality of first layers 20 are formed over the substrate over which the first layers 20 are to be formed, and then are separated into individual first layers 20, and then the first layers 20 are bonded to the second layers 30.

Also for the second layer 30, the display device 10 may be manufactured in such a manner that the plurality of second layers 30 are formed over the substrate over which the second layers 30 are to be formed, and then are separated into individual second layers 30, and then the second layers 30 are bonded to the first layers 20. In other words, the productivity of the display device 10 can be increased, along with the improvement in the productivities of the first layer 20 and the second layer 30.

Structure Example 2 of Display Device

Figure 12A:
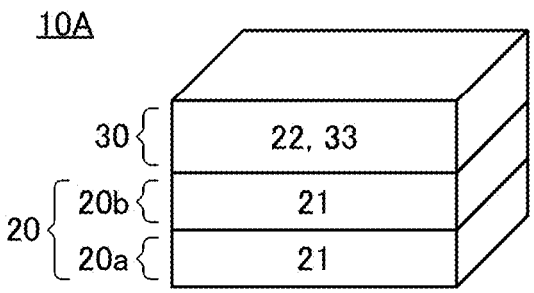
FIG. 12A is a schematic view illustrating a structure example of a display device.
Figure 12B:
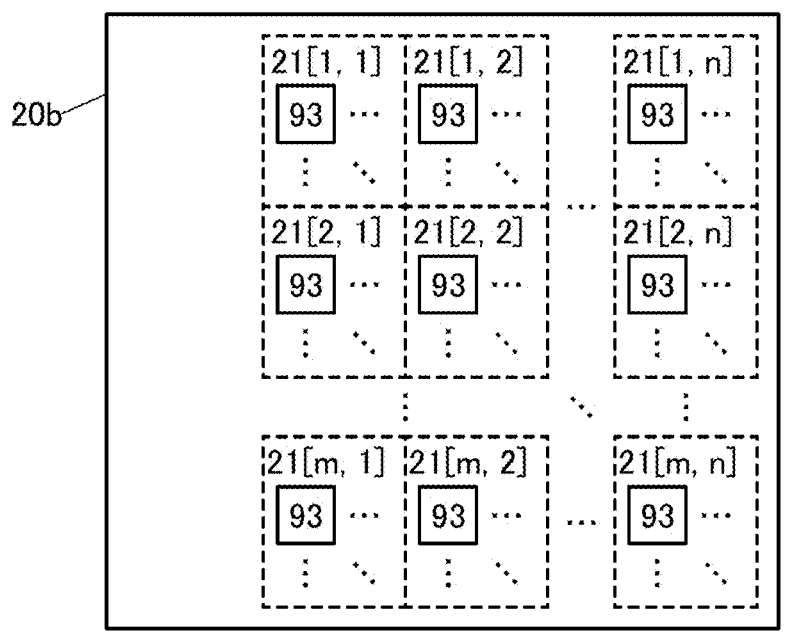
FIG. 12B is a block diagram illustrating the structure example of the display device.
Figure 12B:
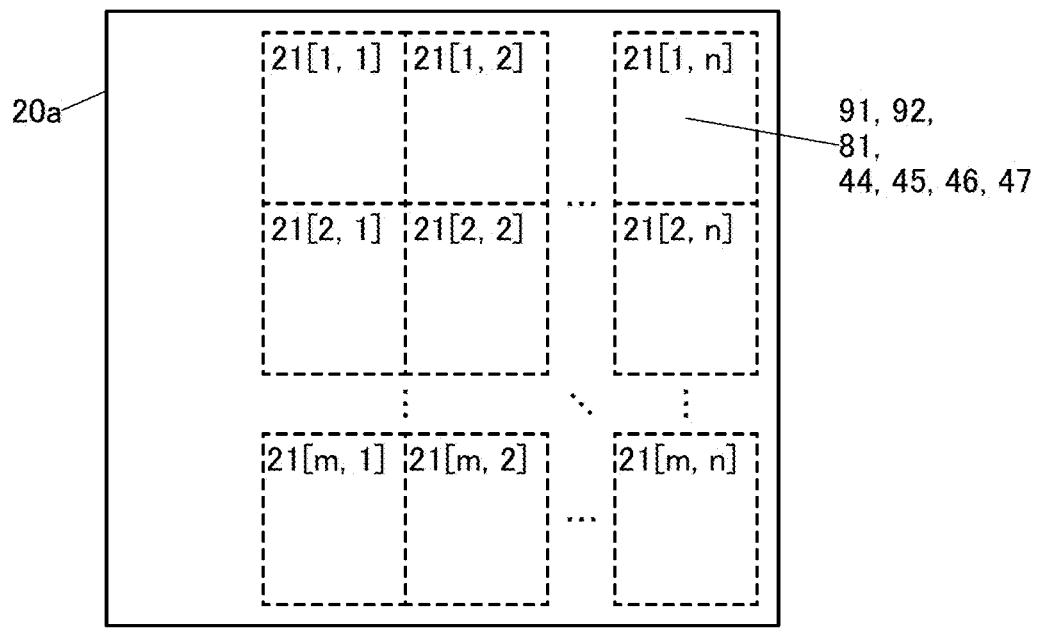

FIG. 12A and FIG. 12B illustrate a structure example different from that of the display device 10 illustrated in FIG. 1A and FIG. 1B. FIG. 12A is a schematic view of a display device 10A. FIG. 12B is a block diagram illustrating a structure example of the display device 10A. The display device 10A illustrated in FIG. 12A and FIG. 12B is different from the display device 10 in FIG. 1A and FIG. 1B mainly in that the first layer 20 where the first circuits 21 are provided has a stacked structure of a first circuit layer 20a and a second circuit layer 20b over the first circuit layer 20a. In addition, FIG. 1B can be referred to for the second layer 30; thus, detailed description thereof is omitted here. The stacking order of the first circuit layer 20a, the second circuit layer 20b, and the second layer 30 is not limited to the stacking order illustrated in FIG. 12A. For example, the first circuit layer 20a may be provided between the second circuit layer 20b and the second layer 30.

For example, the first circuit layer 20a can be a layer including a transistor including silicon in a channel formation region (Si transistor). The second circuit layer 20b can be a layer including a transistor including a metal oxide in a channel formation region (OS transistor).

In the case where the first circuit 21 is provided in the first layer 20, it is preferable that the second circuit layer 20b include the memory circuit 93, and the first circuit layer 20a include components (such as the logic circuit 81) other than the memory circuit 93. In an OS transistor, the leakage current flowing between the source and the drain in an off state (hereinafter off-state current) is extremely low. Therefore, the use of the memory circuit 93 including OS transistors allows once-written data to be retained therein for a long time. This can reduce the data refresh rate, lowering power consumption. Furthermore, the use of the logic circuit 81 including Si transistors can increase operation speed.

Figure 13:
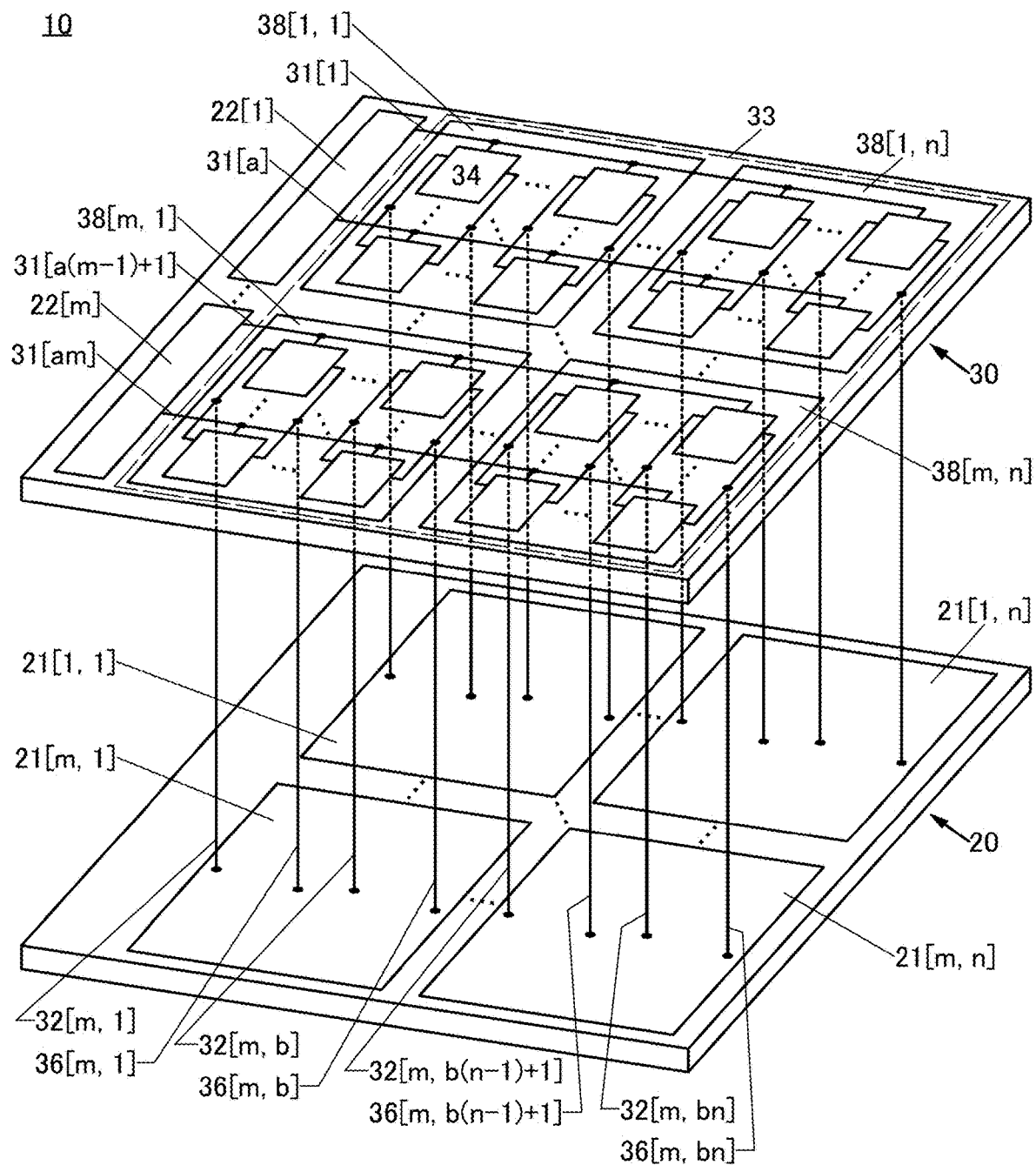
FIG. 13 is a block diagram illustrating a structure example of the display device.

FIG. 13 illustrates a structure example of the first layer 20 and the second layer 30. In FIG. 13, the connection relation of the first layer 20 and the second layer 30 is illustrated. For simplification of the drawing, some components and some reference numerals are omitted in FIG. 13.

The display device 10 illustrated in FIG. 13 corresponds to the display device 10 illustrated in FIG. 7, the first layer 20 includes the first circuit 21, and the second layer 30 includes the display portion 33 and the second circuit 22.

The wiring 32 and the wiring 36 included in the pixel block 38 are electrically connected to the first circuit 21 positioned under the display portion 33.

Moreover, the resistance of the wiring 32 and the resistance of the wiring 36 might cause signal delay. As illustrated in FIG. 13, it is preferable that the lengths of the wiring 32 and the wiring 36 which are electrically connected to each of the pixels 34 be as short as possible. Shortening the lengths of the wiring 32 and the wiring 36 can suppress signal delay.

Figure 14:
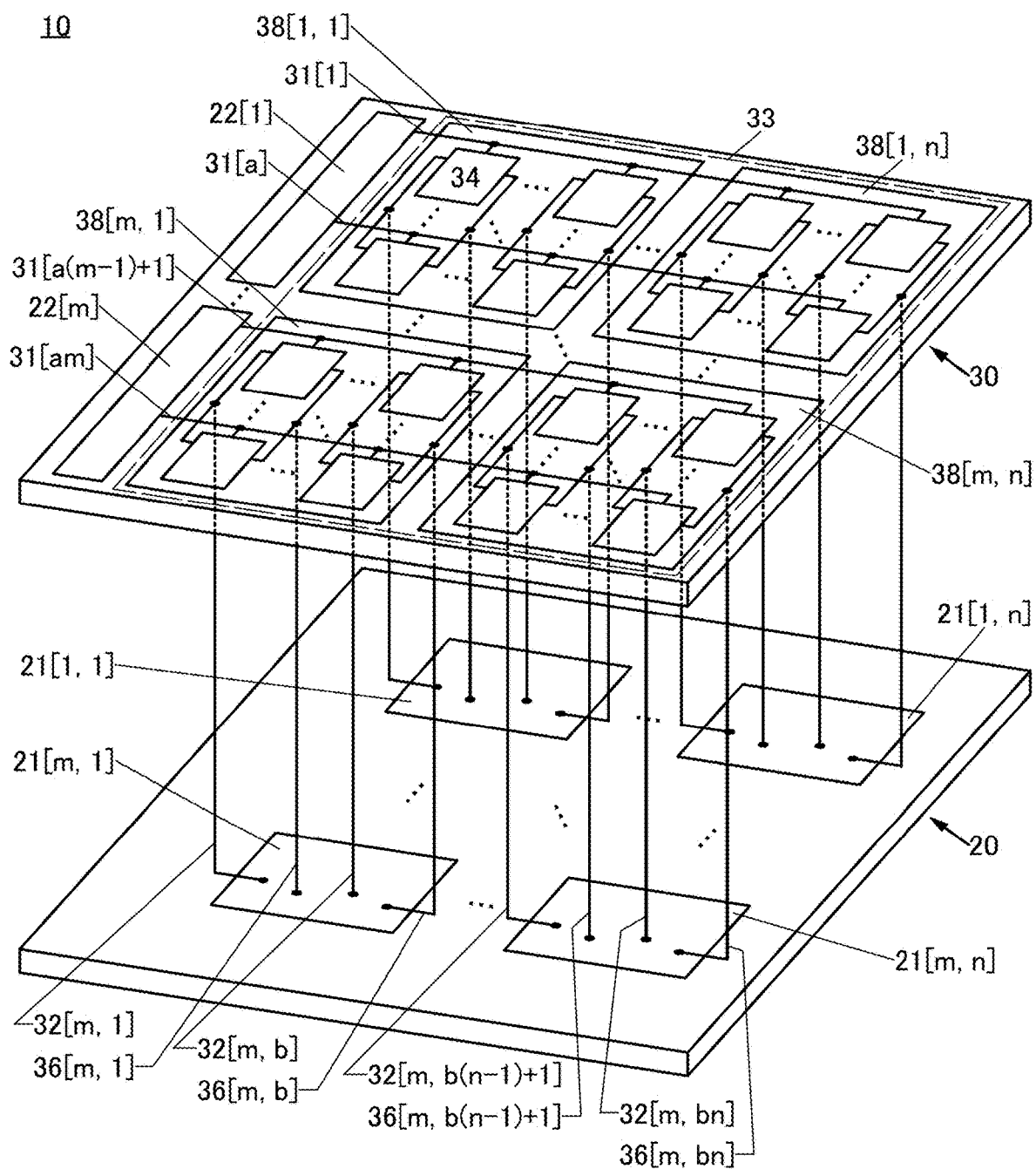
FIG. 14 is a block diagram illustrating a structure example of the display device.
Figure 15:
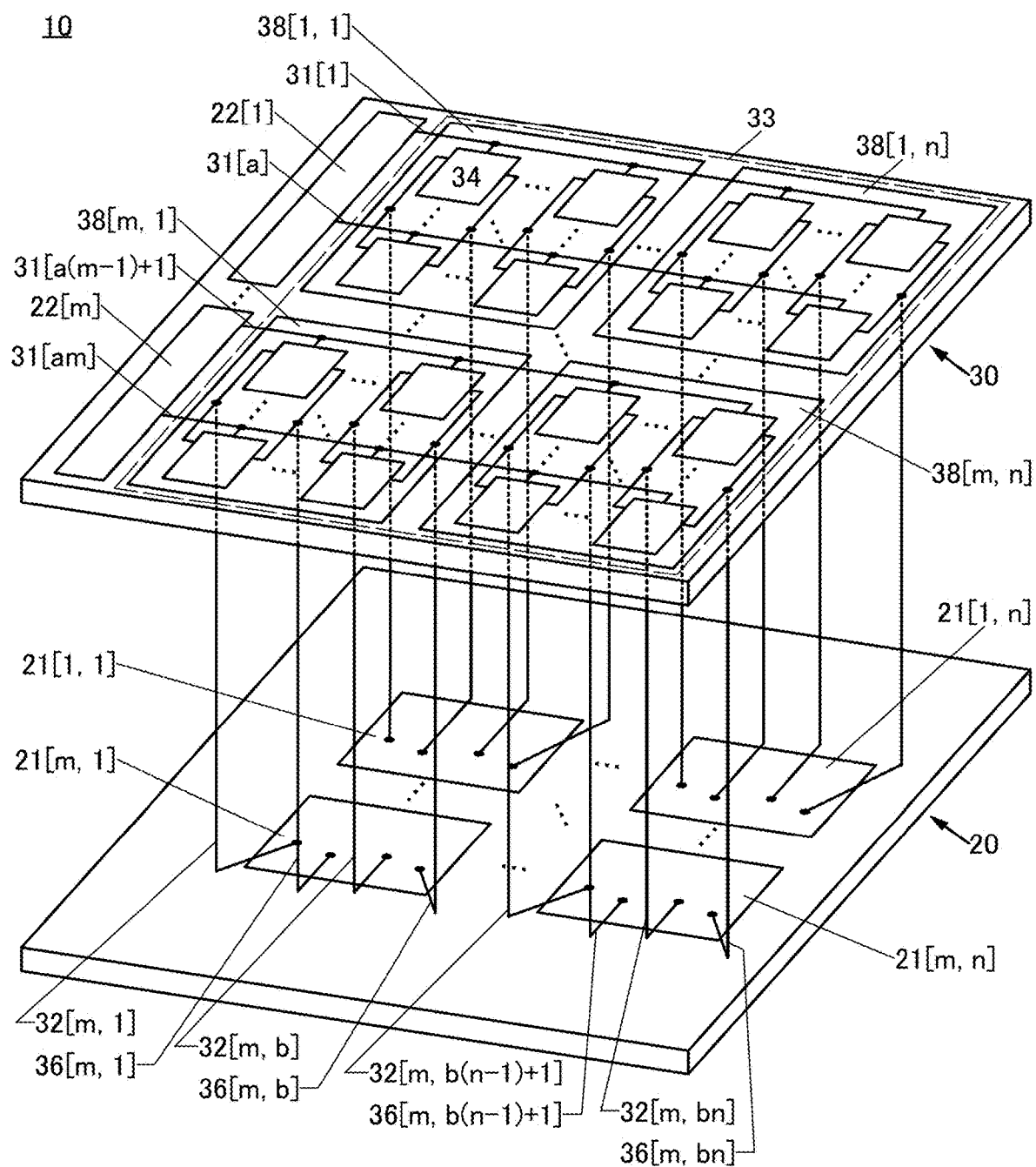
FIG. 15 is a block diagram illustrating a structure example of the display device.

In the example illustrated in FIG. 13, the size of the pixel block 38 is substantially the same as the size of the first circuit 21, and the pixel blocks 38[1, 1] to 38[m, n] have regions overlapping with the first circuits 21[1, 1] to 21 [m, n], respectively; however the summary of the present invention is not limited thereto. The pixel block 38 and the first circuit 21 may have different sizes. FIG. 14 and FIG. 15 each illustrate a structure example where the first circuit 21 is smaller than the pixel block 38. Note that the display device 10 illustrated in FIG. 15 corresponds to the display device 10 illustrated in FIG. 9.

Figure 16:
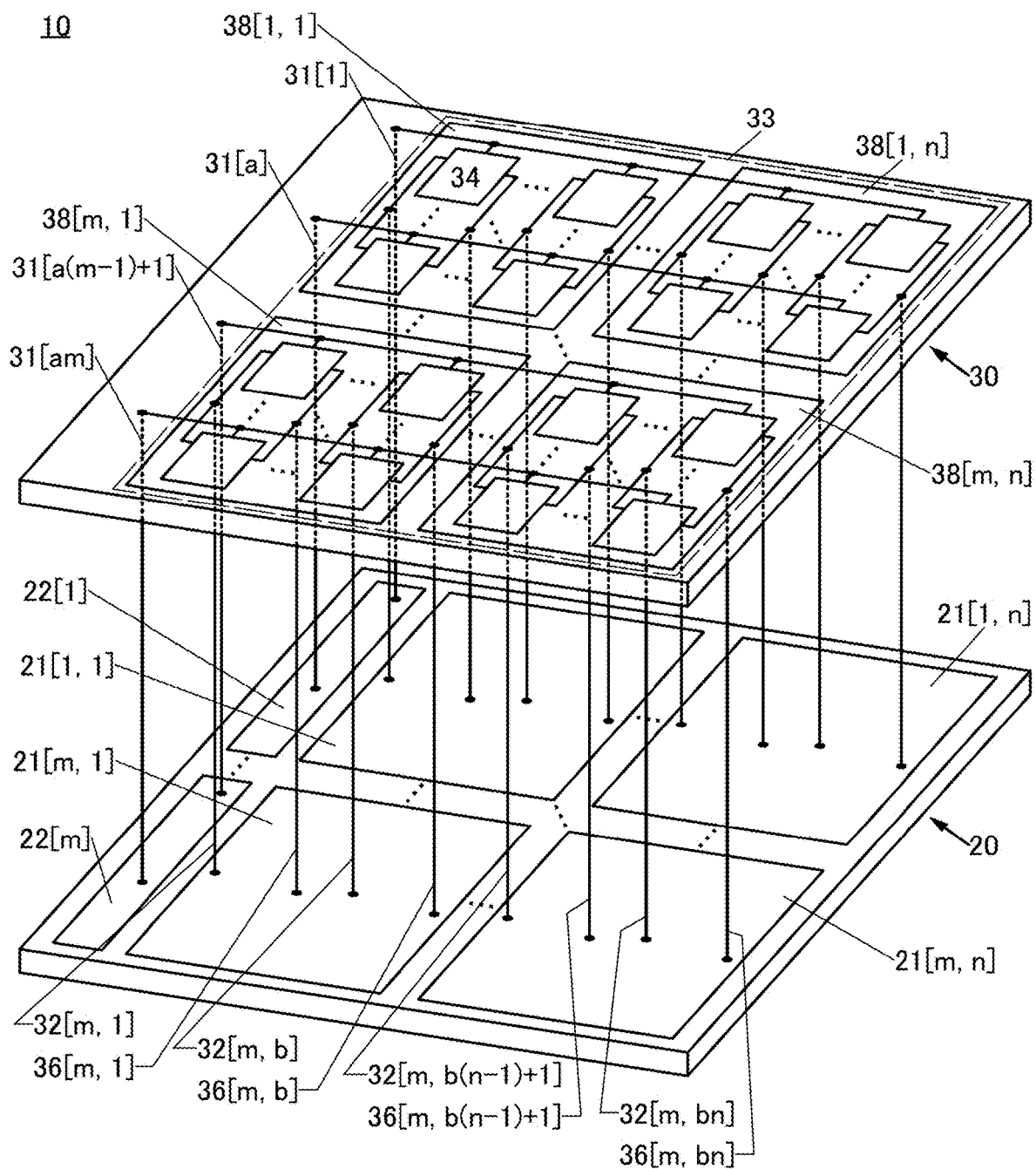
FIG. 16 is a block diagram illustrating a structure example of the display device.

Although FIG. 13 to FIG. 15 each illustrate the structure example in which the second layer 30 includes the second circuit 22, one embodiment of the present invention is not limited thereto. A structure example in which the first layer 20 includes the second circuits 22 is illustrated in FIG. 16. The display device 10 illustrated in FIG. 16 corresponds to the display device 10 illustrated in FIG. 10, the first layer 20 includes the first circuits 21 and the second circuits 22, and the second layer 30 includes the display portion 33.

The wiring 32 and the wiring 36 included in the pixel block 38 are electrically connected to the first circuit 21 positioned under the display portion 33. The wiring 31 is electrically connected to the first circuit 21 provided in the first layer 20.

Figure 17:
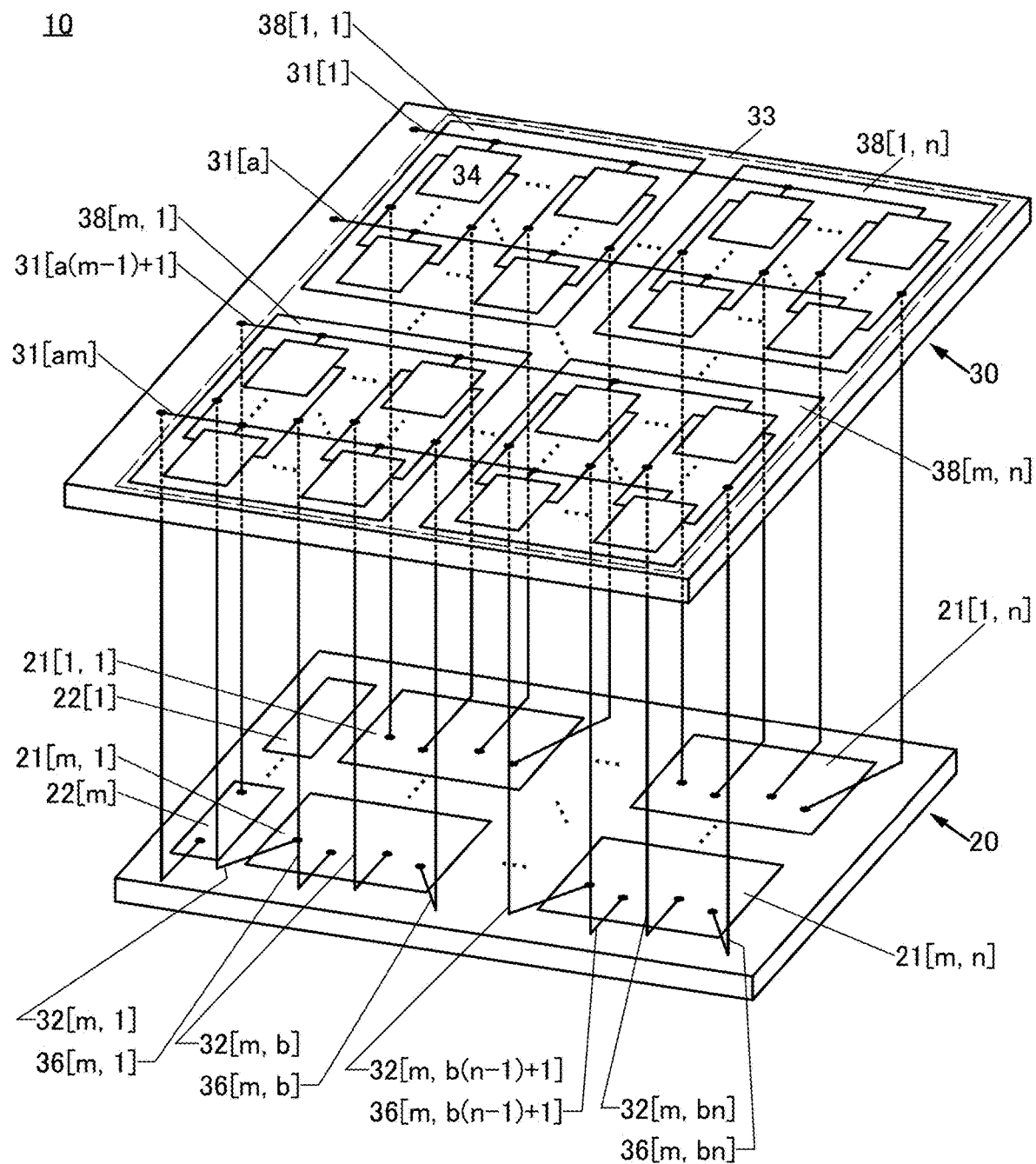
FIG. 17 is a block diagram illustrating a structure example of the display device.

FIG. 17 illustrates a structure example different from that of the display device 10 in FIG. 16. Note that the display device 10 illustrated in FIG. 17 corresponds to the display device 10 illustrated in FIG. 11. When the first layer 20 includes the second circuits 22 and the first circuit 21 is smaller than the pixel block 38, the bezel of the display device 10 is narrowed, so that the display device 10 can be downsized. When the second circuit 22 has a region overlapping with any of the pixel blocks 38, the display device 10 can be downsized.

Structure Example of Pixel 34

A structure example of the pixel 34 is described with reference to FIG. 18 to FIG. 20.

Figure 18:
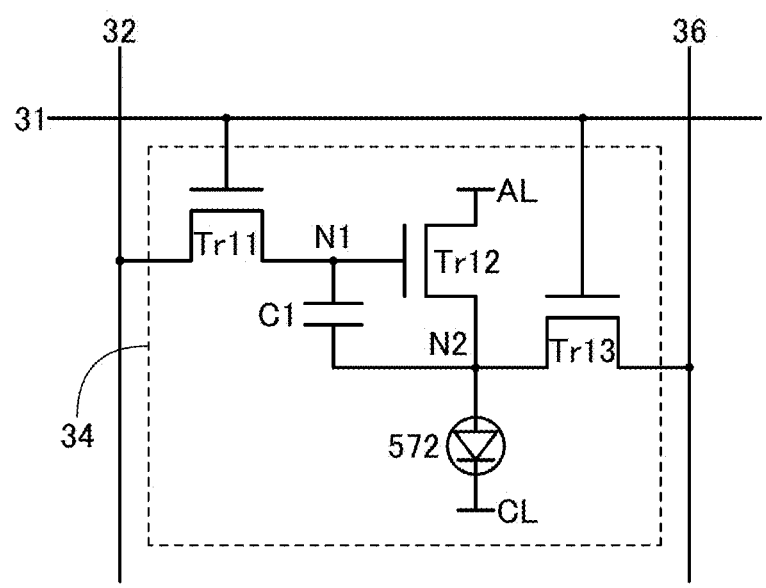
FIG. 18 is a circuit diagram illustrating a configuration example of a pixel.

The pixel 34 illustrated in FIG. 18 includes a transistor Tr11, a transistor Tr12, a transistor Tr13, a light-emitting element 572, and a capacitor C1. Although the transistor Tr11, the transistor Tr12, and the transistor Tr13 are n-channel transistors in FIG. 18, one embodiment of the present invention is not limited thereto. The transistor Tr11, the transistor Tr12, and the transistor Tr13 may each be a p-channel transistor.

A gate of the transistor Tr11 is connected to the wiring 31, one of a source and a drain of the transistor Tr11 is connected to a gate of the transistor Tr12 and one electrode of the capacitor C1, and the other of the source and the drain of the transistor Tr11 is connected to the wiring 32. One of the source and the drain of the transistor Tr12 is connected to the other electrode of the capacitor C1, one of electrodes of the light-emitting element 572, and one of a source and a drain of the transistor Tr13. The other of the source and the drain of the transistor Tr12 is connected to a wiring AL to which a potential Va is supplied. The other electrode of the light-emitting element 572 is connected to a wiring CL to which a potential Vc is supplied. A gate of the transistor Tr13 is connected to the wiring 31, and the other of the source and the drain of the transistor Tr13 is connected to the wiring 36. A node which is connected to the one of the source and the drain of the transistor Tr11, the gate of the transistor Tr12, and the one electrode of the capacitor C1 is referred to as a node N1. A node which is connected to the one of the source and the drain of the transistor Tr12, the one of the source and the drain of the transistor Tr13, and the other electrode of the capacitor C1 is referred to as a node N2.

Here, the case where the potential Va supplied to the wiring AL is a high power supply potential and the potential Vc supplied to the wiring CL is a low power supply potential is described. The capacitor C1 functions as a storage capacitor for retaining the potential of the node N2.

The transistor Tr11 has a function of controlling supply of the potential of the wiring 32 to the node N1. The transistor Tr13 has a function of controlling supply of a potential of the wiring 36 to the node N2. Specifically, the potential of the wiring 31 is controlled to turn on the transistor Tr11 and the transistor Tr13, whereby the potential of the wiring 32 and the potential of the wiring 36 are supplied to the node N1 and the node N2, respectively, and thus are written to the pixel 34. Here, the potential of the wiring 32 is a potential corresponding to an image signal. Then, the potential of the wiring 31 is controlled to turn off the transistor Tr11 and the transistor Tr13, whereby the potentials of the node N1 and the node N2 are retained.

The amount of current flowing between the source and the drain of the transistor Tr12 is controlled in accordance with a potential between the node N1 and the node N2, and thus the light-emitting element 572 emits light with a luminance corresponding to the amount of flowing current. Accordingly, the grayscale of the pixel 34 can be controlled.

The above operation is sequentially performed for each wiring 31, whereby an image of one frame can be displayed on the pixel block 38.

In addition, the selection of the wiring 31 may be performed by either a progressive method or an interlaced method. The supply of image signals from the first circuit 21 to the wiring 32 may be performed by dot sequential driving in which the image signals are sequentially supplied to the wirings 32, or line sequential driving in which the image signals are concurrently supplied to all the wirings 32. Alternatively, the image signals may be sequentially supplied to every set of a plurality of wirings 32.

Next, in the next frame period, an image is displayed by an operation similar to the above. Thus, the image displayed on the display portion 33 is rewritten. Note that the image rewriting is performed at a frequency high enough to prevent a change in an image due to the rewriting from being recognized by a viewer of the display portion 33. In the case where a moving image is displayed on the display portion 33, the frequency of image rewriting is preferably 60 times or higher per second, for example. Thus, a smooth moving image can be displayed.

On the other hand, for example, in the case of displaying a still image or a moving image which does not change for a certain period or which has a change within than a given range on the display portion 33, it is preferable to keep an image of the previous frame without rewriting. In this way, power consumption involved with image rewriting can be reduced.

When the frequency of image rewriting is reduced, the potentials of the node N1 and the node N2 are preferably retained for a long time. Thus, OS transistors are preferably used as the transistor Tr11 and the transistor Tr13. This enables the potentials of the node N1 and the node N2 to be retained for an extremely long time, and thus the display state can be maintained even when the frequency of image rewriting is reduced. The frequency of the image rewriting is more than or equal to once every day and less than 0.1 times every second, preferably more than or equal to once every hour and less than once every second, more preferably more than or equal to once every 30 seconds and less than once every second, for example.

Note that to maintain the display state is to keep a change in an image so as not be larger than a given range. This given range can be set as appropriate, and is preferably set so that a user viewing a displayed image can recognize the displayed image as the same image.

Reducing the frequency of image rewriting leads to a reduction in flickers in displaying an image. Accordingly, eyestrain of a viewer of the display portion 33 can be reduced.

In a period in which image rewriting is not performed, the supply of power supply potentials and signals to the first circuit 21 and the second circuit 22 can be stopped. Thus, power consumption of the first circuit 21 and the second circuit 22 can be reduced.

In addition, transistors other than the OS transistor may be used as the transistor Tr11 and the transistor Tr13. For example, a transistor whose channel formation region is formed in part of a substrate containing a single-crystal semiconductor other than a metal oxide can be used.

Examples of such a substrate include a single-crystal silicon substrate and a single-crystal germanium substrate. In addition, a transistor whose channel formation region is formed in a film containing a material other than a metal oxide can be used as the transistor Tr11 and the transistor Tr13. Examples of the material other than a metal oxide include silicon, germanium, silicon germanium, silicon carbide, gallium arsenide, aluminum gallium arsenide, indium phosphide, gallium nitride, and an organic semiconductor. Each of these materials may be a single-crystal semiconductor or a non-single-crystal semiconductor such as an amorphous semiconductor, a microcrystalline semiconductor, or a polycrystalline semiconductor.

Examples of a material that can be used for channel formation regions of the transistor Tr12 and transistors described below are the same as those of the transistor Tr11 and the transistor Tr13.

Structure examples different from that of the pixel 34 in FIG. 18 are illustrated in FIG. 19 and FIG. 20.

The pixel 34 illustrated in FIG. 19 is different from that in FIG. 18 in that the transistor Tr11, the transistor Tr12, and the transistor Tr13 each have a pair of gates. In the case where the transistor has a pair of gates, one gate may be referred to as a first gate, a front gate, or simply a gate, and the other gate may be referred to as a second gate or a back gate.

Figure 19A:
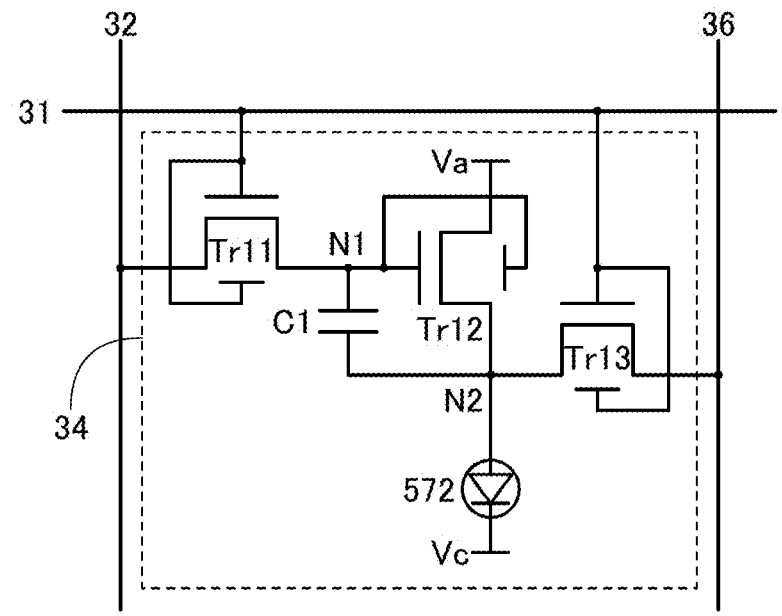
FIG. 19A and FIG. 19B are circuit diagrams illustrating configuration examples of the pixel.

The transistor Tr11, the transistor Tr12, and the transistor Tr13 illustrated in FIG. 19A each include a back gate, and the back gate is connected to a front gate. In this case, the same potential as a potential applied to the front gate is applied to the back gate, so that the on-state current of the transistor can be increased. In particular, the transistor Tr11 is used for writing of an image signal or data and the transistor Tr13 is used for reading data; therefore, when the configuration illustrated in FIG. 19A is employed, the pixel 34 capable of high-speed reading and writing is obtained.

Figure 19B:
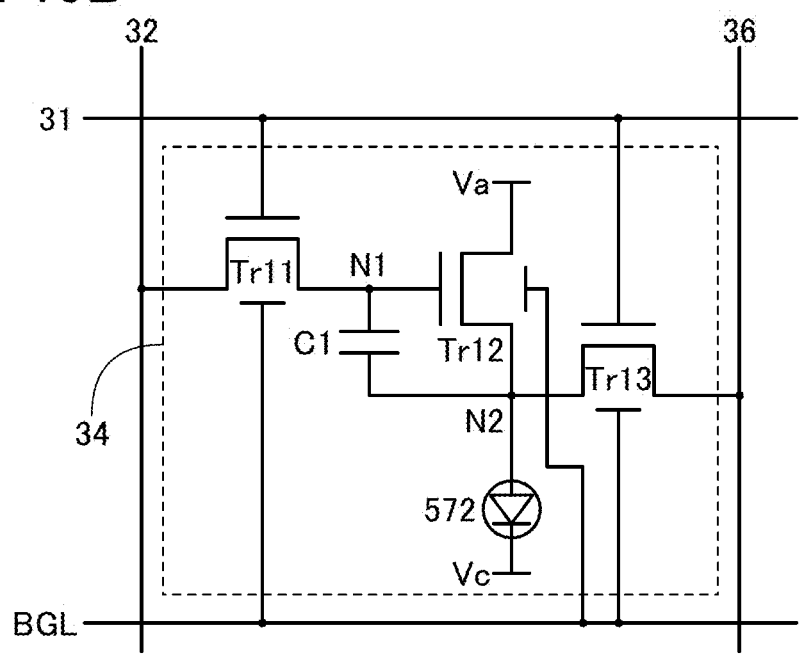

The back gates of the transistor Tr11, the transistor Tr12, and the transistor Tr13 illustrated in FIG. 19B are connected to a wiring BGL. The wiring BGL is a wiring having a function of supplying a predetermined potential to the back gates. The threshold voltages of the transistor Tr11, the transistor Tr12, and the transistor Tr13 can be controlled by controlling the potential of the wiring BGL. In particular, the transistor Tr11 and the transistor Tr13 are used for retaining the potentials of the nodes N1 and N2, respectively; therefore, the threshold voltages of the transistor Tr11 and the transistor Tr13 may be shifted to the positive side by control of the potential of the wiring BGL so that the off-state currents of the transistor Tr11 and the transistor Tr13 can be reduced. The potential supplied to the wiring BGL may be either a fixed potential or a variable potential.

The wiring BGL can be provided for each of the transistor Tr11, the transistor Tr12, and the transistor Tr13. Furthermore, the wiring BGL may be shared by all or part of the pixels 34 included in the display device 10.

Figure 20A:
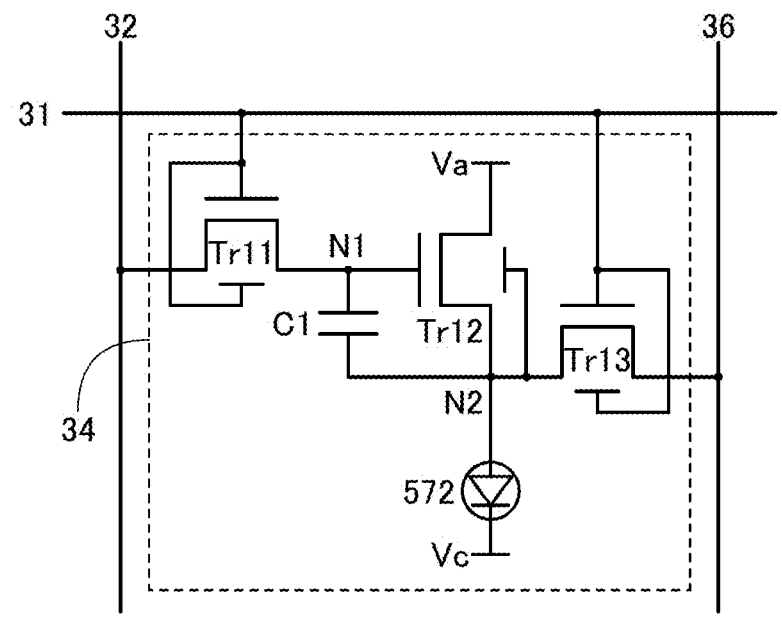
FIG. 20A and FIG. 20B are circuit diagrams illustrating configuration examples of the pixel.

Moreover, the transistor Tr11, the transistor Tr12, and the transistor Tr13 may have different structures depending on desired performance. FIG. 20A illustrates a configuration example of the pixel 34 in which the structures of the transistor Tr12 and the transistor Tr13 are different.

The back gate of the transistor Tr12 is connected to the node N2, and the back gate of the transistor Tr13 is connected to its front gate. When data is read from the pixel 34, a current flowing through the transistor Tr13 is preferably larger than a current flowing through the transistor Tr12. Thus, the transistor Tr13 has a structure in which the back gate is connected to the front gate to increase the on-state current. This structure can increase the on-state current of the transistor Tr13 to be larger than that of the transistor Tr12.

Note that the magnitude relation of the on-state currents of the transistors can be adjusted with a structure other than the back gate. For example, the W/L of the transistor Tr13 (W is a channel width and L is a channel length) is higher than W/L of the transistor Tr12, whereby the on-state current of the transistor Tr13 can be larger than that of the transistor Tr12.

Figure 20B:
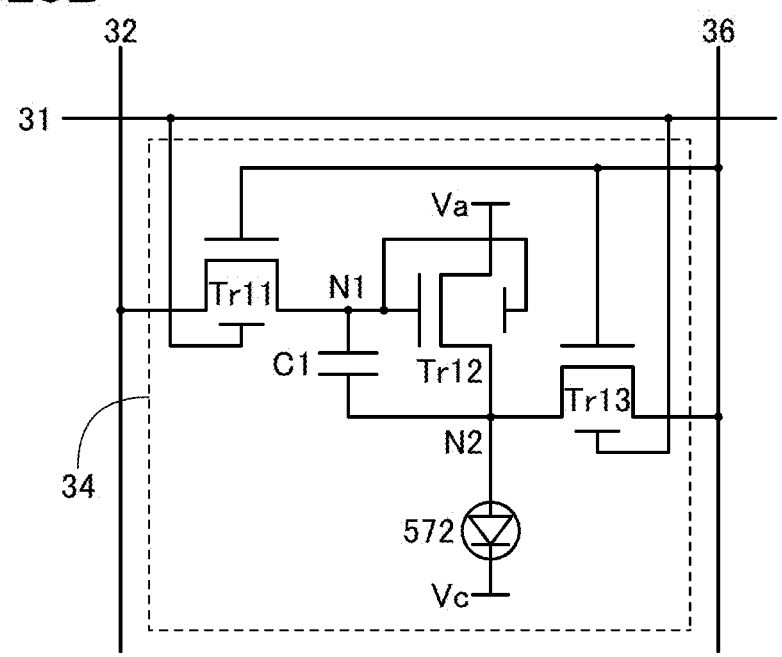

Alternatively, the pixel 34 can have a configuration illustrated in FIG. 20B. In FIG. 20B, a selection signal is supplied from the wiring 31 to the back gates of the transistor Tr11 and the transistor Tr13, whereby the transistor Tr11 and the transistor Tr13 are turned on, and thus predetermined potentials are supplied to the nodes N1 and N2. Note that the front gates of the transistor Tr11 and the transistor Tr13 are connected to the wiring 36.

As the light-emitting element 572, an EL element utilizing electroluminescence can be used, for example. The EL element includes a layer containing a light-emitting compound (hereinafter also referred to as an EL layer) between a pair of electrodes. By generating a potential difference between the pair of electrodes that is greater than the threshold voltage of the EL element, holes are injected into the EL layer from the anode side and electrons are injected into the EL layer from the cathode side. The injected electrons and holes are recombined in the EL layer and a light-emitting substance contained in the EL layer emits light.

EL elements are classified according to whether a light-emitting material is an organic compound or an inorganic compound; in general, the former is referred to as an organic EL element, and the latter is referred to as an inorganic EL element.

In an organic EL element, by voltage application, electrons from one electrode and holes from the other electrode are injected into the EL layer. Then, these carriers (electrons and holes) are recombined, which makes a light-emitting organic compound form an excited state and emit light when it returns from the excited state to a ground state. On the basis of such a mechanism, this light-emitting element is referred to as a current-excitation light-emitting element.

In this specification and the like, a voltage supplied to the display element such as a light-emitting element or a liquid crystal element refers to a difference between the potential applied to the one electrode of the display element and the potential applied to the other electrode of the display element.

The EL layer may further contain a substance with a high hole-injection property, a substance with a high hole-transport property, a hole-blocking material, a substance with a high electron-transport property, a substance with a high electron-injection property, a substance with a bipolar property (a substance with a high electron- and hole-transport properties), or the like in addition to the light-emitting compound.

The EL layer can be formed by an evaporation method (including a vacuum evaporation method), a transfer method, a printing method, an inkjet method, a coating method, or the like.

The inorganic EL elements are classified according to their device structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is interposed between dielectric layers, which are further interposed between electrodes, and its light emission mechanism is localized type light emission that utilizes inner-shell electron transition of metal ions.

In order that light emitted from the light-emitting element can be extracted, at least one of the pair of electrodes is transparent. A transistor and a light-emitting element are formed over a substrate; the light-emitting element can have any of a top emission structure in which light emission is extracted from the surface on the side opposite to the substrate, a bottom emission structure in which light emission is extracted from the surface on the substrate side, or a dual emission structure in which light emission is extracted from both surfaces.

<Cross-Sectional Structure Example 1 of Display Device>

Figure 21:
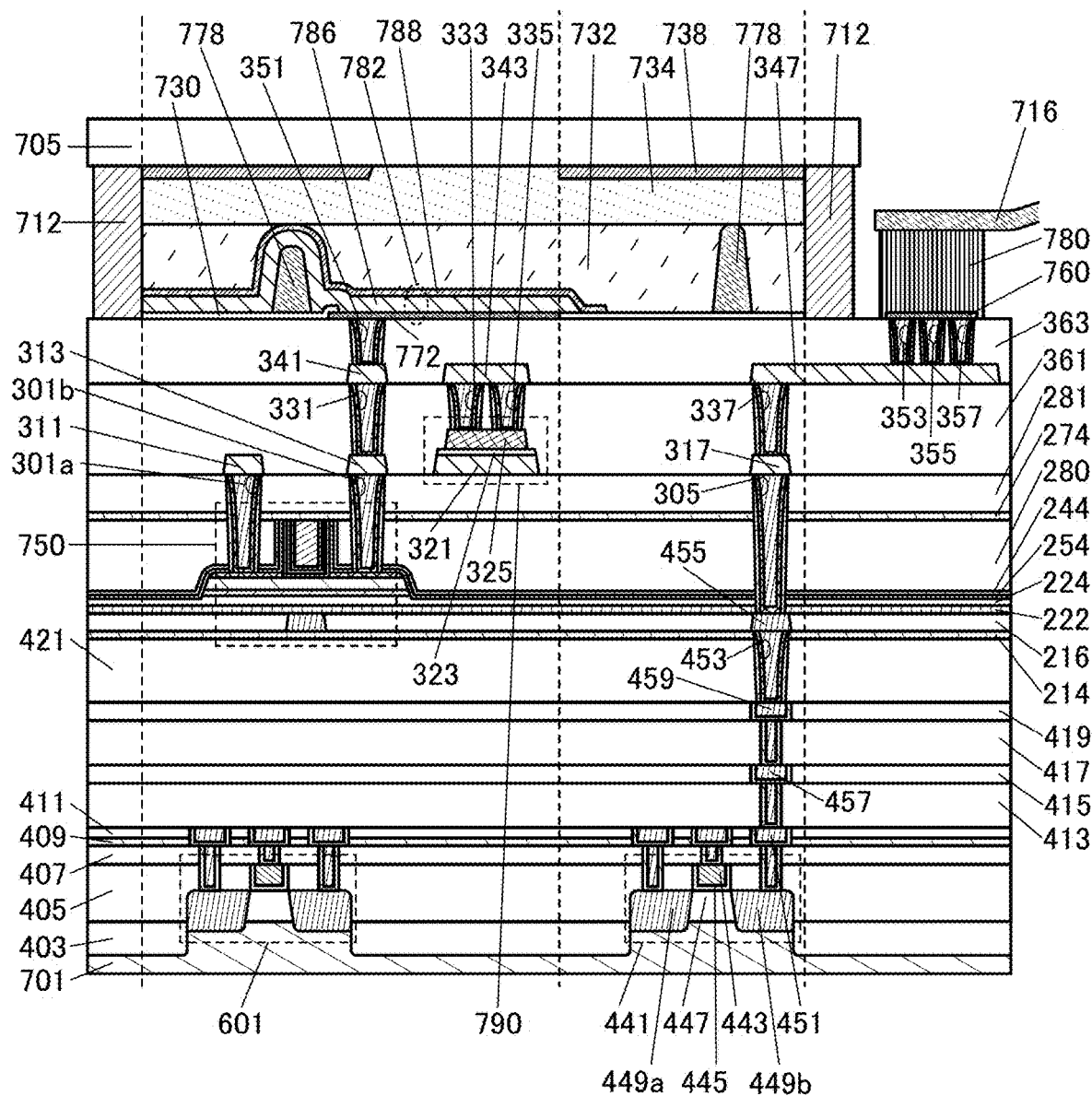
FIG. 21 is a cross-sectional view illustrating a structure example of the display device.

FIG. 21 is a cross-sectional view illustrating a structure example of the display device 10. The display device 10 includes a substrate 701 and a substrate 705. The substrate 701 and the substrate 705 are attached to each other with a sealant 712.

As the substrate 701, a single crystal semiconductor substrate such as a single crystal silicon substrate can be used. Note that a semiconductor substrate other than a single crystal semiconductor substrate may be used as the substrate 701.

A transistor 441 and a transistor 601 are provided on the substrate 701. The transistor 441 and the transistor 601 can be provided in the first layer 20. For example, in the display devices 10 illustrated in FIG. 7 to FIG. 9, the transistor 441 and the transistor 601 can be the transistors provided in the first circuit 21. For example, in the display devices 10 illustrated in FIG. 10 and FIG. 11, the transistor 441 and the transistor 601 can be the transistors provided in the first circuit 21 or the second circuit 22.

The transistor 441 is formed of a conductor 443 functioning as a gate electrode, an insulator 445 functioning as a gate insulator, and part of the substrate 701 and includes a semiconductor region 447 including a channel formation region, a low-resistance region 449a functioning as one of a source region and a drain region, and a low-resistance region 449b functioning as the other of the source region and the drain region. The transistor 441 can be a p-channel transistor or an n-channel transistor.

The transistor 441 is electrically isolated from other transistors by an element isolation layer 403. FIG. 21 illustrates the case where the transistor 441 and the transistor 601 are electrically isolated from each other by the element isolation layer 403. The element isolation layer 403 can be formed by a LOCOS (LOCal Oxidation of Silicon) method, an STI (Shallow Trench Isolation) method, or the like.

Here, in the transistor 441 illustrated in FIG. 21, the semiconductor region 447 has a projecting shape. Moreover, the conductor 443 is provided to cover the side surface and the top surface of the semiconductor region 447 with the insulator 445 therebetween. Note that FIG. 21 does not illustrate the state where the conductor 443 covers the side surface of the semiconductor region 447. A material adjusting the work function can be used for the conductor 443.

A transistor having a projecting semiconductor region, like the transistor 441, can be referred to as a fin-type transistor because a projecting portion of a semiconductor substrate is used. An insulator functioning as a mask for forming a projecting portion may be provided in contact with the top surface of the projecting portion. Although FIG. 21 illustrates the structure in which the projecting portion is formed by processing part of the substrate 701, a semiconductor having a projecting shape may be formed by processing an SOI substrate.

Note that the structure of the transistor 441 illustrated in FIG. 21 is only an example; the structure of the transistor 441 is not limited thereto and can be changed as appropriate in accordance with the circuit structure, an operation method for the circuit, or the like. For example, the transistor 441 may be a planar transistor.

The transistor 601 can have a structure similar to that of the transistor 441.

An insulator 405, an insulator 407, an insulator 409, and an insulator 411 are provided over the substrate 701, in addition to the element isolation layer 403 and the transistors 441 and 601. A conductor 451 is embedded in the insulator 405, the insulator 407, the insulator 409, and the insulator 411. Here, the top surface of the conductor 451 and the top surface of the insulator 411 can be substantially level with each other.

An insulator 413 and an insulator 415 are provided over the conductor 451 and the insulator 411. A conductor 457 is embedded in the insulator 413 and the insulator 415. Here, the top surface of the conductor 457 and the top surface of the insulator 415 can be substantially level with each other.

An insulator 417 and an insulator 419 are provided over the conductor 457 and the insulator 415. A conductor 459 is embedded in the insulator 417 and the insulator 419. Here, the top surface of the conductor 459 and the top surface of the insulator 419 can be substantially level with each other.

An insulator 421 and an insulator 214 are provided over the conductor 459 and the insulator 419. A conductor 453 is embedded in the insulator 421 and the insulator 214. Here, the top surface of the conductor 453 and the top surface of the insulator 214 can be substantially level with each other.

An insulator 216 is provided over the conductor 453 and the insulator 214. A conductor 455 is embedded in the insulator 216. Here, the top surface of the conductor 455 and the top surface of the insulator 216 can be substantially level with each other.

An insulator 222, an insulator 224, an insulator 254, an insulator 244, an insulator 280, an insulator 274, and an insulator 281 are provided over the conductor 455 and the insulator 216. A conductor 305 is embedded in the insulator 222, the insulator 224, the insulator 254, the insulator 244, the insulator 280, the insulator 274, and the insulator 281.

Here, the top surface of the conductor 305 and the top surface of the insulator 281 can be substantially level with each other.

An insulator 361 is provided over the conductor 305 and the insulator 281. A conductor 317 and a conductor 337 are embedded in the insulator 361. Here, the top surface of the conductor 337 and the top surface of the insulator 361 can be substantially level with each other.

An insulator 363 is provided over the conductor 337 and the insulator 361. A conductor 347, a conductor 353, a conductor 355, and a conductor 357 are embedded in the insulator 363. Here, the top surfaces of the conductor 353, the conductor 355, and the conductor 357 and the top surface of the insulator 363 can be substantially level with each other.

A connection electrode 760 is provided over the conductor 353, the conductor 355, the conductor 357, and the insulator 363. An anisotropic conductor 780 is provided to be electrically connected to the connection electrode 760, and an FPC (Flexible Printed Circuit) 716 is provided to be electrically connected to the anisotropic conductor 780. A variety of signals and the like are supplied to the display device 10 from outside of the display device 10 through the FPC 716.

As illustrated in FIG. 21, the low-resistance region 449b having a function of the other of the source region and the drain region of the transistor 441 is electrically connected to the FPC 716 through the conductor 451, the conductor 457, the conductor 459, the conductor 453, the conductor 455, the conductor 305, the conductor 317, the conductor 337, the conductor 347, the conductor 353, the conductor 355, the conductor 357, the connection electrode 760, and the anisotropic conductor 780. Although FIG. 21 illustrates three conductors, which are the conductor 353, the conductor 355, and the conductor 357, as conductors that electrically connect the connection electrode 760 and the conductor 347, one embodiment of the present invention is not limited thereto. The number of conductors having a function of electrically connecting the connection electrode 760 and the conductor 347 may be one, two, or four or more. Providing a plurality of conductors having a function of electrically connecting the connection electrode 760 and the conductor 347 can reduce the contact resistance.

A transistor 750 is provided over the insulator 214. The transistor 750 can be provided in the second layer 30. For example, in the display devices 10 illustrated in FIG. 7 to FIG. 11, the transistor 750 can be the transistor provided in the display portion 33. An OS transistor can be used as the transistor 750. The OS transistor has a feature of extremely low off-state current. Consequently, the retention time for an image signal or the like can be increased, so that the frequency of the refresh operation can be reduced. Thus, power consumption of the display device 10 can be reduced.

A conductor 301a and a conductor 301b are embedded in the insulator 254, the insulator 244, the insulator 280, the insulator 274, and the insulator 281. The conductor 301a is electrically connected to one of a source and a drain of the transistor 750, and the conductor 301b is electrically connected to the other of the source and the drain of the transistor 750. Here, the top surfaces of the conductor 301a and the conductor 301b and the top surface of the insulator 281 can be substantially level with each other.

A conductor 311, a conductor 313, a conductor 331, a capacitor 790, a conductor 333, and a conductor 335 are embedded in the insulator 361. The conductor 311 and the conductor 313 are electrically connected to the transistor 750 and have a function of a wiring. The conductor 333 and the conductor 335 are electrically connected to the capacitor 790. Here, the top surfaces of the conductor 331, the conductor 333, and the conductor 335 and the top surface of the insulator 361 can be substantially level with each other.

A conductor 341, a conductor 343, and a conductor 351 are embedded in the insulator 363. Here, the top surface of the conductor 351 and the top surface of the insulator 363 can be substantially level with each other.

The insulator 405, the insulator 407, the insulator 409, the insulator 411, the insulator 413, the insulator 415, the insulator 417, the insulator 419, the insulator 421, the insulator 214, the insulator 280, the insulator 274, the insulator 281, the insulator 361, and the insulator 363 have a function of an interlayer film and may also have a function of a planarization film that covers unevenness thereunder. For example, the top surface of the insulator 363 may be planarized by planarization treatment using a chemical mechanical polishing (CMP) method or the like to have the increased evenness.

As illustrated in FIG. 21, the capacitor 790 includes a lower electrode 321 and an upper electrode 325. An insulator 323 is provided between the lower electrode 321 and the upper electrode 325. That is, the capacitor 790 has a stacked-layer structure in which the insulator 323 functioning as a dielectric is positioned between the pair of electrodes. Although FIG. 21 illustrates an example in which the capacitor 790 is provided over the insulator 281, the capacitor 790 may be provided over an insulator different from the insulator 281.

In the example illustrated in FIG. 21, the conductor 301a, the conductor 301b, and the conductor 305 are formed in the same layer; the conductor 311, the conductor 313, the conductor 317, and the lower electrode 321 are formed in the same layer; the conductor 331, the conductor 333, the conductor 335, and the conductor 337 are formed in the same layer; the conductor 341, the conductor 343, and the conductor 347 are formed in the same layer; and the conductor 351, the conductor 353, the conductor 355, and the conductor 357 are formed in the same layer. Forming a plurality of conductors in the same layer in this manner simplifies the process of manufacturing the display device 10 and thus makes the display device 10 inexpensive. Note that these conductors may be formed in different layers or may contain different types of materials.

The display device 10 illustrated in FIG. 21 includes a light-emitting element 782. The light-emitting element 782 includes the conductor 772, an EL layer 786, and a conductor 788. The EL layer 786 contains an organic compound or an inorganic compound such as quantum dots.

Examples of materials that can be used as an organic compound include a fluorescent material and a phosphorescent material. Examples of materials that can be used as quantum dots include a colloidal quantum dot material, an alloyed quantum dot material, a core-shell quantum dot material, and a core quantum dot material.

The conductor 772 is electrically connected to the other of the source and the drain of the transistor 750 through the conductor 351, the conductor 341, the conductor 331, the conductor 313, and the conductor 301b. The conductor 772 is formed over the insulator 363 and has a function of a pixel electrode.

A material that transmits visible light or a material that reflects visible light can be used for the conductor 772. As a light-transmitting material, for example, an oxide material containing indium, zinc, tin, or the like is preferably used. As a reflective material, for example, a material containing aluminum, silver, or the like is preferably used.

Although not illustrated in FIG. 21, an optical member (optical substrate) such as a polarizing member, a retardation member, or an anti-reflection member can be provided in the display device 10 as appropriate, for example.

On the substrate 705 side, a light-blocking layer 738 and an insulator 734 that is in contact with them are provided. The light-blocking layer 738 has a function of blocking light emitted from adjacent regions. Alternatively, the light-blocking layer 738 has a function of preventing external light from reaching the transistor 750 or the like.

In the display device 10 illustrated in FIG. 21, an insulator 730 is provided over the insulator 363. Here, the insulator 730 can cover part of the conductor 772. Here, the light-emitting element 782 is a top-emission light-emitting element, which includes the conductor 788 with a light-transmitting property. Note that the light-emitting element 782 may have a bottom-emission structure in which light is emitted to the conductor 772 side or a dual-emission structure in which light is emitted to both the conductor 772 and the conductor 788.

The light-blocking layer 738 is provided to include a region overlapping with the insulator 730. The light-blocking layer 738 is covered with the insulator 734. A space between the light-emitting element 782 and the insulator 734 is filled with a sealing layer 732.

The structured part 778 is provided between the insulator 730 and the EL layer 786. Moreover, the structured part 778 is provided between the insulator 730 and the insulator 734.

Figure 22:
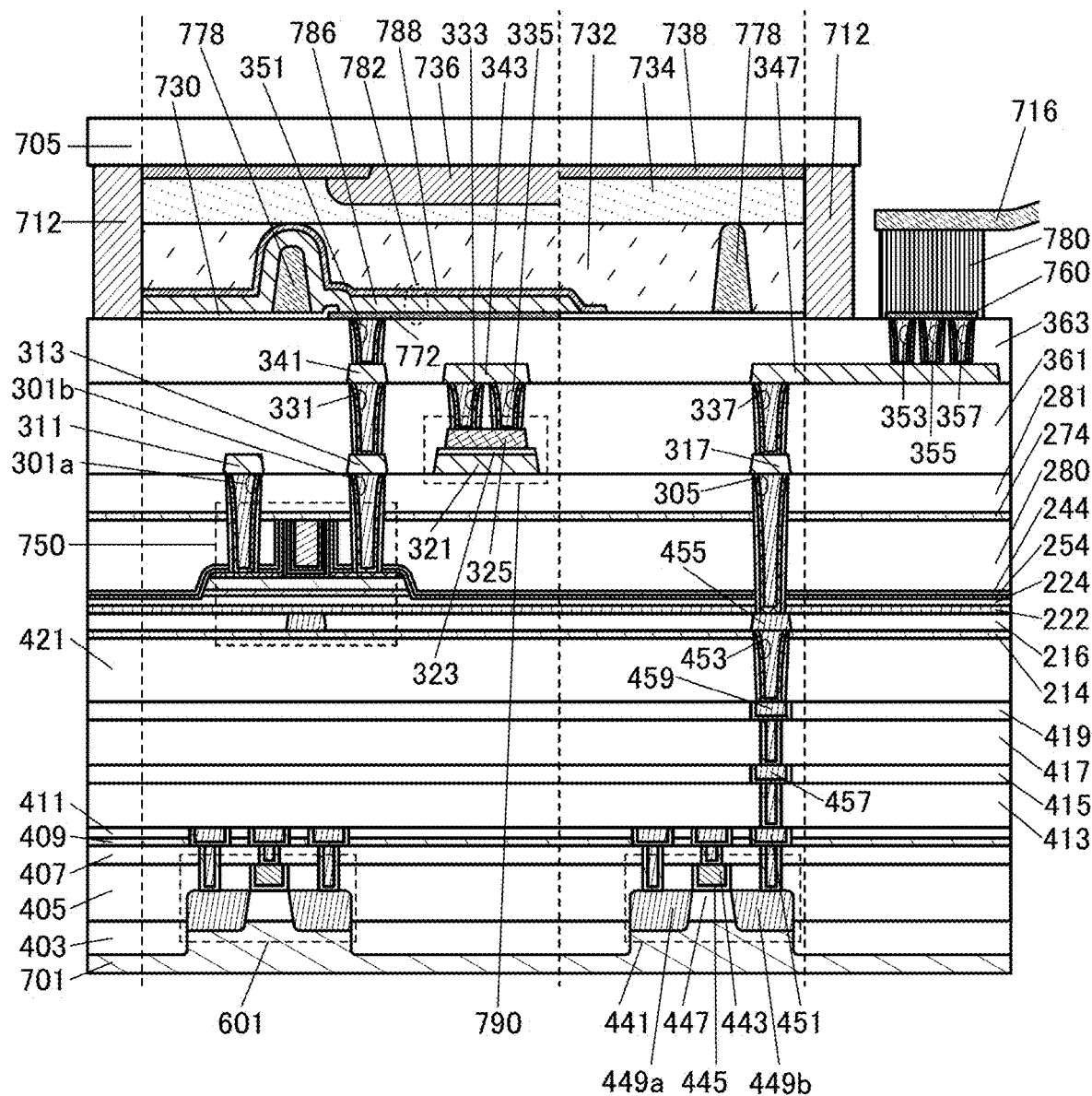
FIG. 22 is a cross-sectional view illustrating a structure example of the display device.

FIG. 22 illustrates a modification example of the display device 10 illustrated in FIG. 21 and differs from the display device 10 illustrated in FIG. 21 in that the coloring layer 736 is provided. Note that the coloring layer 736 is provided to have a region overlapping with the light-emitting element 782. Providing the coloring layer 736 can improve the color purity of light extracted from the light-emitting element 782. Thus, the display device 10 can display high-quality images. Furthermore, all the light-emitting elements 782, for example, in the display device 10 can be light-emitting elements that emit white light; hence, the EL layers 786 are not necessarily formed separately for each color, leading to higher definition of the display device 10.

The light-emitting element 782 can have a micro optical resonator (microcavity) structure. Thus, light of predetermined colors (e.g., RGB) can be extracted without a coloring layer, and the display device 10 can perform color display. The structure without a coloring layer can prevent light absorption by the coloring layer. As a result, the display device 10 can display high-luminance images, and the power consumption of the display device 10 can be reduced. Note that a structure in which a coloring layer is not provided can be employed even when the EL layer 786 is formed into an island shape for each pixel or into a stripe shape for each pixel column, i.e., the EL layers 786 are formed separately for each color.

Figure 23:
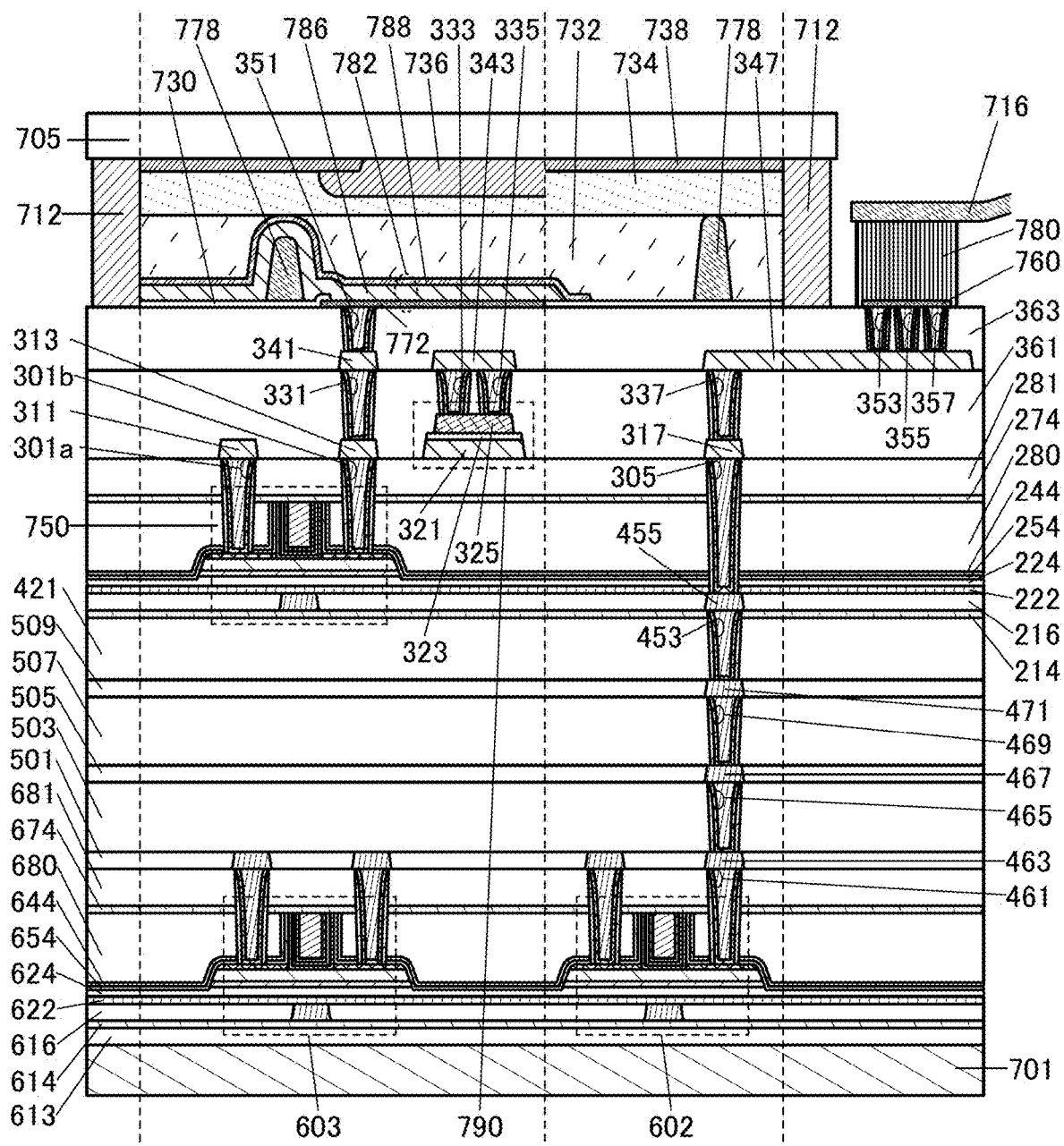
FIG. 23 is a cross-sectional view illustrating a structure example of the display device.

Although FIG. 21 and FIG. 22 each illustrate a structure where the transistor 441 and the transistor 601 are provided so that their channel formation regions are formed inside the substrate 701 and the OS transistor is stacked over the transistor 441 and the transistor 601, one embodiment of the present invention is not limited thereto. FIG. 23 illustrates a modification example of FIG. 22, and FIG. 23 is different from the display device 10 illustrated in FIG. 22 in that the transistor 750 is stacked over a transistor 602 and a transistor 603 that are OS transistors, in place of the transistor 441 and the transistor 601. That is, the display device 10 having the structure illustrated in FIG. 23 includes a stack of OS transistors.

An insulator 613 and an insulator 614 are provided over the substrate 701, and the transistor 602 and the transistor 603 are provided over the insulator 614. Note that a transistor or the like may be provided between the substrate 701 and the insulator 613. For example, a transistor having a structure similar to those of the transistor 441 and the transistor 601 illustrated in FIG. 22 may be provided between the substrate 701 and the insulator 613.

That is, the transistor 602 and the transistor 603 can be provided in the first layer 20. For example, in the display device 10 illustrated in FIG. 7 and FIG. 9, the transistor 602 and the transistor 603 can be the transistors provided in the first circuit 21. For example, in the display devices 10 illustrated in FIG. 10 and FIG. 11, the transistor 602 and the transistor 603 can be the transistors provided in the first circuit 21 or the second circuit 22.

The transistor 602 and the transistor 603 can have a structure similar to that of the transistor 750. Note that the transistor 602 and the transistor 603 may be OS transistors having a structure different from that of the transistor 750.

An insulator 616, an insulator 622, an insulator 624, an insulator 654, an insulator 644, an insulator 680, an insulator 674, and an insulator 681 are provided over the insulator 614, in addition to the transistor 602 and the transistor 603. A conductor 461 is embedded in the insulator 654, the insulator 644, the insulator 680, the insulator 674, and the insulator 681. Here, the top surface of the conductor 461 and the top surface of the insulator 681 can be substantially level with each other.

An insulator 501 is provided over the conductor 461 and the insulator 681. A conductor 463 is embedded in the insulator 501. Here, the top surface of the conductor 463 and the top surface of the insulator 501 can be substantially level with each other.

An insulator 503 is provided over the conductor 463 and the insulator 501. A conductor 465 is embedded in the insulator 503. Here, the top surface of the conductor 465 and the top surface of the insulator 503 can be substantially level with each other.

An insulator 505 is provided over the conductor 465 and the insulator 503. A conductor 467 is embedded in the insulator 505. Here, the top surface of the conductor 467 and the top surface of the insulator 505 can be substantially level with each other.

An insulator 507 is provided over the conductor 467 and the insulator 505. A conductor 469 is embedded in the insulator 507. Here, the top surface of the conductor 469 and the top surface of the insulator 507 can be substantially level with each other.

An insulator 509 is provided over the conductor 469 and the insulator 507. A conductor 471 is embedded in the insulator 509. Here, the top surface of the conductor 471 and the top surface of the insulator 509 can be substantially level with each other.

The insulator 421 and the insulator 214 are provided over the conductor 471 and the insulator 509. A conductor 453 is embedded in the insulator 421 and the insulator 214. Here, the top surface of the conductor 453 and the top surface of the insulator 214 can be substantially level with each other.

As illustrated in FIG. 23, one of a source and a drain of the transistor 602 is electrically connected to the FPC 716 through the conductor 461, the conductor 463, the conductor 465, the conductor 467, the conductor 469, the conductor 471, the conductor 453, the conductor 455, the conductor 305, the conductor 317, the conductor 337, the conductor 347, the conductor 353, the conductor 355, the conductor 357, the connection electrode 760, and the anisotropic conductor 780.

The insulator 613, the insulator 614, the insulator 680, the insulator 674, the insulator 681, the insulator 501, the insulator 503, the insulator 505, the insulator 507, and the insulator 509 have a function of an interlayer film and may also have a function of a planarization film that covers unevenness thereunder.

When the display device 10 has the structure illustrated in FIG. 23, all the transistors in the display device 10 can be OS transistors while the bezel and size of the display device 10 are reduced. Accordingly, the transistors provided in the first layer 20 and the transistors provided in the second layer 30 can be manufactured using the same apparatus, for example. Consequently, the manufacturing cost of the display device 10 can be reduced, making the display device 10 inexpensive.

<Cross-Sectional Structure Example 2 of Display Device>

Figure 24:
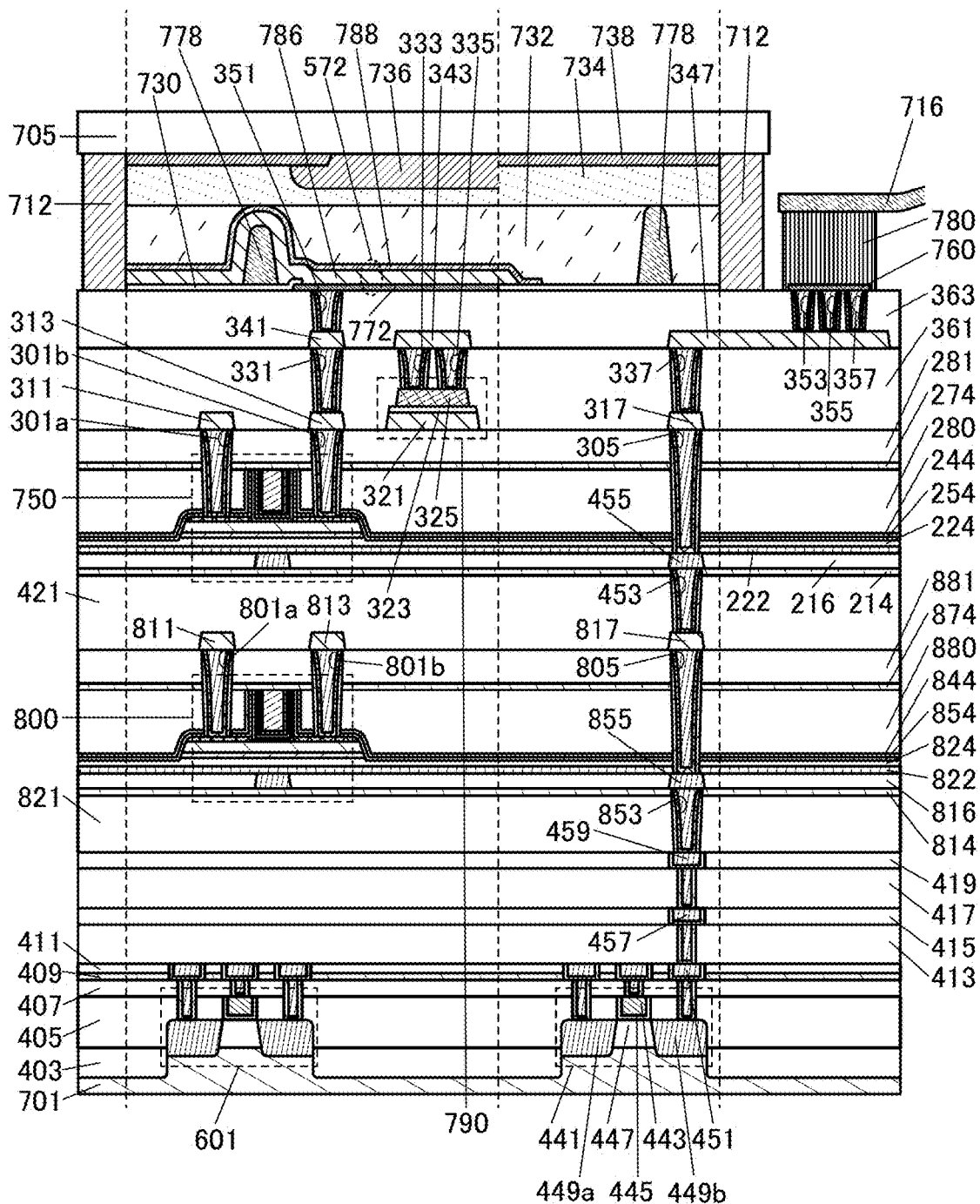
FIG. 24 is a cross-sectional view illustrating a structure example of the display device.

FIG. 24 is a cross-sectional view illustrating a structure example of the display device 10A. The display device 10A in FIG. 24 is different from the display device 10 in FIG. 22 mainly in that a layer including a transistor 800 is interposed between the layer including the transistor 750 and the layer including the transistor 602 and the transistor 603.

That is, the transistor 602 and the transistor 603 can be provided in the first circuit layer 20a illustrated in FIG. 12A and the like. The transistor 800 can be provided in the second circuit layer 20b. For example, in the display device 10A illustrated in FIG. 12A, the transistor 800 can be a transistor provided in the memory circuit 93. The transistor 602 and the transistor 603 can each be a transistor provided in a component (e.g., a logic circuit 81) other than the memory circuit 93.

An insulator 821 and an insulator 814 are provided over the conductor 459 and the insulator 419. A conductor 853 is embedded in the insulator 821 and the insulator 814. Here, the top surface of the conductor 853 and the top surface of the insulator 814 can be substantially level with each other.

An insulator 816 is provided over the conductor 853 and the insulator 814. A conductor 855 is embedded in the insulator 816. Here, the top surface of the conductor 855 and the top surface of the insulator 816 can be substantially level with each other.

An insulator 822, an insulator 824, an insulator 854, an insulator 844, an insulator 880, an insulator 874, and an insulator 881 are provided over the conductor 855 and the insulator 816. A conductor 805 is embedded in the insulator 822, the insulator 824, the insulator 854, the insulator 844, the insulator 880, the insulator 874, and the insulator 881. Here, the top surface of the conductor 805 and the top surface of the insulator 881 can be substantially level with each other.

The insulator 421 and the insulator 214 are provided over the conductor 817 and the insulator 881.

As illustrated in FIG. 24, the low-resistance region 449b functioning as the other of the source region and the drain region of the transistor 441 is electrically connected to the FPC 716 through the conductor 451, the conductor 457, the conductor 459, the conductor 853, the conductor 855, the conductor 805, the conductor 817, the conductor 453, the conductor 455, the conductor 305, the conductor 317, the conductor 337, the conductor 347, the conductor 353, the conductor 355, the conductor 357, the connection electrode 760, and the anisotropic conductor 780.

A transistor 800 is provided over the insulator 814. The transistor 800 can be provided in the second circuit layer 20*b*. For example, in the display device 10A illustrated in FIG. 12A, the transistor 800 can be a transistor provided in the memory circuit 93. The transistor 800 is preferably an OS transistor.

A conductor 801*a* and a conductor 801*b* are embedded in the insulator 854, the insulator 844, the insulator 880, the insulator 874, and the insulator 881. The conductor 801*a* is electrically connected to one of a source and a drain of the transistor 800, and the conductor 801*b* is electrically connected to the other of the source and the drain of the transistor 800. Here, the top surfaces of the conductor 801*a* and the conductor 801*b* and the top surface of the insulator 881 can be substantially level with each other.

A transistor 750 is provided over the insulator 214. The transistor 750 can be provided in the second layer 30. For example, in the display device 10A illustrated in FIG. 12A, the transistor 750 can be provided in the display portion 33. The transistor 750 is preferably an OS transistor.

The conductor 301*a* is electrically connected to one of a source and a drain of the transistor 750, and the conductor 301*b* is electrically connected to the other of the source and the drain of the transistor 750. Here, the top surfaces of the conductor 301*a* and the conductor 301*b* and the top surface of the insulator 281 can be substantially level with each other.

Note that an OS transistor or the like may be provided between the layer where the transistor 441, the transistor 601, and the like are provided and the layer where the transistor 800 and the like are provided. Alternatively, an OS transistor or the like may be provided between the layer where the transistor 800 and the like are provided and the layer where the transistor 750 and the like are provided. Further alternatively, an OS transistor or the like may be provided above the layer where the transistor 750 and the like are provided.

The conductor 311 and the conductor 313 are electrically connected to the transistor 750 and have a function of a wiring. The conductor 333 and the conductor 335 are electrically connected to the capacitor 790.

The insulator 405, the insulator 407, the insulator 409, the insulator 411, the insulator 413, the insulator 415, the insulator 417, the insulator 419, the insulator 821, the insulator 814, the insulator 880, the insulator 874, the insulator 881, the insulator 421, the insulator 214, the insulator 280, the insulator 274, the insulator 281, the insulator 361, and the insulator 363 function as an interlayer films and may also function as a planarization film that covers unevenness thereunder.

As illustrated in FIG. 24, the capacitor 790 includes the lower electrode 321 and the upper electrode 325. The insulator 323 is provided between the lower electrode 321 and the upper electrode 325. In other words, the capacitor 790 has a stacked-layer structure in which the insulator 323 functioning as a dielectric is positioned between the pair of electrodes. Although FIG. 24 illustrates the example in which the capacitor 790 is provided over the insulator 281, the capacitor 790 may be provided over an insulator other than the insulator 281.

In the example in FIG. 24, the conductor 801*a*, the conductor 801*b*, and the conductor 805 are formed in the same layer. The conductor 811, the conductor 813, and the conductor 817 are formed in the same layer.

Figure 25:
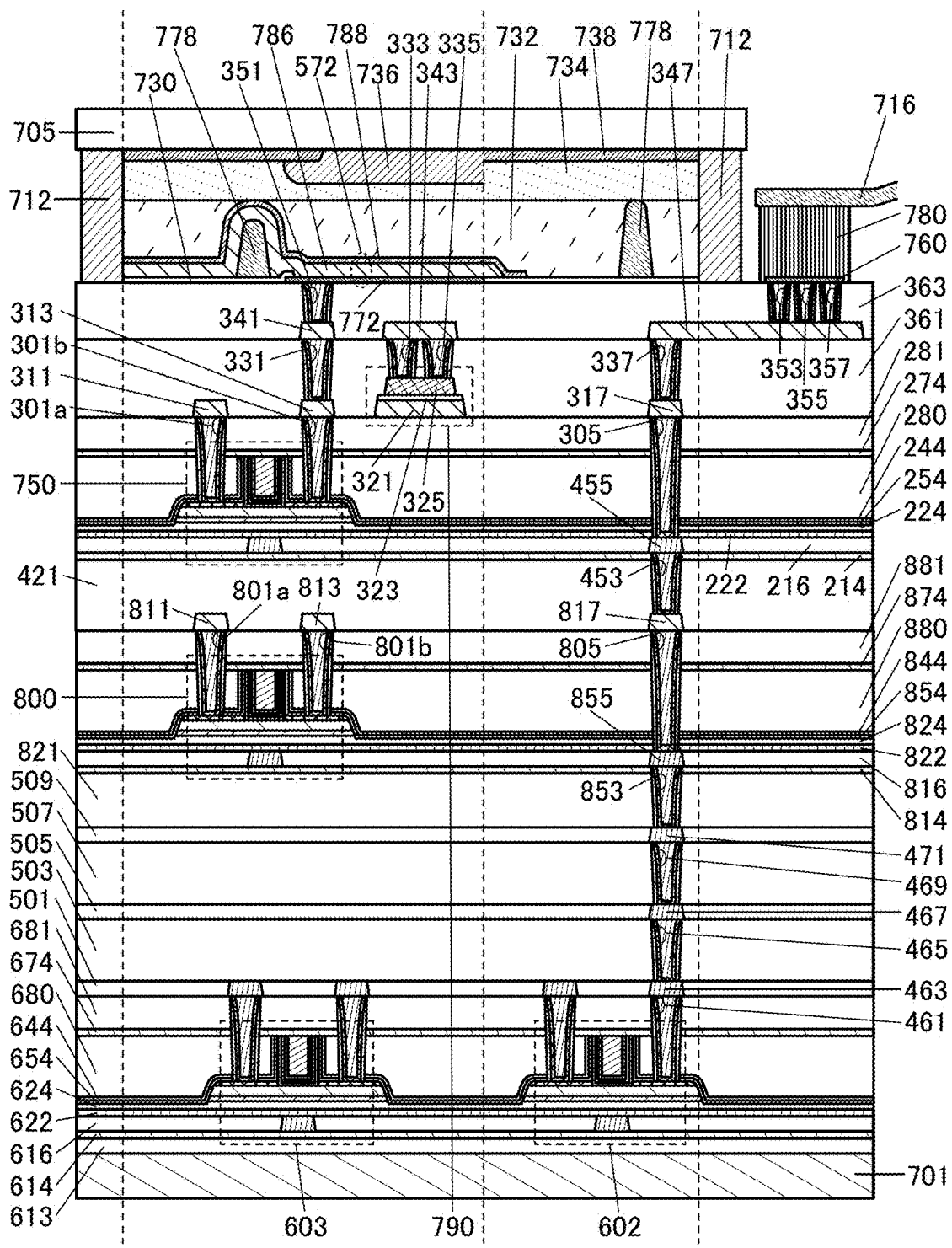
FIG. 25 is a cross-sectional view illustrating a structure example of the display device.

Although FIG. 24 illustrates a structure where the transistor 441 and the transistor 601 are provided so that their channel formation regions are formed inside the substrate 701 and the OS transistor is stacked over the transistor 441 and the transistor 601, one embodiment of the present invention is not limited thereto. FIG. 25 illustrates a modification example of FIG. 24. The difference from the display device 10A illustrated in FIG. 24 is that the transistor 800 and the transistor 750 or the transistor 750 are stacked over a transistor 602 and a transistor 603 that are OS transistors, in place of the transistor 441 and the transistor 601. That is, the display device 10A having the structure illustrated in FIG. 25 includes OS transistors that are stacked in three layers.

An OS transistor or the like may be provided between the layer where the transistor 602, the transistor 603, and the like are provided and the layer where the transistor 800 and the like are provided. Alternatively, an OS transistor or the like may be provided between the layer where the transistor 800 and the like are provided and the layer where the transistor 750 or the transistor 750 and the like are provided. Further alternatively, an OS transistor or the like may be provided above the layer where the transistor 750 and the like are provided.

That is, the transistor 602 and the transistor 603 can be provided in the first circuit layer 20*a* illustrated in FIG. 12A and the like. The transistor 800 can be provided in the second circuit layer 20*b*. For example, in the display device 10A illustrated in FIG. 12A, the transistor 800 can be the transistor provided in the memory circuit 93. The transistor 602 and the transistor 603 can be the transistors provided in a component (e.g., the logic circuit 81) other than the memory circuit 93.

The insulator 821 and the insulator 814 are provided over the conductor 471 and the insulator 509. A conductor 853 is embedded in the insulator 821 and the insulator 814. Here, the top surface of the conductor 853 and the top surface of the insulator 814 can be substantially level with each other.

As illustrated in FIG. 25, one of a source and a drain of the transistor 602 is electrically connected to the FPC 716 through the conductor 461, the conductor 463, the conductor 465, the conductor 467, the conductor 469, the conductor 471, the conductor 853, the conductor 855, the conductor 805, the conductor 817, the conductor 453, the conductor 455, the conductor 305, the conductor 317, the conductor 337, the conductor 347, the conductor 353, the conductor 355, the conductor 357, the connection electrode 760, and the anisotropic conductor 780.

When the display device 10A has the structure illustrated in FIG. 25, all the transistors in the display device 10A can be OS transistors while the bezel and size of the display device 10 are reduced. Consequently, different types of transistors do not need to be manufactured, whereby the manufacturing cost of the semiconductor device 10A can be reduced and thus the semiconductor device 10A can be inexpensive.

Structure Example of Subpixel

Figure 26A:
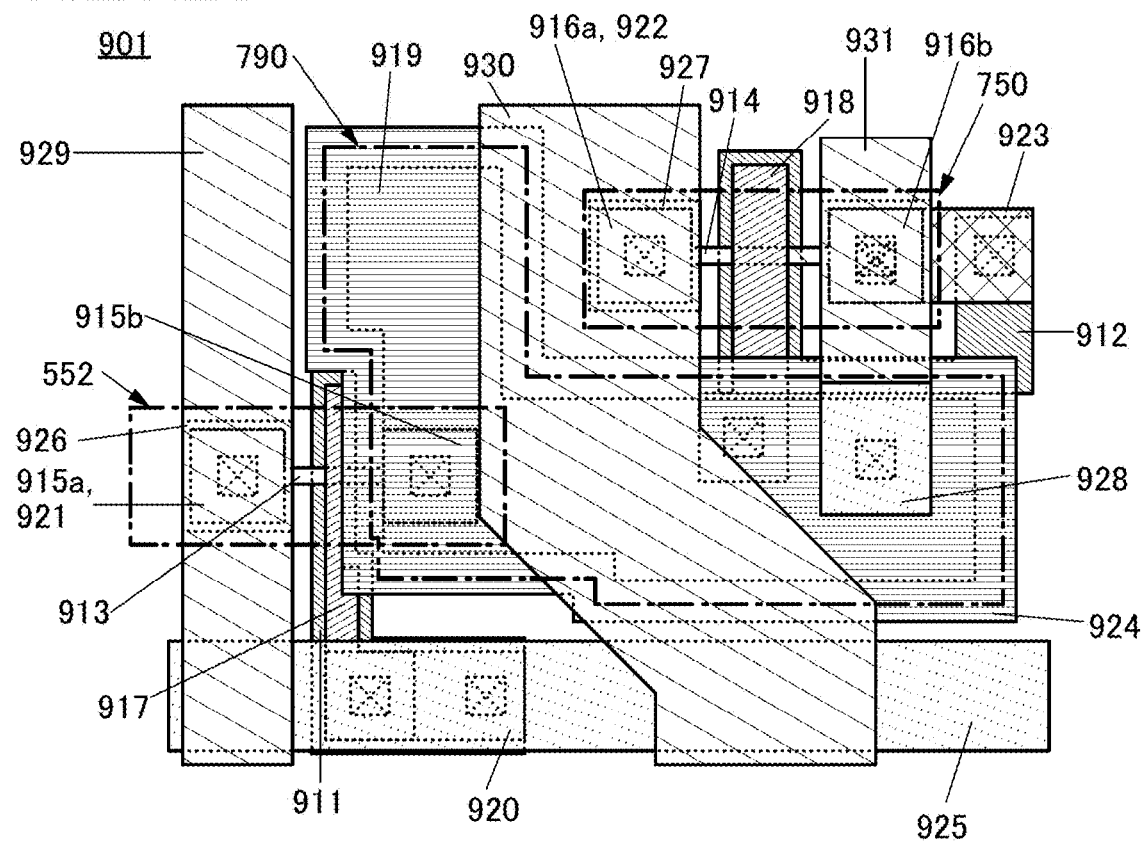
FIG. 26A and FIG. 26B are top views illustrating configuration examples of the pixel.
Figure 26B:
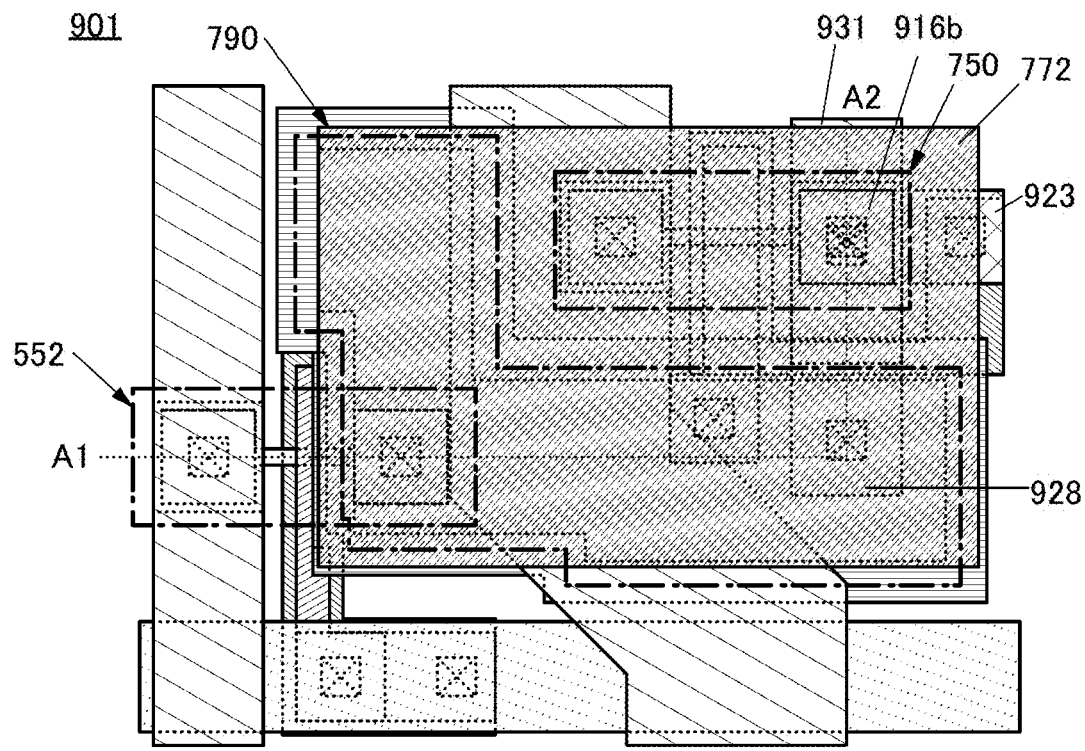

FIG. 26A and FIG. 26B are top views illustrating structure examples of a subpixel 901 that can be used in the display device of one embodiment of the present invention. The subpixel 901 can have the circuit configuration illustrated in FIG. 18 and the like. Here, the transistor 552 includes a back gate in addition to a gate, and the back gate is electrically connected to the wiring (not illustrated). The transistor 750 includes a back gate in addition to a gate, and the back gate is electrically connected to the other of the source and the drain of the transistor 750, the other electrode of the capacitor 790, and one electrode of the light-emitting element 572.

FIG. 26A illustrates conductors and semiconductors that constitute the transistors, the capacitor, the wirings, and the like included in the subpixel 901. FIG. 26B illustrates the conductor 772 functioning as one electrode of the light-emitting element 572, in addition to the components illustrated in FIG. 26A. Note that the conductor functioning as the other electrode of the light-emitting element 572, or the like is omitted in both FIG. 26A and FIG. 26B. Here, the one electrode of the light-emitting element 572 functions as a pixel electrode, and the other electrode of the light-emitting element 572 functions as a common electrode.

As illustrated in FIG. 26A and FIG. 26B, the subpixel 901 includes a conductor 911, a conductor 912, a semiconductor 913, a semiconductor 914, a conductor 915a, a conductor 915b, a conductor 916a, a conductor 916b, a conductor 917, a conductor 918, a conductor 919, a conductor 920, a conductor 921, a conductor 922, a conductor 923, a conductor 924 conductor 925, a conductor 926, a conductor 927, a conductor 928, a conductor 929, a conductor 930, a conductor 931, and the conductor 772.

The conductor 911 and the conductor 912 can be formed in the same step. The semiconductor 913 and the semiconductor 914 are formed in the same step and can be formed in a step after the formation of the conductor 911 and the conductor 912. The conductor 915a, the conductor 915b, the conductor 916a, and the conductor 916b are formed in the same step and can be formed in a step after the formation of the conductor 911 and the conductor 912. The conductor 917 and the conductor 918 are formed in the same step and can be formed in a step after the formation of the semiconductor 913, the semiconductor 914, the conductor 915a, the conductor 915b, the conductor 916a, and the conductor 916b. The conductor 919 to the conductor 923 are formed in the same step and can be formed in a step after the formation of the conductor 917 and the conductor 918. The conductor 924 can be formed in a step after the formation of the conductor 919 to the conductor 923. The conductor 925 to the conductor 928 are formed in the same step and can be formed in a step after the formation of the conductor 924. The conductor 929 to the conductor 931 are formed in the same step and can be formed in a step after the formation of the conductor 925 to the conductor 928. The conductor 772 can be formed in a step after the formation of the conductor 929 to the conductor 931.

In this specification and the like, it can be said that components formed in the same step are provided in the same layer. For example, since the conductor 911 and the conductor 912 can be formed in the same step, it can be said that the conductor 911 and the conductor 912 are provided in the same layer. In addition, it can be said that components formed in a later step are provided above components formed in a step prior to the later step. For example, since the conductor 929 to the conductor 931 can be formed in a step after the formation of the conductor 925 to the conductor 928, it can be said that the conductor 929 to the conductor 931 are provided above the conductor 925 to the conductor 928.

The conductor 911 functions as the back gate electrode of the transistor 552. The semiconductor 913 includes a channel formation region of the transistor 552. The conductor 915a functions as one of a source electrode and a drain electrode of the transistor 552. The conductor 915b functions as the other of the source electrode and the drain electrode of the transistor 552. The conductor 917 functions as the gate electrode of the transistor 552.

The conductor 912 functions as the back gate electrode of the transistor 750. The semiconductor 914 includes a channel formation region of the transistor 750. The conductor 916a functions as one of a source electrode and a drain electrode of the transistor 750. The conductor 916b functions as the other of the source electrode and the drain electrode of the transistor 750. The conductor 918 functions as the gate electrode of the transistor 750.

The conductor 919 has a function of one electrode of the capacitor 790. The conductor 924 has a function of the other electrode of the capacitor 790. The conductor 925 corresponds to the wiring 31 functioning as a scan line. The conductor 929 corresponds to the wiring 32 functioning as a data line. The conductor 930 corresponds to a wiring functioning as a power supply line. The conductor 772 has a function of the one electrode of the light-emitting element 572 as described above.

The conductor 911 is electrically connected to the conductor 920. The conductor 912 is electrically connected to the conductor 923. The conductor 915a is electrically connected to the conductor 921. The conductor 915b is electrically connected to the conductor 919. The conductor 916a is electrically connected to the conductor 922.

The conductor 916b is electrically connected to the conductor 923. In other words, the conductor 912 functioning as the back gate electrode of the transistor 750 and the conductor 916b functioning as the other of the source electrode and the drain electrode of the transistor 750 are electrically connected to each other through the conductor 923.

The conductor 917 is electrically connected to the conductor 920. In other words, the conductor 911 functioning as the back gate electrode of the transistor 552 and the conductor 917 functioning as the gate electrode of the transistor 552 are electrically connected to each other through the conductor 920.

The conductor 920 is electrically connected to the conductor 925. In other words, the conductor 917 functioning as the gate electrode of the transistor 552 and the conductor 925 functioning as a scan line are electrically connected to each other through the conductor 920.

The conductor 917 is electrically connected to the conductor 919. The conductor 921 is electrically connected to the conductor 926. The conductor 922 is electrically connected to the conductor 927. The conductor 923 is electrically connected to the conductor 928. The conductor 924 is electrically connected to the conductor 928.

The conductor 926 is electrically connected to the conductor 929. In other words, the conductor 915a functioning as one of the source electrode and the drain electrode of the transistor 552 and the conductor 929 functioning as a data line are electrically connected to each other through the conductor 921 and the conductor 926.

The conductor 927 is electrically connected to the conductor 930. In other words, the conductor 916a functioning as one of the source electrode and the drain electrode of the transistor 750 and the conductor 930 functioning as a power supply line are electrically connected to each other through the conductor 922 and the conductor 927.

The conductor 928 is electrically connected to the conductor 931. The conductor 931 is electrically connected to the conductor 772.

The semiconductor 913 and the semiconductor 914 can contain a metal oxide, for example. Thus, the transistor 552 and the transistor 750 can be OS transistors.

Figure 27:
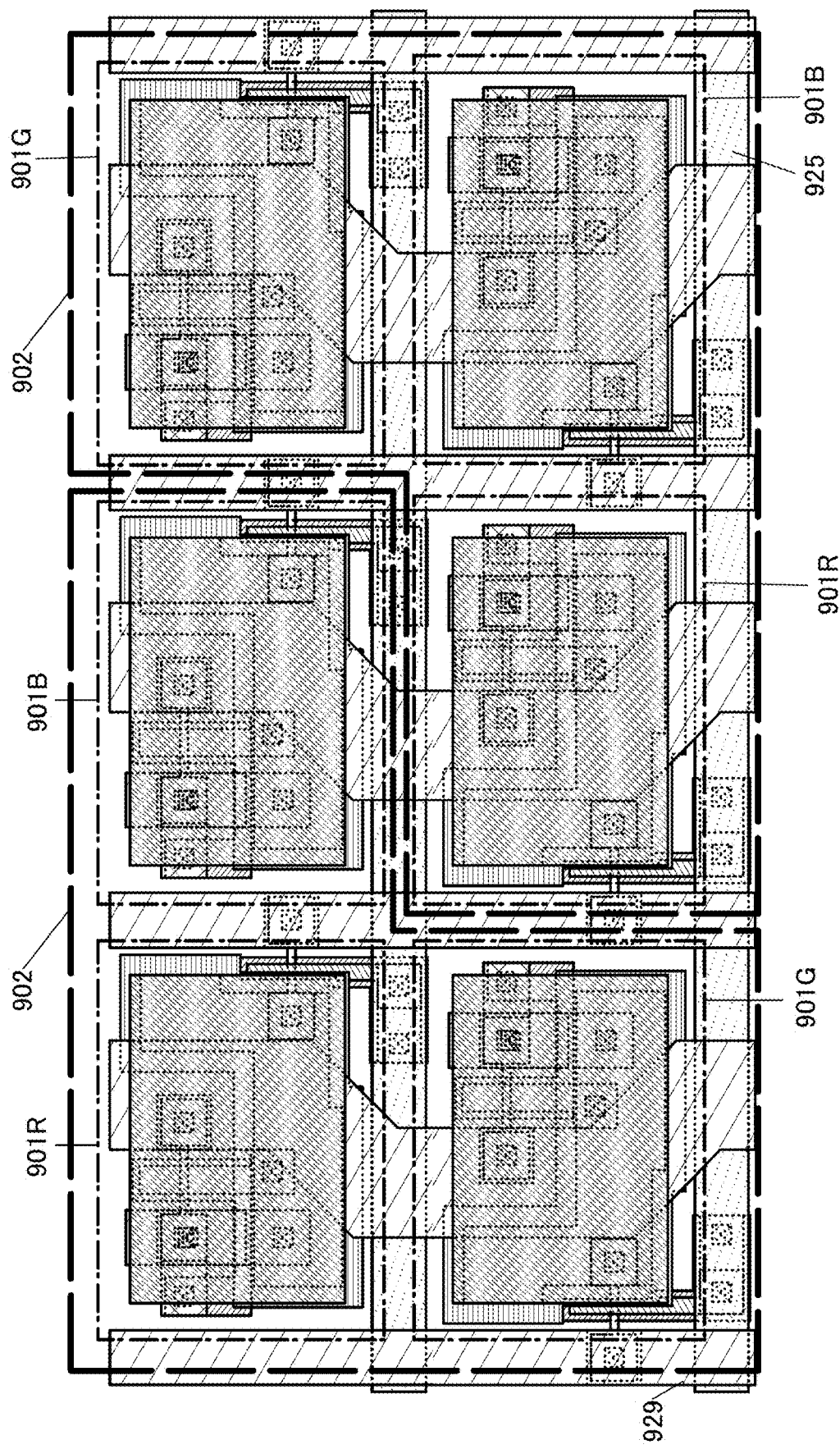
FIG. 27 is a top view illustrating a configuration example of the pixel.

FIG. 27 is a top view illustrating a structure example of a pixel 902 composed of subpixels 901 with the structure illustrated in FIG. 26B. In FIG. 27, a subpixel 901R indicates the subpixel 901 having a function of emitting red light, a subpixel 901G indicates the subpixel 901 having a function of emitting green light, and a subpixel 901B indicates the subpixel 901 having a function of emitting blue light. As illustrated in FIG. 27, the pixel 902 is composed of the subpixel 901R, the subpixel 901G, and the subpixel 901B. Specifically, one pixel 902 is composed of the subpixel 901R and the subpixel 901B that are placed on the upper side, and the subpixel 901G placed on the lower side. Another pixel 902 is composed of the subpixel 901G placed on the upper side, and the subpixel 901R and the subpixel 901B that are placed on the lower side.

In the structure illustrated in FIG. 27, the subpixel 901R, the subpixel 901G, and the subpixel 901B placed on the upper side are laterally inverted with respect to the subpixel 901R, the subpixel 901G, and the subpixel 901B placed on the lower side. With this structure, the subpixels 901 of the same color can be alternately arranged in the direction where the conductor 925 functioning as a scan line extends. Thus, the subpixels 901 having a function of emitting light of the same color can be electrically connected to one data line. In other words, two or more kinds of subpixels 901 selected from the subpixel 901R, the subpixel 901G, and the subpixel 901B can be prevented from being electrically connected to one data line.

Figure 28:
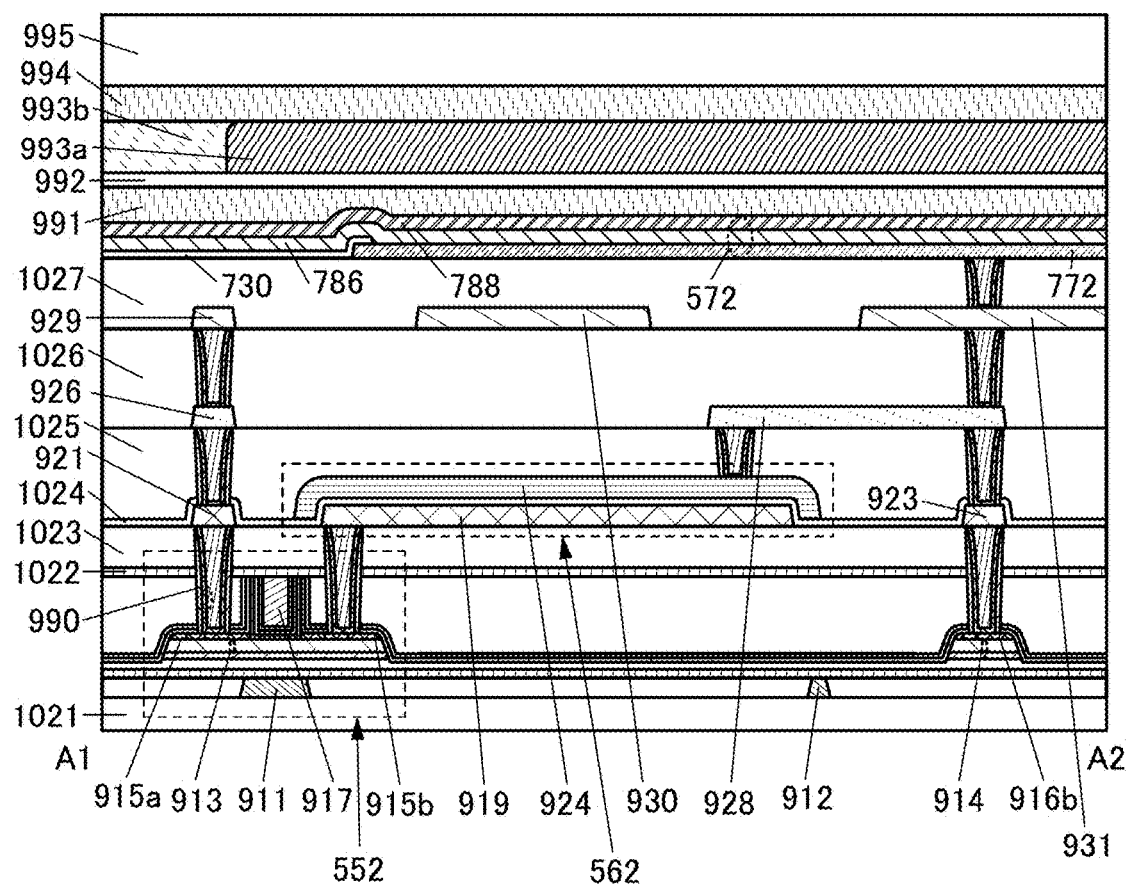
FIG. 28 is a cross-sectional view illustrating a structure example of the pixel.

FIG. 28 is a cross-sectional view of a portion indicated by the dashed-dotted line A1-A2 in FIG. 26B. The transistor 552 is provided over an insulator 1021. An insulator 1022 is provided over the transistor 552, and an insulator 1023 is provided over the insulator 1022. In addition, a capacitor 562 is provided over the insulator 1023. Note that a substrate is provided below the insulator 1021. The components in the first layer 20 illustrated in FIG. 1A and the like (e.g., the first circuit 21) can be provided between the substrate and the insulator 1021.

As illustrated in FIG. 28, the conductors provided in different layers are electrically connected to each other through the conductor 990 functioning as a plug. For example, the conductor 915a and the conductor 921 provided above the conductor 915a are electrically connected to each other through the conductor 990. The conductor 990 can have a structure similar to those of the conductor 853, the conductor 805, the conductor 453, the conductor 305, the conductor 337, the conductor 353, the conductor 355, the conductor 357, the conductor 301a, the conductor 301b, the conductor 331, the conductor 351, the conductor 333, and the conductor 335 illustrated in FIG. 19 and the like.

An insulator 1024 is provided over the conductor 919 to the conductor 923 and the insulator 1023. The conductor 924 is provided over the insulator 1024. The conductor 919, the insulator 1024, and the conductor 924 form the capacitor 790.

An insulator 1025 is provided over the conductor 924 and the insulator 1024. An insulator 1026 is provided over the conductor 925 to the conductor 928 and the insulator 1025. An insulator 1027 is provided over the conductor 929 to the conductor 931 and the insulator 1026.

The conductor 772 and the insulator 730 are provided over the insulator 1027. Here, the insulator 730 can cover part of the conductor 772. The conductor 772, the EL layer 786, and the conductor 788 form the light-emitting element 572.

A bonding layer 991 is provided over the conductor 788, and an insulator 992 is provided over the bonding layer 991. The insulator 992 over the bonding layer 991 can be formed in the following manner. First, the insulator 992 is formed over a substrate different from the substrate where the light-emitting element 572 and the like are formed. Next, the conductor 788 and the insulator 992 are bonded to each other with the bonding layer 991. After that, the substrate where the insulator 992 is formed is separated. Through the above steps, the insulator 992 can be formed over the conductor 788.

A coloring layer is provided over the insulator 992. FIG. 28 illustrates a coloring layer 993a and a coloring layer 993b as the coloring layer. A substrate 995 is attached onto the coloring layer 993a and the coloring layer 993b with a bonding layer 994.

The coloring layer 993b has a function of transmitting light of a color that is different from the color of light that the coloring layer 993a transmits. For example, when the pixel 902 includes the subpixel 901R with a function of emitting red light, the subpixel 901G with a function of emitting green light, and the subpixel 901B with a function of transmitting blue light and the coloring layer 993a has a function of transmitting red light, the coloring layer 993b has a function of transmitting green light or blue light.

Forming the coloring layer 993a and the coloring layer 993b over the insulator 992 can facilitate alignment between the coloring layer 993a and the coloring layer 993b and the light-emitting element 572. Thus, the resolution of the display device of one embodiment of the present invention can be increased.

<Structure example of light-emitting element 572>

FIG. 29A to FIG. 29E illustrate structure examples of the light-emitting element 572.

Figure 29A:
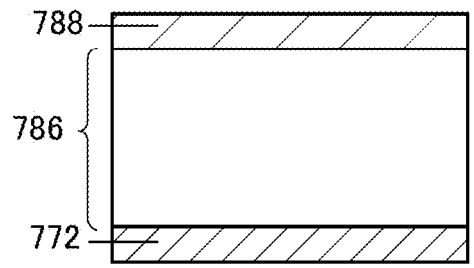
FIG. 29A, FIG. 29B, FIG. 29C, FIG. 29D, and FIG. 29E each illustrate a structure example of a light-emitting element.

FIG. 29A illustrates the structure in which the EL layer 786 is positioned between the conductor 772 and the conductor 788 (single structure). As described above, the EL layer 786 contains a light-emitting material, for example, a light-emitting material of an organic compound.

Figure 29B:
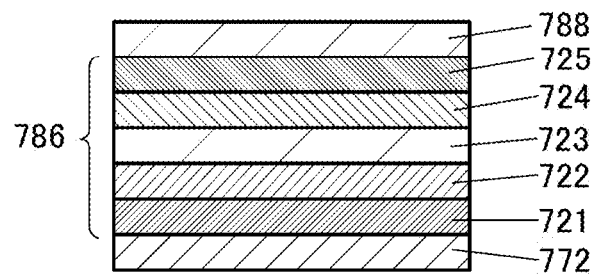

FIG. 29B illustrates a stacked-layer structure of the EL layer 786. In the light-emitting element 572 with the structure illustrated in FIG. 29B, the conductor 772 has a function of an anode and the conductor 788 has a function of a cathode.

The EL layer 786 has a structure in which a hole-injection layer 721, a hole-transport layer 722, a light-emitting layer 723, an electron-transport layer 724, and an electron-injection layer 725 are stacked in this order over the conductor 772. Note that the order of the stacked layers is reversed when the conductor 772 has a function of a cathode and the conductor 788 has a function of an anode.

The light-emitting layer 723 contains a light-emitting material and a plurality of materials in appropriate combination, so that fluorescence or phosphorescence of a desired emission color can be obtained. The light-emitting layer 723 may have a stacked-layer structure having different emission colors. In that case, light-emitting substances and other substances can be different between the stacked light-emitting layers.

For example, when the light-emitting element 572 has a micro optical resonator (microcavity) structure with the conductor 772 and the conductor 788 illustrated in FIG. 29B serving as a reflective electrode and a transflective electrode, respectively, light emitted from the light-emitting layer 723 included in the EL layer 786 can be resonated between the electrodes and thus the light emitted through the conductor 788 can be intensified.

Note that when the conductor 772 of the light-emitting element 572 is a reflective electrode having a stacked-layer structure of a reflective conductive material and a light-transmitting conductive material (transparent conductive film), optical adjustment can be performed by controlling the thickness of the transparent conductive film. Specifically, when the wavelength of light from the light-emitting layer 723 is X, the interelectrode distance between the conductor 772 and the conductor 788 is preferably adjusted to around mX/2 (m is a natural number).

To amplify desired light (wavelength: X) obtained from the light-emitting layer 723, the optical path length from the conductor 772 to a region where desired light is obtained in the light-emitting layer (light-emitting region) and the optical path length from the conductor 788 to the region where desired light is obtained in the light-emitting layer 723 (light-emitting region) are preferably adjusted to around (2m'+1) λ/4 (m' is a natural number). Here, the light-emitting region means a region where holes and electrons are recombined in the light-emitting layer 723.

By such optical adjustment, the spectrum of specific monochromatic light emitted from the light-emitting layer 723 can be narrowed and light emission with high color purity can be obtained.

In the above case, the optical path length between the conductor 772 and the conductor 788 can be, to be exact, the total thickness between a reflective region in the conductor 772 and a reflective region in the conductor 788. However, it is difficult to precisely determine the reflection region in the conductor 772 and the conductor 788; hence, it is assumed that the above effect is sufficiently obtained with given positions in the conductor 772 and the conductor 788 being supposed to be reflective regions. Furthermore, the optical path length between the conductor 772 and the light-emitting layer where desired light is obtained can be, to be exact, the optical path length between the reflective region in the conductor 772 and the light-emitting region where desired light is obtained in the light-emitting layer. However, it is difficult to precisely determine the reflective region in the conductor 772 and the light-emitting region where desired light is obtained in the light-emitting layer; thus, it is assumed that the above effect can be sufficiently obtained with a given position in conductor 772 being supposed to be the reflective region and a given position in the light-emitting layer where desired light is obtained being supposed to be the light-emitting region.

The light-emitting element 572 illustrated in FIG. 29B has a microcavity structure, so that light (monochromatic light) with different wavelengths can be extracted even when the same EL layer is used. Thus, separate formation for obtaining different emission colors (e.g., RGB) is not necessary. Therefore, high resolution can be easily achieved. In addition, a combination with coloring layers is also possible. Furthermore, the emission intensity of light with a specific wavelength in the front direction can be increased, whereby power consumption can be reduced.

Note that the light-emitting element 572 illustrated in FIG. 29B does not necessarily have a microcavity structure. In that case, light of predetermined colors (e.g., RGB) can be extracted when the light-emitting layer 723 has a structure for emitting white light and coloring layers are provided. When the EL layers 786 are formed separately for obtaining different emission colors, light of predetermined colors can be extracted without providing coloring layers.

At least one of the conductor 772 and the conductor 788 can be a light-transmitting electrode (e.g., a transparent electrode or a transflective electrode). In the case where the light-transmitting electrode is a transparent electrode, the transparent electrode has a visible light transmittance higher than or equal to 40%. In the case where the electrode having a light-transmitting property is a transflective electrode, the visible light reflectance of the transflective electrode is higher than or equal to 20% and lower than or equal to 80%, preferably higher than or equal to 40% and lower than or equal to 70%. These electrodes preferably have a resistivity lower than or equal to $1\times10^{-2}$ Ωcm.

When the conductor 772 or the conductor 788 is an electrode having reflectivity (reflective electrode), the visible light reflectance of the reflective electrode is higher than or equal to 40% and lower than or equal to 100%, preferably higher than or equal to 70% and lower than or equal to 100%. This electrode preferably has a resistivity lower than or equal to $1\times10^{-2}$ Ωcm.

Figure 29C:
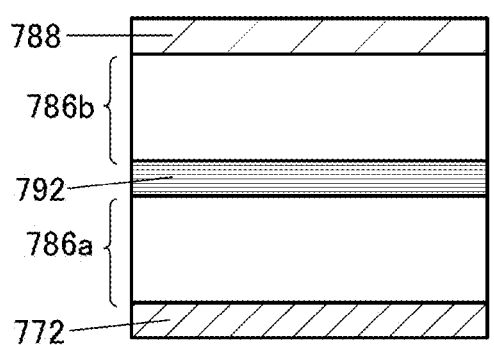

The light-emitting element 572 may have a structure illustrated in FIG. 29C. FIG. 29C illustrates the light-emitting element 572 having a stacked-layer structure (tandem structure) in which two EL layers (an EL layer 786a and an EL layer 786b) are provided between the conductor 772 and the conductor 788, and a charge generation layer 792 is provided between the EL layer 786a and the EL layer 786b. When the light-emitting element 572 has the tandem structure, the current efficiency and external quantum efficiency of the light-emitting element 572 can be increased. Thus, the display device 10 can display high-luminance images. In addition, the power consumption of the display device 10 can be reduced. Here, the EL layer 786a and the EL layer 786b can have a structure similar to that of the EL layer 786 illustrated in FIG. 29B.

The charge generation layer 792 has a function of injecting electrons into one of the EL layer 786a and the EL layer 786b and injecting holes to the other of the EL layer 786a and the EL layer 786b when a voltage is supplied between the conductor 772 and the conductor 788. Accordingly, when a voltage is supplied such that the potential of the conductor 772 becomes higher than the potential of the conductor 788, electrons are injected into the EL layer 786a from the charge generation layer 792 and holes are injected into the EL layer 786b from the charge generation layer 792.

Note that in terms of light extraction efficiency, the charge generation layer 792 preferably transmits visible light (specifically, the visible light transmittance of the charge generation layer 792 is preferably 40% or higher). The conductivity of the charge generation layer 792 may be lower than that of the conductor 772 or the conductor 788.

Figure 29D:
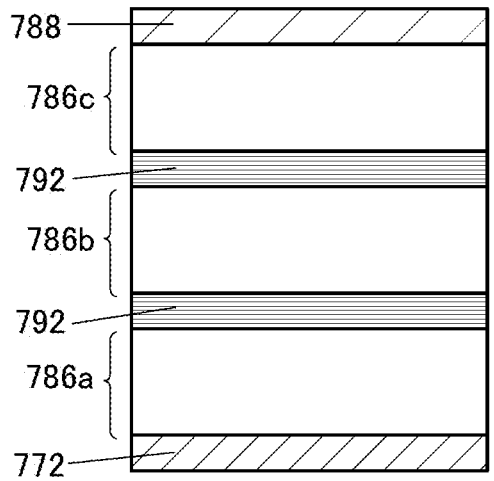

The light-emitting element 572 may have a structure illustrated in FIG. 29D. FIG. 29D illustrates the light-emitting element 572 having a tandem structure in which three EL layers (the EL layer 786a, the EL layer 786b, and an EL layer 786c) are provided between the conductor 772 and the conductor 788, and the charge generation layer 792 is provided between the EL layer 786a and the EL layer 786b and between the EL layer 786b and the EL layer 786c. Here, the EL layer 786a, the EL layer 786b, and the EL layer 786c can have a structure similar to that of the EL layer 786 illustrated in FIG. 29B. When the light-emitting element 572 has the structure illustrated in FIG. 29D, the current efficiency and external quantum efficiency of the light-emitting element 572 can be further increased. As a result, the display device 10 can display higher-luminance images.

Moreover, the power consumption of the display device 10 can be further reduced.

Figure 29E:
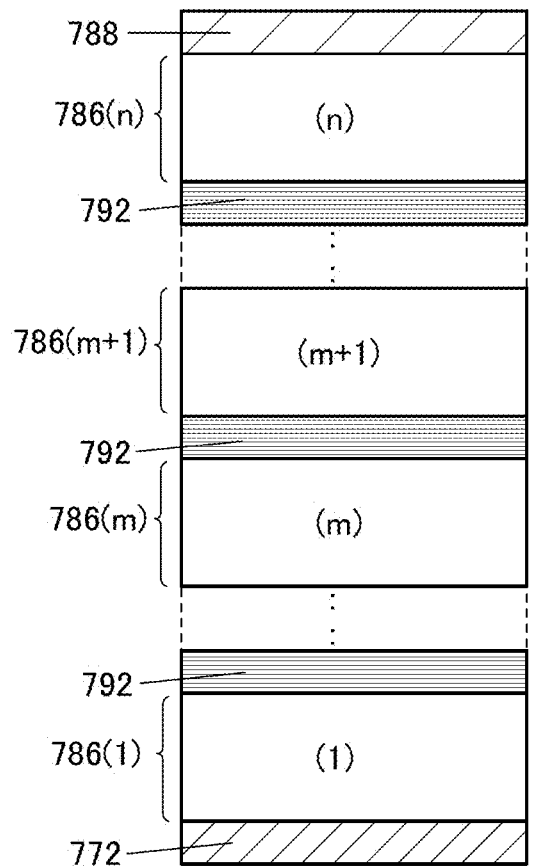

The light-emitting element 572 may have a structure illustrated in FIG. 29E. FIG. 29E illustrates the light-emitting element 572 having a tandem structure in which n EL layers (an EL layer 786(1) to an EL layer 786(n)) are provided between the conductor 772 and the conductor 788, and the charge generation layer 792 is provided between the EL layers 786. Here, the EL layer 786(1) to the EL layer 786(n) can have a structure similar to that of the EL layer 786 illustrated in FIG. 29B. Note that FIG. 29E illustrates the EL layer 786(1), the EL layer 786(m), and the EL layer 786(n) among the EL layers 786. Here, m is an integer greater than or equal to 2 and less than n, and n is an integer greater than or equal to m. As n becomes larger, the current efficiency and external quantum efficiency of the light-emitting element 572 can be increased. Thus, the display device 10 can display high-luminance images. In addition, the power consumption of the display device 10 can be reduced.

<Materials for Light-Emitting Element 572>

Next, materials that can be used for the light-emitting element 572 will be described.

[Conductor 772 and Conductor 788]

For the conductor 772 and the conductor 788, any of the following materials can be used in an appropriate combination as long as the functions of the anode and the cathode can be fulfilled.

For example, a metal, an alloy, an electrically conductive compound, a mixture of these, and the like can be appropriately used. Specific examples include In—Sn oxide (also referred to as ITO), In—Si—Sn oxide (also referred to as ITSO), In—Zn oxide, and In—W—Zn oxide. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 of the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

[Hole-Injection Layer 721 and Hole-Transport Layer 722]

The hole-injection layer 721 injects holes to the EL layer 786 from the conductor 772, which is an anode, or the charge generation layer 792 and contains a material with a high hole-injection property. Here, the EL layer 786 includes the EL layer 786a, the EL layer 786b, the EL layer 786c, and the EL layer 786(1) to the EL layer 786(n).

Examples of the material having a high hole-injection property include transition metal oxides such as molybdenum oxide, vanadium oxide, ruthenium oxide, tungsten oxide, and manganese oxide. Alternatively, it is possible to use any of the following materials: phthalocyanine-based compounds such as phthalocyanine (abbreviation: $H_2Pc$ and copper phthalocyanine (abbreviation: CuPC); aromatic amine compounds such as 4,4'-bis[N-(4-diphenylaminophenyl)-N-phenylamino]biphenyl (abbreviation: DPAB) and N,Y-bis {4-[bis(3-methylphenyl)amino]phenyl}—N,N'-diphenyl-(1,1'-biphenyl)-4,4'-diamine (abbreviation: DNTPD); high molecular compounds such as poly(3,4-ethylenedioxythiophene)/poly(styrenesulfonic acid) (abbreviation: PEDOT/PSS); and the like.

Alternatively, as the material having a high hole-injection property, a composite material containing a hole-transport material and an acceptor material (electron-accepting material) can be used. In that case, the acceptor material extracts electrons from the hole-transport material, so that holes are generated in the hole-injection layer 721 and the holes are injected into the light-emitting layer 723 through the hole-transport layer 722. Note that the hole-injection layer 721 may be formed to have a single-layer structure using a composite material containing a hole-transport material and an acceptor material (electron-accepting material), or a stacked-layer structure in which a layer containing a hole-transport material and another layer containing an acceptor material (electron-accepting material) are stacked.

The hole-transport layer 722 transports the holes, which are injected from the conductor 772 by the hole-injection layer 721, to the light-emitting layer 723. Note that the hole-transport layer 722 contains a hole-transport material. It is preferable that the HOMO level of the hole-transport material used for the hole-transport layer 722 be the same as or close to the HOMO level of the hole-injection layer 721, in particular.

Examples of the acceptor material used for the hole-injection layer 721 include oxides of a metal belonging to any of Group 4 to Group 8 of the periodic table. Specific examples include molybdenum oxide, vanadium oxide, niobium oxide, tantalum oxide, chromium oxide, tungsten oxide, manganese oxide, and rhenium oxide. Among these, molybdenum oxide is particularly preferable since it is stable in the air, has a low hygroscopic property, and is easy to handle. Alternatively, organic acceptors such as a quinodimethane derivative, a chloranil derivative, and a hexaazatriphenylene derivative can be used. Specifically, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), and the like can be used.

The hole-transport materials used for the hole-injection layer 721 and the hole-transport layer 722 are preferably substances with a hole mobility of greater than or equal to $10^{-6}$ cm$^2$/Vs. Note that other substances can also be used as long as they have a hole-transport property higher than an electron-transport property.

Preferred hole-transport materials are π-electron rich heteroaromatic compounds (e.g., carbazole derivatives and indole derivatives) and aromatic amine compounds; specific examples include compounds having an aromatic amine skeleton, such as 4,4'-bis[N-(1-naphthyl)-N-phenylamino]biphenyl (abbreviation: NPB or a-NPD), N,N-bis(3-methylphenyl)-N,AP-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 3-[4-(9-phenanthryl)-phenyl]-9-phenyl-9H-carbazole (abbreviation: PCPPn), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N4-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBilBP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dim ethyl-N-phenyl-N-[4-(9-phenyl-9H-carbazol-3-yl)phenyl]fluoren-2-amine (abbreviation: PCBAF), N-phenyl-N4-[4-(9-phenyl-9H-carbazol-3-yl)phenyl]spiro-9,9'-bifluoren-2-amine (abbreviation: PCBASF), 4,4',4"-tris(carbazol-9-yl)triphenylamine (abbreviation: TCTA), 4,4',4"-tris(N,N-diphenylamino)triphenylamine (abbreviation: TDATA), and 4,4',4"-tris[N-(3-methylphenyl)-N-phenylamino]triphenylamine (abbreviation: MTDATA); compounds having a carbazole skeleton, such as 1,3-bis(N-carbazolyl)benzene (abbreviation: mCP), 4,4'-di (N-carbazolyl)biphenyl (abbreviation: CBP), 3,6-bis(3,5-diphenylphenyl)-9-phenylcarb azol e (abbreviation: CzTP), 3,3'-bis(9-phenyl-9H-carbazole) (abbreviation: PCCP), 3-[4N-(9-phenylcarbazol-3-yl)-N-phenylamino]-9-phenyl-carbazole (abbreviation: PCzPCA1), 3,6-bis[N-(9-phenyl-carbazol-3-yl)-N-phenylamino]-9-phenylcarbazole (abbreviation: PCzPCA2), 3-[4N-(1-naphthyl)-N-(9-phenylca-rbazol-3-yl)amino]-9-phenylcarbazole (abbreviation: PCzPCN1), 1,3,5-tris[4-(N-carbazolyl)phenyl]benzene (abbreviation: TCPB), and 4-[4-(10-phenyl-9-anthracenyl)phe-nyl]-9H-carbazole (abbreviation: CzPA); compounds having a thiophene skeleton, such as 4,4',4''-(benzene-1,3,5-triyl)tri (dibenzothiophene) (abbreviation: DBT3P-II), 2,8-di phe-nyl-4-[4-(9-phenyl-9H-fluoren-9-yl)phenyl]dibenzothi-ophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4''-(benzene-1,3,5-triyl)tri(dibenzo-furan) (abbreviation: DBF3P-II) and 4-{3-[3-(9-phenyl-9H-fluoren-9-yl)phenyl]phenyl}dibenzofuran (abbreviation: mmDBFFLBi-II).

High molecular compounds such as poly(N-vinylcarba-zole) (abbreviation: PVK), poly(4-vinyltriphenylamine) (abbreviation: PVTPA), poly[N-(4-{N-[4-(4-diphenylamino) phenyl]phenyl-N-phenylamino}phenyl)methacrylamide] (abbreviation: PTPDMA), and poly[N,N-bis(4-butylphe-nyl)-N,N-bis(phenyl)benzidine] (abbreviation: Poly-TPD) can also be used.

Note that the hole-transport material is not limited to the above examples and one of or a combination of various known materials can be used as the hole-transport material for the hole-injection layer 721 and the hole-transport layer 722. Note that the hole-transport layer 722 may be formed of a plurality of layers. In other words, a first hole-transport layer and a second hole-transport layer may be stacked, for example.

[Light-Emitting Layer 723]

The light-emitting layer 723 is a layer containing a light-emitting substance. As the light-emitting substance, a substance whose emission color is blue, violet, bluish violet, green, yellowish green, yellow, orange, red, or the like is appropriately used. Here, when the light-emitting element 572 includes a plurality of EL layers as illustrated in FIG. 29C, FIG. 29D, and FIG. 29E, the use of different light-emitting substances for the light-emitting layers 723 in the EL layers enables different emission colors to be exhibited (e.g., it enables white light emission obtained by combining complementary emission colors). For example, when the light-emitting element 572 has the structure illustrated in FIG. 29C, the use of different light-emitting substances for the light-emitting layer 723 in the EL layer 786a and the light-emitting layer 723 in the EL layer 786b can achieve different emission colors of the EL layer 786a and the EL layer 786b. Note that a stacked-layer structure in which one light-emitting layer contains different light-emitting substances may be employed.

The light-emitting layer 723 may contain one or more kinds of organic compounds (a host material and an assist material) in addition to a light-emitting substance (guest material). As the one or more kinds of organic compounds, one or both of the hole-transport material and the electron-transport material can be used.

There is no particular limitation on the light-emitting substance that can be used for the light-emitting layer 723, and it is possible to use a light-emitting substance that converts singlet excitation energy into light in the visible light range or a light-emitting substance that converts triplet excitation energy into light in the visible light range. Examples of the light-emitting substance are given below.

As an example of the light-emitting substance that converts singlet excitation energy into light, a substance that exhibits fluorescence (fluorescent material) can be given; examples thereof include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. In particular, a pyrene derivative is preferable because it has a high emission quantum yield. Specific examples of the pyrene derivative include N,N'-bis(3-meth-ylphenyl)-N,N-bis[3-(9-phenyl-9H-fluoren-9-yl)phenyl] pyrene-1,6-diamine (abbreviation: 1,6mMemFLPAPrn), N,N-diphenyl-N,N-bis[4-(9-phenyl-9H-fluoren-9-yl)phe-nyl]pyrene-1,6-diamine (abbreviation: 1,6FLPAPrn), N,N-bis(dibenzofuran-2-yl)-N,N-diphenylpyrene-1,6-diamine (abbreviation: 1,6FrAPrn), N,N-bis(dibenzothiophen-2-yl)-N,N-diphenylpyrene-1,6-diamine (abbreviation: 1,6ThA-Prn), N,N-(pyrene-1,6-diyl)bis[(N-phenylbenzo[b]naphtho [1,2-d]furan)-6-amine] (abbreviation: 1,6BnfAPrn), N,N-(pyrene-1,6-diyl)bis[(N-phenylb enzo[b]naphtho[1,2-d] furan)-8-amine] (abbreviation: 1,6BnfAPrn-02), and N,N-(pyrene-1,6-diyl)bis[(6,N-diphenylbenzo[b]naphtho[1,2-d] furan)-8-amine] (abbreviation: 1,6BnfAPrn-03). In addition, pyrene derivatives are compounds effective for meeting the chromaticity for blue in one embodiment of the present invention.

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyri-dine (abbreviation: PAPP2BPy), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carb azol-9-yl)-4'-(9,10-diphenyl-2-anthryl)triphenyl amine (abbreviation: 2YGAPPA), N, 9-di phenyl-N-[4-(10-phenyl-9-anthryl)p henyl]-9H-carb azol-3-amine (abbreviation: PCAPA), 4-(10-phenyl-9-anthryl)-4'-(9-phenyl-9H-carba-zol-3-yl)triphenylamine (abbreviation: PCBAPA), 4-[4-(10-phenyl-9-anthryl)phenyl]-4'-(9-phenyl-9H-carbazol-3-yl) triphenylamine (abbreviation: PCBAPBA), perylene, 2,5,8, 11-tetra(tert-butyl)perylene (abbreviation: TBP), N,N''-(2-tert-butyl anthracene-9,10-diyldi-4,1-phenylene)bis[N,N, 'N'-triphenyl-1,4-phenyl enediamine] (abbreviation: DPABPA), N,9-diphenyl-N-[4-(9,10-diphenyl-2-anthryl) phenyl]-9H-carbazol-3-amine (abbreviation: 2PCAPPA), N-[4-(9,10-diphenyl-2-anthryl)phenyl]-N,N',N'-triphenyl-1, 4-phenylenediamine (abbreviation: 2DPAPPA), and the like.

As examples of the light-emitting substance that converts triplet excitation energy into light emission, a substance that emits phosphorescence (phosphorescent material) and a thermally activated delayed fluorescence (TADF) material that exhibits thermally activated delayed fluorescence can be given.

Examples of a phosphorescent material include an organometallic complex, a metal complex (platinum complex), and a rare earth metal complex. These substances exhibit different emission colors (emission peaks), and thus are appropriately selected as needed.

As examples of a phosphorescent material that emits blue or green light and whose emission spectrum has a peak wavelength at greater than or equal to 450 nm and less than or equal to 570 nm, the following substances can be given.

Examples include organometallic complexes having a 4H-triazole skeleton, such as tris {2-[5-(2-methylphenyl)-4-(2,6-dimethylphenyl)-4H-1,2,4-triazol-3-yl-KN2]phenyl- κC}Iiridium(III) (abbreviation: [Ir(Mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)3]); organometallic complexes having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic complexes in which a phenylpyridine derivative having an electron-withdrawing group is a ligand, such as bis[2-(4',6']-difluorophenyl)pyridinato-N,Cliridium(III) tetrakis(1-pyrazolyl)borate (abbreviation: FIr6), bis[2-(4',6']-difluorophenyl)pyri dinato-N, dium (III) picolinate (abbreviation: Flrpic), bis[2-(3,5]-bistrifluoromethylphenyl)pyridinato-N,C$^{2'}$Iiridium(III) picolinate (abbreviation: [Ir(CF3ppy)2(pic)]), and bis[2-(4',6']-difluorophenyl)pyridinato-N,C$^2$Iiridium(III) acetylacetonate (abbreviation: FIr(acac)).

As examples of a phosphorescent material that emits green or yellow light and whose emission spectrum has a peak wavelength at greater than or equal to 495 nm and less than or equal to 590 nm, the following substances can be given.

Examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)3]), (acetyl acetonato)bis(6-methyl-4-phenyl pyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetyl acetonato)bis[6-(2-norbornyl)-4-phenylpyrimidinato]iridium(III) (abbreviation: [Ir(nbppm)$_2$(acac)]), (acetyl acetonato)bis[5-methyl-6-(2-methylphenyl)-4-phenylpyrimidinato]iridium(III) (abbreviation: [Ir(mpmppm)$_2$(acac)]), (acetyl acetonato)bis{4,6-dimethyl-2-[6-(2,6-dimethylphenyl)-4-pyrimi dinyl-κN3]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetyl acetonato)bis(5-isopropyl-3-methyl-2-phenyl pyrazinato)iridium(III) (abbreviation: [Ir(mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetyl acetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetyl acetonate (abbreviation: [Ir(pq)$_2$(acac)]); organometallic complexes such as bis(2,4-diphenyl-1,3-oxazolato-N, C$^{2'}$)iridium(III) acetylacetonate (abbreviation: [Ir(dpo)$_2$(acac)]), bis{2[4'-(perfluorophenyl)phenyl]pyridinato-N,C}iridium(III) acetylacetonate (abbreviation: [Ir(p-PF-ph)$_2$(acac)]), and bis(2-phenylbenzothiazolato-N,C$^{2'}$)iridium(III) acetylacetonate (abbreviation: [Ir(bt)$_2$(acac)]); and rare earth metal complexes such as tris(acetylacetonato) (monophenanthroline)terbium(III) (abbreviation: [Tb (acac)$_3$(Phen)]).

Among the above, organometallic iridium complexes having a pyridine skeleton (specifically, a phenylpyridine skeleton) or a pyrimidine skeleton are compounds effective for meeting the chromaticity of green in one embodiment of the present invention.

As examples of a phosphorescent material that emits yellow or red light and whose emission spectrum has a peak wavelength at greater than or equal to 570 nm and less than or equal to 750 nm, the following substances can be given.

Examples include organometallic complexes having a pyrimidine skeleton, such as (dii sobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato] (dipivaloylmethanato)iridium(III) (abbreviation: [Ir(5mdppm)$_2$(dpm)]), and (dipivaloylmethanato)bis[4,6-di(naphthalen-1-yl)pyrimidinato]iridium(III) (abbreviation: [Ir(dlnpm)$_2$(dpm)]); organometallic complexes having a pyrazine skeleton, such as (acetyl acetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), bis {4,6-dimethyl-2-[3-(3,5-dimethylphenyl)-5-phenyl-2-pyrazinyl-κC]phenyl-κC}(2,6-dimethyl-3,5-heptanedionato-κ$^2$O,O') iridium(III) (abbreviation: [Ir(dmdppr-P)$_2$(dibm)]), bis {4,6-dimethyl-2-[5-(4-cyano-2,6-dimethylphenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: [Ir(dmdppr-dmCP)$_2$(dpm)]), (acetyl acetonato)bis[2-methyl-3-phenyl quino]alinato-N, dium(III) (abbreviation: [Ir(mpq)$_2$(acac)]), (acetyl acetonato)bis(2,3-diphenyl quinoxalinato-N, C$^{2'}$)iridium(III) (abbreviation: [Ir(dpq)$_2$(acac)]), and (acetyl acetonato)bis[2,3-bis(4-fluorophenyl)quinoxalinato]iridium(III) (abbreviation: [Ir(Fdpq)$_2$(acac)]); organometallic complexes having a pyridine skeleton, such as tris(1-phenylisoquinolinato-N,C$^{2'}$)iridium(III) (abbreviation: [Ir(piq)3]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-prop anedi onato)(m onophenanthroline)europium(III) (abbreviation: [Eu(DBM)$_3$(Phen)]) and tris[1-(2-thenoyl)-3,3,3-trifluoroacetonato] (monophenanthroline)europium(III) (abbreviation: [Eu(TTA)$_3$(Phen)]).

Among the above, organometallic iridium complexes having a pyrazine skeleton are compounds effective for meeting the chromaticity of red in one embodiment of the present invention. In particular, organometallic iridium complexes having a cyano group, such as [Ir(dmdppr-dmCP)$_2$(dpm)], are preferable because of their high stability.

As the blue-light-emitting substance, a substance whose photoluminescence peak wavelength is greater than or equal to 430 nm and less than or equal to 470 nm, preferably greater than or equal to 430 nm and less than or equal to 460 nm can be used. As the green-light-emitting substance, a substance whose photoluminescence peak wavelength is greater than or equal to 500 nm and less than or equal to 540 nm, preferably greater than or equal to 500 nm and less than or equal to 530 nm can be used. As the red-light-emitting substance, a substance whose photoluminescence peak wavelength is greater than or equal to 610 nm and less than or equal to 680 nm, preferably greater than or equal to 620 nm and less than or equal to 680 nm can be used. Note that the photoluminescence may be measured with either a solution or a thin film.

With the parallel use of such compounds and the microcavity effect, the above chromaticity can be met more easily. Here, a transflective electrode (metal thin film portion) that is needed for obtaining the microcavity effect has a thickness of preferably greater than or equal to 20 nm and less than or equal to 40 nm. The thickness is further preferably greater than 25 nm and less than or equal to 40 nm. However, the thickness greater than 40 nm possibly reduces the efficiency.

As the organic compounds (the host material and the assist material) used in the light-emitting layer 723, one or more kinds of substances having an energy gap larger than the energy gap of the light-emitting substance (the guest material) can be used. Note that the hole-transport materials listed above and the electron-transport materials given below can be used as the host material and the assist material, respectively.

In the case where the light-emitting substance is a fluorescent material, it is preferable to use, as the host material, an organic compound that has a high energy level in a singlet excited state and has a low energy level in a triplet excited state. For example, an anthracene derivative or a tetracene derivative is preferably used. Specific examples include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 5,12-diphenyltetracene, and 5,12-bis(biphenyl-2-yl)tetracene.

In the case where the light-emitting substance is a phosphorescent material, an organic compound having triplet excitation energy (energy difference between a ground state and a triplet excited state) higher than that of the light-emitting substance can be selected as the host material. In that case, it is possible to use a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, an aromatic amine, a carbazole derivative, or the like.

Specific examples include metal complexes such as tris(8-quinolinolato)aluminum(III) (abbreviation: Alq), tris(4-methyl-8-quinolinolato)aluminum(III) (abbreviation: Alm$q_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tent-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tent-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (abbreviation: BPhen), bathocuproine (abbreviation: BCP), 2,9-bis(naphthalen-2-yl)-4,7-diphenyl-1,10-phenanthroline (abbreviation: NBphen), and 9-[4-(5-phenyl-1,3,4-oxadiazol-2-yl)phenyl]-9H-carbazole (abbreviation: CO11); and aromatic amine compounds such as NPB, TPD, and BSPB.

In addition, condensed polycyclic aromatic compounds such as anthracene derivatives, phenanthrene derivatives, pyrene derivatives, chrysene derivatives, and dibenzo[g,p]chrysene derivatives can be used; specifically, it is possible to use, for example, 9,10-diphenylanthracene (abbreviation: DPAnth), N,N-di phenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N, 9-diphenyl-N-{4-[4-(10-phenyl-9-anthryl)phenyl]phenyl}-9H-carbazol-3-amine (abbreviation: PCAPBA), 9,10-diphenyl-2-[4N-phenyl-N-(9-phenyl-9H-carbazol-3-yl)amino]anthracene (abbreviation: 2PCAPA), 6,12-dimethoxy-5,11-diphenylchrysene, N,N,N',N', N",N", N"',N"'-octaphenyldib enzo[g,p]chry sene-2,7,10,15-tetraamine (abbreviation: DBC1), 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tent-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), or 1,3,5-tri(1-pyrenyl)benzene (abbreviation: TPB3).

When a plurality of organic compounds are used for the light-emitting layer 723, it is preferable to use compounds that form an exciplex in combination with a light-emitting substance. In that case, various organic compounds can be used in appropriate combination; to form an exciplex efficiently, it is particularly preferable to combine a compound that easily accepts holes (hole-transport material) and a compound that easily accepts electrons (electron-transport material). As the hole-transport material and the electron-transport material, specifically, any of the materials described in this embodiment can be used.

The TADF material is a material that can up-convert a triplet excited state into a singlet excited state (reverse intersystem crossing) using a little thermal energy and efficiently exhibits light emission (fluorescence) from the singlet excited state. Thermally activated delayed fluorescence is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Delayed fluorescence by the TADF material refers to light emission having a spectrum similar to that of normal fluorescence and an extremely long lifetime. The lifetime is $10^{-6}$ seconds or longer, preferably $10^{-3}$ seconds or longer.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2OEP$).

Alternatively, it is possible to use a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (PIC-TRZ), 2-{4-[3-(N-phenyl-9H-carbazol-3-yl)-9H-carb azol-9-yl]phenyl}-4,6-diphenyl-1,3,5-triazine (PCCzPTzn), 2-[4-(10H-phenoxazin-10-yl)phenyl]-4,6-diphenyl-1,3,5-triazine (PXZ-TRZ), 3-[4-(5-phenyl-5,10-dihydrophenazin-10-yl)phenyl]-4,5-di phenyl-1,2,4-triazole (PPZ-3TPT), 3-(9,9-dimethyl-9H-acridin-10-yl)-9H-xanthen-9-one (ACRXTN), bis[4-(9,9-dimethyl-9,10-dihydroacridine)phenyl]sulfone (DMAC-DPS), or 10-phenyl-10H,10'H-spiro[acridin-9,9'-anthracen]-10'-one (ACRSA). Note that a substance in which a π-electron rich heteroaromatic ring is directly bonded to a π-electron deficient heteroaromatic ring is particularly preferably used, in which case both the donor property of the π-electron rich heteroaromatic ring and the acceptor property of the π-electron deficient heteroaromatic ring are improved and the energy difference between the singlet excited state and the triplet excited state becomes small.

Note that the TADF material can also be used in combination with another organic compound.

[Electron-Transport Layer 724]

The electron-transport layer 724 transports the electrons, which are injected from the conductor 788 by the electron-injection layer 725, to the light-emitting layer 723. Note that the electron-transport layer 724 contains an electron-transport material. The electron-transport material used for the electron-transport layer 724 is preferably a substance with an electron mobility of higher than or equal to $1 \times 10^{-6}$ cm$^2$/Vs. Note that other substances can also be used as long as they have an electron-transport property higher than a hole-transport property.

Examples of the electron-transport material include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative.

In addition, a π-electron deficient heteroaromatic compound such as a nitrogen-containing heteroaromatic compound can also be used.

Specifically, it is possible to use any of metal complexes such as Alq$_3$, tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, and bis[2-(2-hydroxyphenyl)benzothiazolato]zinc (abbreviation: Zn(BTZ)$_2$); heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4''-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), and 4,4'-bis(5-methylbenzoxazol-2-yl)stilbene (abbreviation: BzOs); and quinoxaline derivatives and dibenzoquinoxaline derivatives such as 2-[3-(dibenzothiophen-4-yl)phenyl]dibenzo[fh]quinoxaline (abbreviation: 2mDBTP-DBq-II), 2-[3'-(dibenzothiophen-4-yl)biphenyl-3-yl]dibenzo[fh]quinoxaline (abbreviation: 2mDBTBPDBq-II), 2-[4-(3,6-diphenyl-9H-carbazol-9-yl)phenyl]dibenzo[fh]quinoxaline (abbreviation: 2CzPDBq-III), 7-[3-(dibenzothiophen-4-yl)phenyl]dibenzo[fh]quinoxaline (abbreviation: 7mDBTPDBq-II), and 6-[3-(dibenzothiophen-4-yl)phenyl]dibenzo[fh]quinoxaline (abbreviation: 6mDBTPDBq-II).

Furthermore, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used.

The electron-transport layer 724 is not limited to a single layer and may have a structure in which two or more layers each containing any of the above substances are stacked.

[Electron-Injection Layer 725]

The electron-injection layer 725 contains a substance having a high electron-injection property. The electron-injection layer 725 can be formed using an alkali metal, an alkaline earth metal, or a compound thereof, such as lithium fluoride (LiF), cesium fluoride (CsF), calcium fluoride (CaF$_2$), or lithium oxide (LiOx). A rare earth metal compound such as erbium fluoride (ErF$_3$) can also be used. An electride may also be used for the electron-injection layer 725. Examples of the electride include a substance in which electrons are added at high concentration to a mixed oxide of calcium and aluminum. Any of the substances given above for forming the electron-transport layer 724 can also be used.

A composite material in which an organic compound and an electron donor (donor) are mixed may also be used for the electron-injection layer 725. Such a composite material is excellent in an electron-injection property and an electron-transport property because electrons are generated in the organic compound by the electron donor. The organic compound here is preferably a material excellent in transporting the generated electrons; specifically, for example, any of the above-described electron-transport materials used for the electron-transport layer 724 (e.g., a metal complex or a heteroaromatic compound) can be used. As the electron donor, a substance showing a property of donating electrons to an organic compound can be used.

Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. A Lewis base such as magnesium oxide can be used. Further, an organic compound such as tetrathiafulvalene (abbreviation: TTF) can be used.

[Charge Generation Layer 792]

The charge generation layer 792 has a function of injecting electrons into the EL layer 786 that is closer to the conductor 772 of the two EL layers 786 in contact with the charge generation layer 792 and injecting holes to the other EL layer 786 that is different from the conductor 788, when a voltage is applied between the conductor 772 and the conductor 788. For example, in the light-emitting element 572 with the structure illustrated in FIG. 29C, the charge generation layer 792 has a function of injecting electrons into the EL layer 786a and injecting holes into the EL layer 786b. Note that the charge generation layer 792 may have either a structure in which an electron acceptor (acceptor) is added to a hole-transport material or a structure in which an electron donor (donor) is added to an electron-transport material. Alternatively, both of these structures may be stacked. Forming the charge generation layer 792 by using any of the above materials can inhibit an increase in driving voltage of the display device 10 including the stack of the EL layers.

When the charge generation layer 792 has a structure in which an electron acceptor is added to a hole-transport material, the electron acceptor can be 7,7,8,8-tetracyano-2, 3,5,6-tetrafluoroquinodimethane (abbreviation: $F_4$-TCNQ), chloranil, or the like. Other examples include oxides of metals that belong to Group 4 to Group 8 of the periodic table. Specific examples are vanadium oxide, niobium oxide, tantalum oxide, chromium oxide, molybdenum oxide, tungsten oxide, manganese oxide, and rhenium oxide.

When the charge generation layer 792 has a structure in which an electron donor is added to an electron-transport material, an alkali metal, an alkaline earth metal, a rare earth metal, or a metal that belongs to Group 2 or Group 13 of the periodic table, or an oxide or carbonate thereof can be used as the electron donor. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

For fabrication of the light-emitting element 572, a vacuum process such as an evaporation method or a solution process such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layer, the hole-transport layer, the light-emitting layer, the electron-transport layer, and the electron-injection layer) included in the EL layer and the charge generation layer of the light-emitting element can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, or a micro-contact printing method), or the like.

Note that materials for the functional layers (the hole-injection layer, the hole-transport layer, the light-emitting layer, the electron-transport layer, and the electron-injection layer) included in the EL layer and the charge generation layer of the light-emitting element described in this embodiment are not limited to the above materials, and other materials can be used in combination as long as the functions of the layers are fulfilled. For example, a high molecular compound (e.g., an oligomer, a dendrimer, and a polymer), a middle molecular compound (a compound between a low molecular compound and a high molecular compound, with a molecular weight of 400 to 4000), or an inorganic compound (e.g., a quantum dot material) can be used. As the quantum dot material, a colloidal quantum dot material, an alloyed quantum dot material, a core-shell quantum dot material, a core quantum dot material, or the like can be used.

At least part of the structure examples, the drawings corresponding thereto, and the like described in this embodiment can be implemented in combination with the other structure examples, the other drawings, and the like as appropriate.

At least part of this embodiment can be implemented in combination with any of the other embodiments described in this specification as appropriate.

Embodiment 2

In this embodiment, transistors that can be used in the display device of one embodiment of the present invention will be described.

Structure Example 1 of Transistor

Figure 30A:
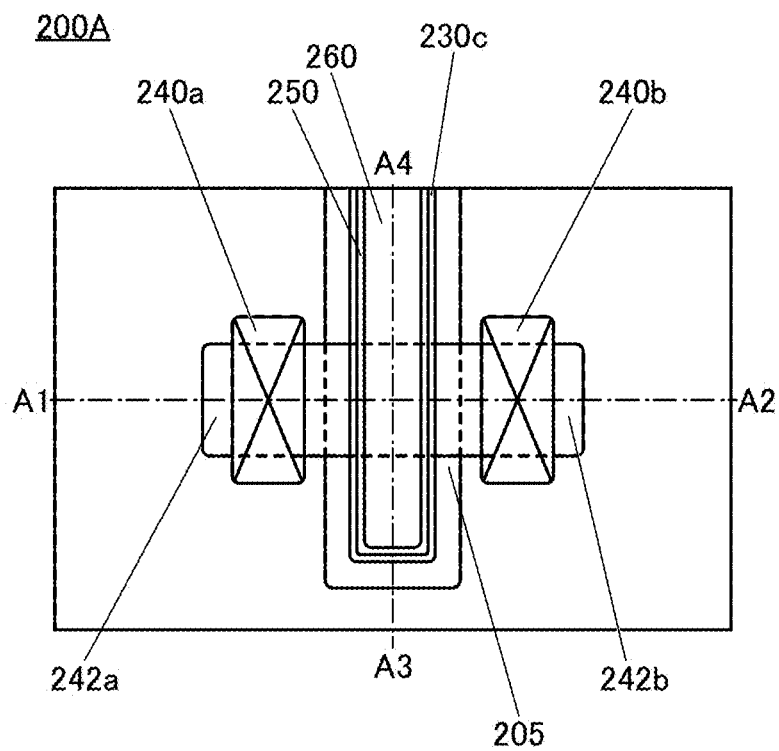
FIG. 30A is a top view illustrating a structure example of a transistor.
Figure 30C:
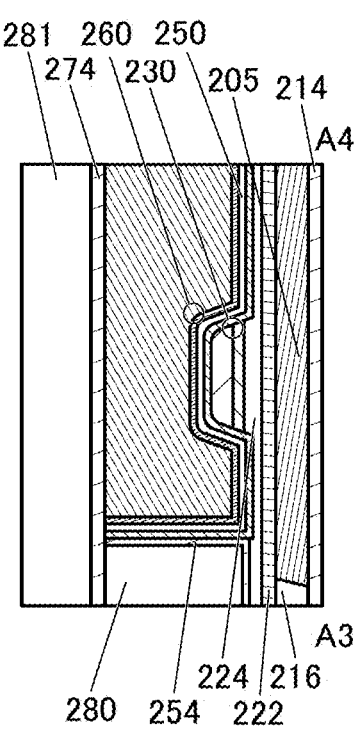
FIG. 30B and FIG. 30C are cross-sectional views illustrating the structure example of the transistor.
Figure 30B:
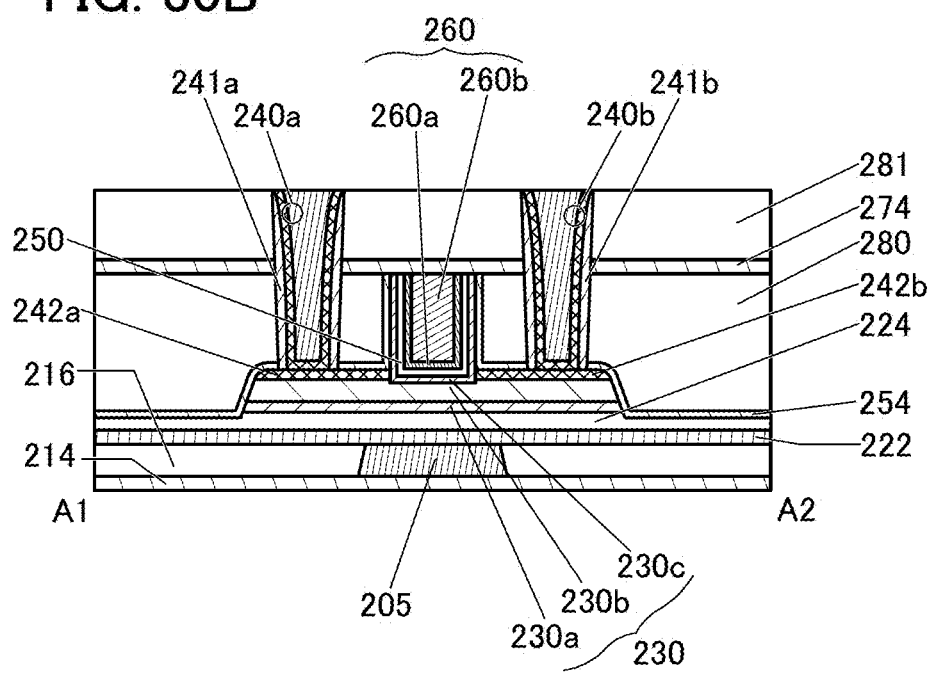

FIG. 30A, FIG. 30B, and FIG. 30C are a top view and cross-sectional views of a transistor 200A that can be used in the display device of one embodiment of the present invention and the periphery of the transistor 200A. The transistor 200A can be used in the display device of one embodiment of the present invention.

FIG. 30A is a top view of the transistor 200A. FIG. 30B and FIG. 30C are cross-sectional views of the transistor 200A. Here, FIG. 30B is a cross-sectional view of a portion indicated by the dashed-dotted line A1-A2 in FIG. 30A and is a cross-sectional view in the channel length direction of the transistor 200A. FIG. 30C is a cross-sectional view of a portion indicated by the dashed-dotted line A3-A4 in FIG. 30A and is a cross-sectional view in the channel width direction of the transistor 200A. Note that some components are not illustrated in the top view of FIG. 30A for clarity of the drawing.

As illustrated in FIG. 30, the transistor 200A includes a metal oxide 230a positioned over a substrate (not illustrated); a metal oxide 230b positioned over the metal oxide 230a; a conductor 242a and a conductor 242b that are positioned apart from each other over the metal oxide 230b; the insulator 280 that is positioned over the conductor 242a and the conductor 242b and has an opening between the conductor 242a and the conductor 242b; a conductor 260 positioned in the opening; an insulator 250 between the conductor 260 and the metal oxide 230b, the conductor 242a, the conductor 242b, and the insulator 280; and a metal oxide 230c between the insulator 250 and the metal oxide 230b, the conductor 242a, the conductor 242b, and the insulator 280. Here, as illustrated in FIG. 30B and FIG. 30C, the top surface of the conductor 260 is substantially aligned with the top surfaces of the insulator 250, the insulator 254, the metal oxide 230c, and the insulator 280. Hereinafter, the metal oxide 230a, the metal oxide 230b, and the metal oxide 230c may be collectively referred to as a metal oxide 230. The conductor 242a and the conductor 242b may be collectively referred to as a conductor 242.

In the transistor 200A illustrated in FIG. 30, side surfaces of the conductor 242a and the conductor 242b on the conductor 260 side are substantially perpendicular. Note that the transistor 200A illustrated in FIG. 30 is not limited thereto, and the angle formed between the side surfaces and the bottom surfaces of the conductor 242a and the conductor 242b may be greater than or equal to 10° and less than or equal to 80°, preferably greater than or equal to 30° and less than or equal to 60°. The side surfaces of the conductor 242a and the conductor 242b that face each other may have a plurality of surfaces.

As illustrated in FIG. 30, the insulator 254 is preferably provided between the insulator 280 and the insulator 224, the metal oxide 230a, the metal oxide 230b, the conductor 242a, the conductor 242b, and the metal oxide 230c. Here, as illustrated in FIG. 30B and FIG. 30C, the insulator 254 is preferably in contact with the side surface of the metal oxide 230c, the top surface and the side surface of the conductor 242a, the top surface and the side surface of the conductor 242b, the side surfaces of the metal oxide 230a and the metal oxide 230b, and the top surface of the insulator 224.

In the transistor 200A, three layers of the metal oxide 230a, the metal oxide 230b, and the metal oxide 230c are stacked in and around the region where the channel is formed (hereinafter also referred to as channel formation region); however, the present invention is not limited thereto. For example, a two-layer structure of the metal oxide 230b and the metal oxide 230c or a stacked-layer structure of four or more layers may be employed. Although the conductor 260 has a stacked-layer structure of two layers in the transistor 200A, the present invention is not limited thereto. For example, the conductor 260 may have a single-layer structure or a stacked-layer structure of three or more layers. Alternatively, each of the metal oxide 230a, the metal oxide 230b, and the metal oxide 230c may have a stacked-layer structure of two or more layers.

For example, when the metal oxide 230c has a stacked-layer structure including a first metal oxide and a second metal oxide over the first metal oxide, the first metal oxide preferably has a composition similar to that of the metal oxide 230b and the second metal oxide preferably has a composition similar to that of the metal oxide 230a.

Here, the conductor 260 functions as a gate electrode of the transistor, and the conductor 242a and the conductor 242b function as a source electrode and a drain electrode. As described above, the conductor 260 is formed to be embedded in the opening of the insulator 280 and the region between the conductor 242a and the conductor 242b. Here, the positions of the conductor 260, the conductor 242a, and the conductor 242b are selected in a self-aligned manner with respect to the opening of the insulator 280. In other words, in the transistor 200A, the gate electrode can be positioned between the source electrode and the drain electrode in a self-aligned manner. Thus, the conductor 260 can be formed without an alignment margin, resulting in a reduction in the area occupied by the transistor 200A. Accordingly, the display device can have higher definition. In addition, the display device can have a narrow bezel.

As illustrated in FIG. 30, the conductor 260 preferably includes a conductor 260a provided inside the insulator 250 and a conductor 260b provided to be embedded inside the conductor 260a.

The transistor 200A preferably includes the insulator 214 positioned over the substrate (not illustrated); the insulator 216 positioned over the insulator 214; a conductor 205 positioned to be embedded in the insulator 216; the insulator 222 positioned over the insulator 216 and the conductor 205; and the insulator 224 positioned over the insulator 222. The metal oxide 230a is preferably provided over the insulator 224.

The insulator 274 and the insulator 281 functioning as interlayer films are preferably provided over the transistor 200A. Here, the insulator 274 is preferably provided in contact with the top surfaces of the conductor 260, the insulator 250, the insulator 254, the metal oxide 230c, and the insulator 280.

The insulator 222, the insulator 254, and the insulator 274 preferably have a function of inhibiting diffusion of at least one of hydrogen (e.g., hydrogen atoms and hydrogen molecules).

For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of at least one of oxygen (e.g., oxygen atoms and oxygen molecules). For example, the insulator 222 and the insulator 254 preferably have a lower oxygen permeability than the insulator 224, the insulator 250, and the insulator 280.

Here, the insulator 224, the metal oxide 230, and the insulator 250 are separated from the insulator 280 and the insulator 281 by the insulator 254 and the insulator 274. This can inhibit entry of impurities such as hydrogen included in the insulator 280 and the insulator 281 into the insulator 224, the metal oxide 230, and the insulator 250 or excess oxygen into the insulator 224, the metal oxide 230a, the metal oxide 230b, and the insulator 250.

A conductor 240 (a conductor 240a and a conductor 240b) that is electrically connected to the transistor 200A and functions as a plug is preferably provided. Note that an insulator 241 (an insulator 241a and an insulator 241b) is provided in contact with the side surface of the conductor 240 functioning as a plug. In other words, the insulator 241 is provided in contact with the inner wall of an opening in the insulator 254, the insulator 280, the insulator 274, and the insulator 281. Alternatively, a structure may be employed in which a first conductor of the conductor 240 is provided in contact with the side surface of the insulator 241 and a second conductor of the conductor 240 is provided on the inner side of the first conductor. Here, the top surface of the conductor 240 and the top surface of the insulator 281 can be substantially level with each other. Although the transistor 200A has a structure in which the first conductor of the conductor 240 and the second conductor of the conductor 240 are stacked, the present invention is not limited thereto. For example, the conductor 240 may have a single-layer structure or a stacked-layer structure of three or more layers. In the case where a structured part has a stacked-layer structure, layers may be distinguished by ordinal numbers corresponding to the formation order.

In the transistor 200A, a metal oxide functioning as an oxide semiconductor (hereinafter also referred to as an oxide semiconductor) is preferably used for the metal oxide 230 including the channel formation region (the metal oxide 230a, the metal oxide 230b, and the metal oxide 230c). For example, it is preferable to use a metal oxide having a band gap of 2 eV or more, preferably 2.5 eV or more as the metal oxide to be the channel formation region of the metal oxide 230.

The metal oxide preferably contains at least indium (In) or zinc (Zn). In particular, the metal oxide preferably contains indium (In) and zinc (Zn). In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of Ga and Sn.

As illustrated in FIG. 30B, the metal oxide 230b in a region that does not overlap with the conductor 242 sometimes have smaller thickness than the metal oxide 230b in a region that overlaps with the conductor 242. The thin region is formed when part of the top surface of the metal oxide 230b is removed at the time of forming the conductor 242a and the conductor 242b. When a conductive film to be the conductor 242 is formed, a low-resistance region is sometimes formed on the top surface of the metal oxide 230b in the vicinity of the interface with the conductive film. Removing the low-resistance region positioned between the conductor 242a and the conductor 242b on the top surface of the metal oxide 230b in the above manner can prevent formation of the channel in the region.

According to one embodiment of the present invention, a display device that includes small-size transistors and thus has high resolution can be provided. A display device that includes a transistor with a high on-state current and thus has high luminance can be provided. A display device that includes a transistor operating at high speed and thus operates at high speed can be provided. A display device that includes a transistor having stable electrical characteristics and thus is highly reliable can be provided. A display device that includes a transistor with a low off-state current and thus has low power consumption can be provided.

The structure of the transistor 200A that can be used in the display device of one embodiment of the present invention is described in detail.

The conductor 205 is placed so as to include a region overlapping with the metal oxide 230 and the conductor 260. Furthermore, the conductor 205 is preferably provided to be embedded in the insulator 216. Here, the top surface of the conductor 205 preferably has favorable planarity. For example, the average surface roughness (Ra) of the top surface of the conductor 205 is less than or equal to 1 nm, preferably less than or equal to 0.5 nm, further preferably less than or equal to 0.3 nm. This achieves favorable planarity of the insulator 224 formed over the conductor 205 and increases the crystallinity of the metal oxide 230b and the metal oxide 230c.

The conductor 260 sometimes functions as a first gate (also referred to as top gate) electrode. The conductor 205 sometimes functions as a second gate (also referred to as bottom gate) electrode. In that case, by changing a potential applied to the conductor 205 independently of a potential applied to the conductor 260, $V_{th}$ of the transistor 200A can be controlled. In particular, by applying a negative potential to the conductor 205, $V_{th}$ of the transistor 200A can be higher than 0 V and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 230. In particular, it is preferable that the conductor 205 extend beyond an end portion of the metal oxide 230 that intersects with the channel width direction, as illustrated in FIG. 30C. In other words, the conductor 205 and the conductor 260 preferably overlap with each other with the insulator positioned therebetween, in a region outside the side surface of the metal oxide 230 in the channel width direction.

With the above structure, the channel formation region of the metal oxide 230 can be electrically surrounded by electric fields of the conductor 260 functioning as the first gate electrode and electric fields of the conductor 205 functioning as the second gate electrode.

Furthermore, as illustrated in FIG. 30C, the conductor 205 extends to function as a wiring as well. However, without limitation to this structure, a structure in which a conductor functioning as a wiring is provided below the conductor 205 may be employed.

A conductive material containing tungsten, copper, or aluminum as its main component is preferably used for the conductor 205. Note that the conductor 205 is illustrated as a single layer but may have a stacked-layer structure, for example, a stack of any of the above conductive materials and titanium or titanium nitride.

In addition, a conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (a conductor through which the above impurities are less likely to pass) may be used below the conductor 205. Alternatively, it is preferable to use a conductor having a function of inhibiting diffusion of oxygen (e.g., at least one of an oxygen atom, an oxygen molecule, and the like) (a conductor through which the oxygen is less likely to pass). Note that in this specification, a function of inhibiting diffusion of impurities or oxygen means a function of inhibiting diffusion of any one or all of the above impurities and oxygen.

When a conductor having a function of inhibiting oxygen diffusion is used below the conductor 205, the conductivity of the conductor 205 can be inhibited from being lowered because of oxidation. As the conductor having a function of inhibiting oxygen diffusion, for example, tantalum, tantalum nitride, ruthenium, or ruthenium oxide is preferably used. Thus, the first conductor of the conductor 205 is a single layer or a stacked layer of the above conductive materials.

The insulator 214 preferably functions as a barrier insulating film that inhibits the entry of impurities such as water or hydrogen to the transistor 200A from the substrate side.

Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the above impurities are less likely to pass). Alternatively, it is preferable to use an insulating material having a function of inhibiting diffusion of at least one of oxygen (e.g., an oxygen atom or an oxygen molecule) (an insulating material through which the oxygen is less likely to pass).

For example, aluminum oxide or silicon nitride is preferably used for the insulator 214. Accordingly, it is possible to inhibit diffusion of impurities such as water or hydrogen to the transistor 200A side from the substrate side through the insulator 214. Alternatively, it is possible to inhibit diffusion of oxygen contained in the insulator 224 and the like to the substrate side through the insulator 214.

The permittivity of each of the insulator 216, the insulator 280, and the insulator 281 functioning as an interlayer film is preferably lower than that of the insulator 214. When a material with a low permittivity is used for an interlayer film, the parasitic capacitance generated between wirings can be reduced. For the insulator 216, the insulator 280, and the insulator 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 222 and the insulator 224 function as a gate insulator.

Here, the insulator 224 in contact with the metal oxide 230 preferably release oxygen by heating. In this specification, oxygen that is released by heating is referred to as excess oxygen in some cases. For example, silicon oxide, silicon oxynitride, or the like can be used as appropriate for the insulator 224. When an insulator containing oxygen is provided in contact with the metal oxide 230, oxygen vacancies in the metal oxide 230 can be reduced, leading to improved reliability of the transistor 200A.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C. or 100° C. to 400° C.

As illustrated in FIG. 30C, the insulator 224 is sometimes thinner in a region overlapping with neither the insulator 254 nor the metal oxide 230b than in the other regions. In the insulator 224, the region overlapping with neither the insulator 254 nor the metal oxide 230b preferably has a thickness with which the above oxygen can be adequately diffused.

Like the insulator 214 and the like, the insulator 222 preferably functions as a barrier insulating film that inhibits the entry of impurities such as water or hydrogen into the transistor 200A from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, the entry of impurities such as water or hydrogen into the transistor 200A from outside can be inhibited.

Furthermore, it is preferable that the insulator 222 have a function of inhibiting diffusion of at least one of oxygen (e.g., an oxygen atom and an oxygen molecule) (it is preferable that the above oxygen be less likely to pass through the insulator 222). For example, the insulator 222 preferably has a lower oxygen permeability than the insulator 224. The insulator 222 preferably has a function of inhibiting diffusion of oxygen and impurities, in which case oxygen contained in the metal oxide 230 is less likely to diffuse to the substrate side. Moreover, the conductor 205 can be inhibited from reacting with oxygen contained in the insulator 224 or the metal oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer inhibiting release of oxygen from the metal oxide 230 and the entry of impurities such as hydrogen into the metal oxide 230 from the periphery of the transistor 200A.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 222 may be a single layer or a stacked layer using an insulator containing a high-k material, such as aluminum oxide, hafnium oxide, tantalum oxide, zirconium oxide, lead zirconate titanate (PZT), strontium titanate (SrTiO3), or (Ba,Sr)TiO$_3$ (BST). With further miniaturization and higher integration of a transistor, a problem such as generation of leakage current may arise because of a thinned gate insulator. When a high-k material is used for the insulator functioning as a gate insulator, a gate potential at the time of operation of the transistor can be reduced while the physical thickness is maintained.

Note that the insulator 222 and the insulator 224 may each have a stacked-layer structure of two or more layers. In that cases, without limitation to a stacked-layer structure formed of the same material, a stacked-layer structure formed of different materials may be employed. For example, an insulator similar to the insulator 224 may be provided below the insulator 222.

The metal oxide 230 includes the metal oxide 230a, the metal oxide 230b over the metal oxide 230a, and the metal oxide 230c over the metal oxide 230b. When the metal oxide 230 includes the metal oxide 230a under the metal oxide 230b, it is possible to inhibit diffusion of impurities into the metal oxide 230b from the components formed below the metal oxide 230a.

Moreover, when the metal oxide 230 includes the metal oxide 230c over the metal oxide 230b, it is possible to inhibit diffusion of impurities into the metal oxide 230b from the components formed above the metal oxide 230c.

Note that the metal oxide 230 preferably has a stacked-layer structure of a plurality of oxide layers that differ in the atomic ratio of metal atoms. For example, in the case where the metal oxide 230 contains at least indium (In) and an element M, the proportion of the number of atoms of the element M contained in the metal oxide 230a to the number of atoms of all elements that constitute the metal oxide 230a is preferably higher than the proportion of the number of atoms of the element M contained in the metal oxide 230b to the number of atoms of all elements that constitute the metal oxide 230b. In addition, the atomic ratio of the element M to In in the metal oxide 230a is preferably greater than the atomic ratio of the element M to In in the metal oxide 230b. Here, a metal oxide that can be used as the metal oxide 230a or the metal oxide 230b can be used as the metal oxide 230c.

The energy of the conduction band minimum of each of the metal oxide 230a and the metal oxide 230c is preferably higher than that of the metal oxide 230b. In other words, the electron affinity of each of the metal oxide 230a and the metal oxide 230c is preferably smaller than that of the metal oxide 230b. In that case, a metal oxide that can be used as the metal oxide 230a is preferably used as the metal oxide 230c. Specifically, the proportion of the number of atoms of the element M contained in the metal oxide 230c to the number of atoms of all elements that constitute the metal oxide 230c is preferably higher than the proportion of the number of atoms of the element M contained in the metal oxide 230b to the number of atoms of all elements that constitute the metal oxide 230b. In addition, the atomic ratio of the element M to In in the metal oxide 230c is preferably greater than the atomic ratio of the element M to In in the metal oxide 230b.

Here, the energy level of the conduction band minimum gently changes at junction portions between the metal oxide 230a, the metal oxide 230b, and the metal oxide 230c. In other words, the energy level of the conduction band minimum at junction portions between the metal oxide 230a, the metal oxide 230b, and the metal oxide 230c is continuously varied or are continuously connected. This can be achieved by decreasing the density of defect states in a mixed layer formed at the interface between the metal oxide 230a and the metal oxide 230b and the interface between the metal oxide 230b and the metal oxide 230c.

Specifically, when the metal oxide 230a and the metal oxide 230b or the metal oxide 230b and the metal oxide 230c contain the same element (as a main component) in addition to oxygen, a mixed layer with a low density of defect states can be formed. For example, in the case where the metal oxide 230b is an In—Ga—Zn oxide, an In—Ga—Zn oxide, a Ga—Zn oxide, gallium oxide, or the like may be used as the metal oxide 230a and the metal oxide 230c. The metal oxide 230c may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 230c may have a stacked-layer structure of an In—Ga—Zn oxide and an oxide that does not contain In.

Specifically, as the metal oxide 230a, a metal oxide with In:Ga:Zn=1:3:4 [atomic ratio] or 1:1:0.5 [atomic ratio] can be used. As the metal oxide 230b, a metal oxide with In:Ga:Zn=4:2:3 [atomic ratio] or 3:1:2 [atomic ratio] can be used. As the metal oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 230c include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and gallium oxide.

At this time, the metal oxide 230b serves as a main carrier path. When the metal oxide 230a and the metal oxide 230c have the above structure, the density of defect states at the interface between the metal oxide 230a and the metal oxide 230b and the interface between the metal oxide 230b and the metal oxide 230c can be made low. This reduces the influence of interface scattering on carrier conduction, and the transistor 200A can have a high on-state current and high frequency characteristics. Note that in the case where the metal oxide 230c has a stacked-layer structure, not only the effect of reducing the density of defect states at the interface between the metal oxide 230b and the metal oxide 230c, but also the effect of inhibiting diffusion of the constituent element of the metal oxide 230c to the insulator 250 side can be expected.

Specifically, the metal oxide 230c has a stacked-layer structure in which the upper layer is an oxide that does not contain In, whereby the diffusion of In to the insulator 250 side can be inhibited. Since the insulator 250 functions as a gate insulator, the transistor has defects in characteristics when In diffuses. Thus, the metal oxide 230c having a stacked-layer structure allows a highly reliable display device to be provided.

The conductor 242 (the conductor 242a and the conductor 242b) functioning as the source electrode and the drain electrode is provided over the metal oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that hold their conductivity even when absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such cases, the carrier density of the region in the metal oxide 230 in the vicinity of the conductor 242 increases, and the region becomes a low-resistance region.

Here, the region between the conductor 242a and the conductor 242b is formed to overlap with the opening of the insulator 280. Accordingly, the conductor 260 can be formed in a self-aligned manner between the conductor 242a and the conductor 242b.

The insulator 250 functions as a gate insulator. The insulator 250 is preferably positioned in contact with the top surface of the metal oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260.

Accordingly, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is preferable to use an insulator containing an oxide of one or both of aluminum and hafnium, such as aluminum oxide, hafnium oxide, or an oxide containing aluminum and hafnium (hafnium aluminate), in particular.

Although the conductor 260 has a two-layer structure in FIG. 30, the conductor 260 may have a single-layer structure or a stacked-layer structure of three or more layers.

The conductor 260a is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and NO$_2$), and a copper atom. Alternatively, it is preferable to use a conductive material having a function of inhibiting diffusion of at least one of oxygen (e.g., an oxygen atom and an oxygen molecule).

When the conductor 260a has a function of inhibiting diffusion of oxygen, the conductivity of the conductor 260b can be inhibited from being lowered because of oxidation due to oxygen contained in the insulator 250. As a conductive material having a function of inhibiting oxygen diffusion, for example, tantalum, tantalum nitride, ruthenium, ruthenium oxide, or the like is preferably used.

Moreover, a conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of titanium or titanium nitride and the above conductive material.

As illustrated in FIG. 30A and FIG. 30C, the side surface of the metal oxide 230 is covered with the conductor 260 in a region where the metal oxide 230b does not overlap with the conductor 242, that is, the channel formation region of the metal oxide 230. Accordingly, electric fields of the conductor 260 functioning as the first gate electrode are likely to act on the side surface of the metal oxide 230. Thus, the on-state current of the transistor 200A can be increased and the frequency characteristics can be improved.

The insulator 254, like the insulator 214 and the like, preferably functions as a barrier insulating film that inhibits the entry of impurities such as water or hydrogen into the transistor 200A from the insulator 280 side. The insulator 254 preferably has lower hydrogen permeability than the insulator 224, for example. Furthermore, as illustrated in FIG. 30B and FIG. 30C, the insulator 254 is preferably in contact with the side surface of the metal oxide 230c, the top and side surfaces of the conductor 242a, the top and side surfaces of the conductor 242b, side surfaces of the metal oxide 230a and the metal oxide 230b, and the top surface of the insulator 224. Such a structure can inhibit the entry of hydrogen contained in the insulator 280 into the metal oxide 230 through the top surfaces or side surfaces of the conductor 242a, the conductor 242b, the metal oxide 230a, the metal oxide 230b, and the insulator 224.

Furthermore, it is preferable that the insulator 254 have a function of inhibiting diffusion of at least one of oxygen (e.g., an oxygen atom and an oxygen molecule) (it is preferable that the above oxygen be less likely to pass through the insulator 254). For example, the insulator 254 preferably has lower oxygen permeability than the insulator 280 or the insulator 224.

The insulator 254 is preferably formed by a sputtering method. When the insulator 254 is formed by a sputtering method in an oxygen-containing atmosphere, oxygen can be added to the vicinity of a region of the insulator 224 that is in contact with the insulator 254. Thus, oxygen can be supplied from the region to the metal oxide 230 through the insulator 224. Here, with the insulator 254 having a function of inhibiting upward oxygen diffusion, oxygen can be prevented from diffusing from the metal oxide 230 into the insulator 280. Moreover, with the insulator 222 having a function of inhibiting downward oxygen diffusion, oxygen can be prevented from diffusing from the metal oxide 230 to the substrate side. In the above manner, oxygen is supplied to the channel formation region of the metal oxide 230. Accordingly, oxygen vacancies in the metal oxide 230 can be reduced, so that the transistor can be prevented from having normally-on characteristics.

As the insulator 254, an insulator containing an oxide of one or both of aluminum and hafnium is formed, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 230 are covered with the insulator 254 having a barrier property against hydrogen, whereby the insulator 280 is isolated from the insulator 224, the metal oxide 230, and the insulator 250 by the insulator 254. This can inhibit the entry of impurities such as hydrogen from outside of the transistor 200A, resulting in favorable electrical characteristics and high reliability of the transistor 200A.

The insulator 280 is provided over the insulator 224, the metal oxide 230, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride are preferable because they are thermally stable. In particular, materials such as silicon oxide, silicon oxynitride, and porous silicon oxide are preferably used, in which case a region containing oxygen released by heating can be easily formed.

The concentration of impurities such as water or hydrogen in the insulator 280 is preferably reduced. In addition, the top surface of the insulator 280 may be planarized.

Like the insulator 214 or the like, the insulator 274 preferably functions as a barrier insulating film that inhibits the entry of impurities such as water or hydrogen into the insulator 280 from the above. As the insulator 274, for example, the insulator that can be used as the insulator 214, the insulator 254, and the like can be used.

The insulator 281 functioning as an interlayer film is preferably provided over the insulator 274. As in the insulator 224 or the like, the concentration of impurities such as water or hydrogen in the insulator 281 is preferably reduced.

The conductor 240a and the conductor 240b are positioned in openings formed in the insulator 281, the insulator 274, the insulator 280, and the insulator 254. The conductor 240a and the conductor 240b are positioned to face each other with the conductor 260 therebetween. Note that the top surfaces of the conductor 240a and the conductor 240b may be level with the top surface of the insulator 281.

The insulator 241a is provided in contact with the inner walls of the openings in the insulator 281, the insulator 274, the insulator 280, and the insulator 254, and the first conductor of the conductor 240a is formed in contact with the side surface of the insulator 241a. The conductor 242a is positioned on at least part of the bottom portion of the opening, and the conductor 240a is in contact with the conductor 242a. Similarly, the insulator 241b is provided in contact with the inner walls of the openings in the insulator 281, the insulator 274, the insulator 280, and the insulator 254, and the first conductor of the conductor 240b is formed in contact with the side surface of the insulator 241b. The conductor 242b is positioned on at least part of the bottom portion of the opening, and the conductor 240b is in contact with the conductor 242b.

The conductor 240a and the conductor 240b are preferably formed using a conductive material containing tungsten, copper, or aluminum as its main component. The conductor 240a and the conductor 240b may have a stacked-layer structure.

In the case where the conductor 240 has a stacked-layer structure, the aforementioned conductor having a function of inhibiting diffusion of impurities such as water or hydrogen is preferably used as the conductor in contact with the metal oxide 230a, the metal oxide 230b, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can prevent oxygen added to the insulator 280 from being absorbed by the conductor 240a and the conductor 240b. Moreover, impurities such as water or hydrogen can be inhibited from entering the metal oxide 230 through the conductor 240a and the conductor 240b from a layer above the insulator 281.

As the insulator 241a and the insulator 241b, for example, the insulator that can be used as the insulator 254 or the like can be used. Since the insulator 241a and the insulator 241b are provided in contact with the insulator 254, impurities such as water or hydrogen in the insulator 280 or the like can be inhibited from entering the metal oxide 230 through the conductor 240a and the conductor 240b. Furthermore, oxygen contained in the insulator 280 can be prevented from being absorbed by the conductor 240a and the conductor 240b.

Although not illustrated, a conductor functioning as a wiring may be provided in contact with the top surface of the conductor 240a and the top surface of the conductor 240b. For the conductor functioning as a wiring, a conductive material containing tungsten, copper, or aluminum as its main component is preferably used. Furthermore, the conductor may have a stacked-layer structure and may be a stack of titanium or a titanium nitride and any of the above conductive materials, for example. Note that the conductor may be formed to be embedded in an opening provided in an insulator.

Structure Example 2 of Transistor

Figure 31A:
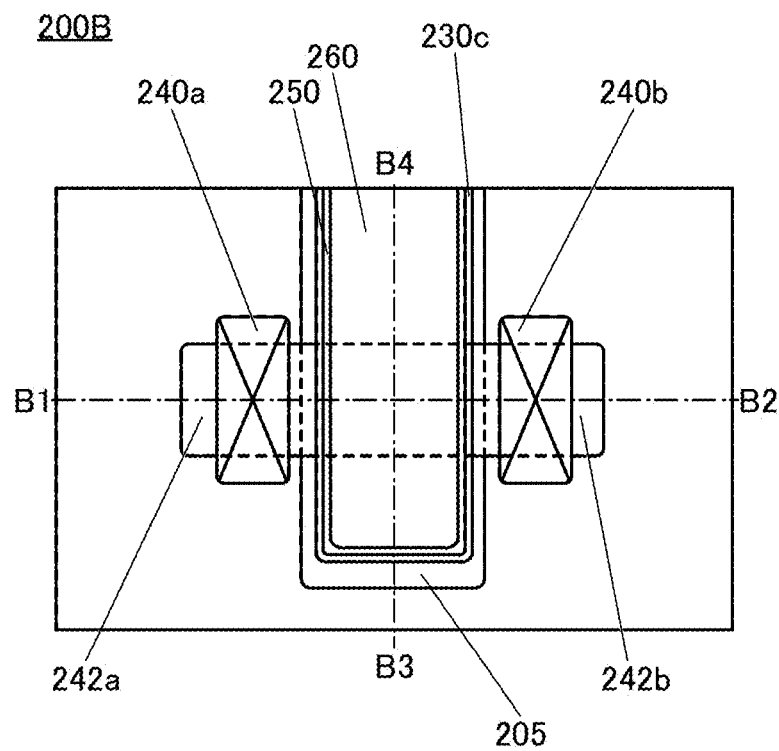
FIG. 31A is a top view illustrating a structure example of a transistor.
Figure 31C:
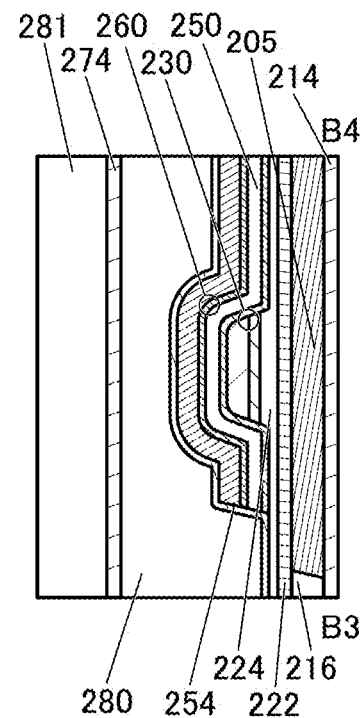
FIG. 31B and FIG. 31C are cross-sectional views illustrating the structure example of the transistor.
Figure 31B:
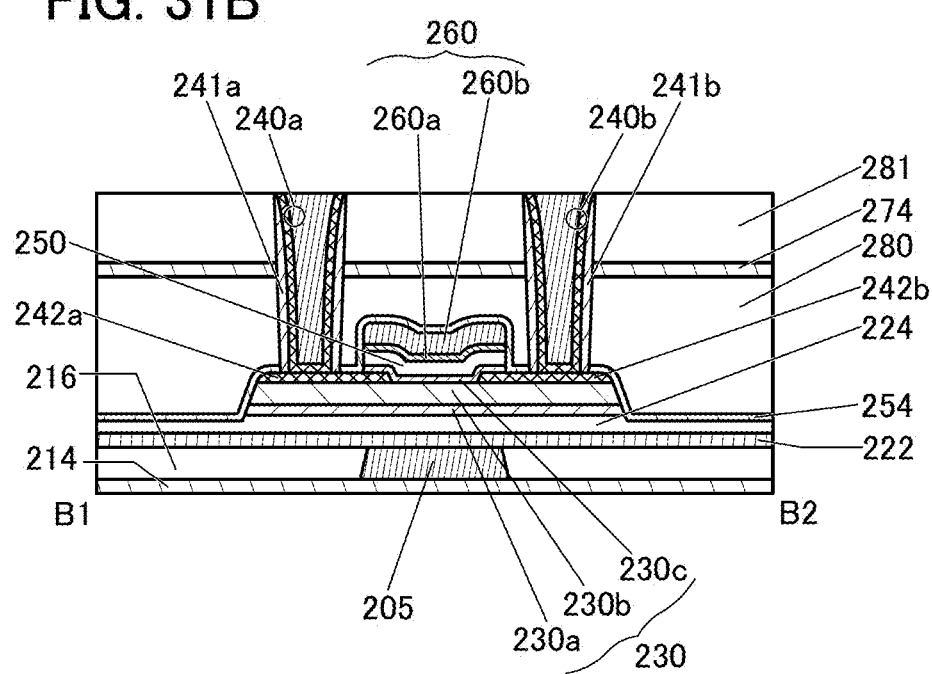

FIG. 31A, FIG. 31B, and FIG. 31C are a top view and cross-sectional views of a transistor 200B that can be used in the display device of one embodiment of the present invention and the periphery of the transistor 200B. The transistor 200B is a modification example of the transistor 200A.

FIG. 31A is a top view of the transistor 200B. FIG. 31B and FIG. 31C are cross-sectional views of the transistor 200B. Here, FIG. 31B is a cross-sectional view of a portion indicated by the dashed-dotted line B1-B2 in FIG. 31A, and is a cross-sectional view in the channel length direction of the transistor 200B. FIG. 31C is a cross-sectional view of a portion indicated by the dashed-dotted line B3-B4 in FIG. 31A, and is a cross-sectional view in the channel width direction of the transistor 200B. Note that some components are not illustrated in the top view of FIG. 31A for clarity of the drawing.

In the transistor 200B, the conductor 242a and the conductor 242b each have a region overlapping with the metal oxide 230c, the insulator 250, and the conductor 260. This enables the transistor 200B to have a high on-state current. This also enables the transistor 200B to be a transistor that is easy to control.

The conductor 260 functioning as a gate electrode includes the conductor 260a and the conductor 260b over the conductor 260a. For the conductor 260a, a conductive material having a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 260a has a function of inhibiting oxygen diffusion, the range of choices for the material of the conductor 260b can be expanded. In other words, the conductor 260a inhibits oxidation of the conductor 260b, thereby preventing a decrease in conductivity.

The insulator 254 is preferably provided to cover the top surface and the side surface of the conductor 260, the side surface of the insulator 250, and the side surface of the metal oxide 230c. Note that an insulating material having a function of inhibiting diffusion of oxygen and impurities such as water or hydrogen is preferably used for the insulator 254.

Providing the insulator 254 can inhibit oxidation of the conductor 260. Moreover, the insulator 254 can inhibit diffusion of impurities such as water or hydrogen contained in the insulator 280 into the transistor 200B.

<Structure example 3 of transistor>

Figure 32A:
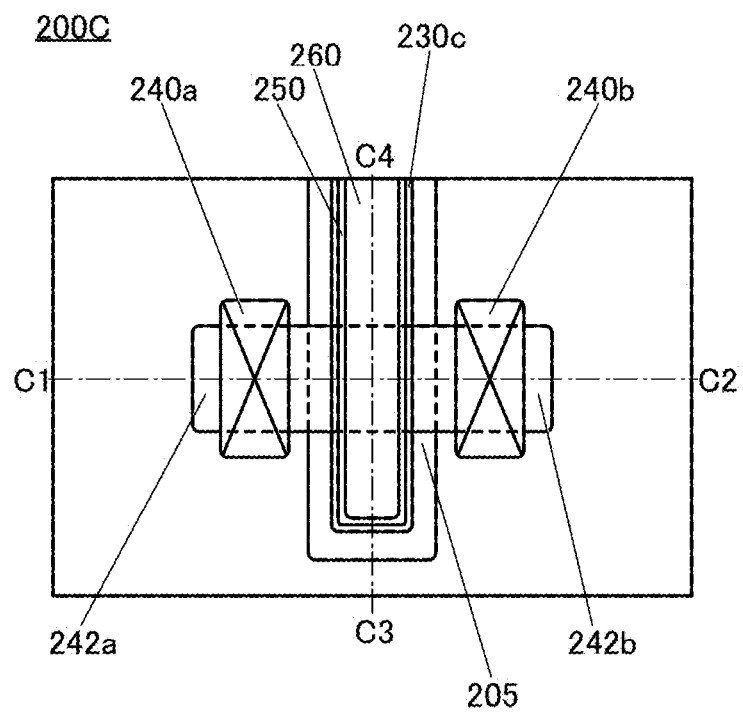
FIG. 32A is a top view illustrating a structure example of a transistor.
Figure 32C:
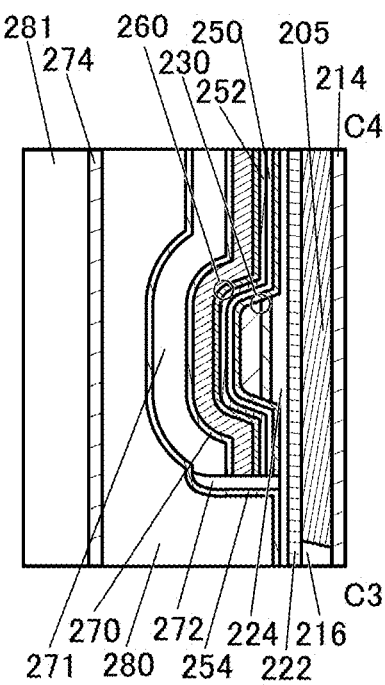
FIG. 32B and FIG. 32C are cross-sectional views illustrating the structure example of the transistor.
Figure 32B:
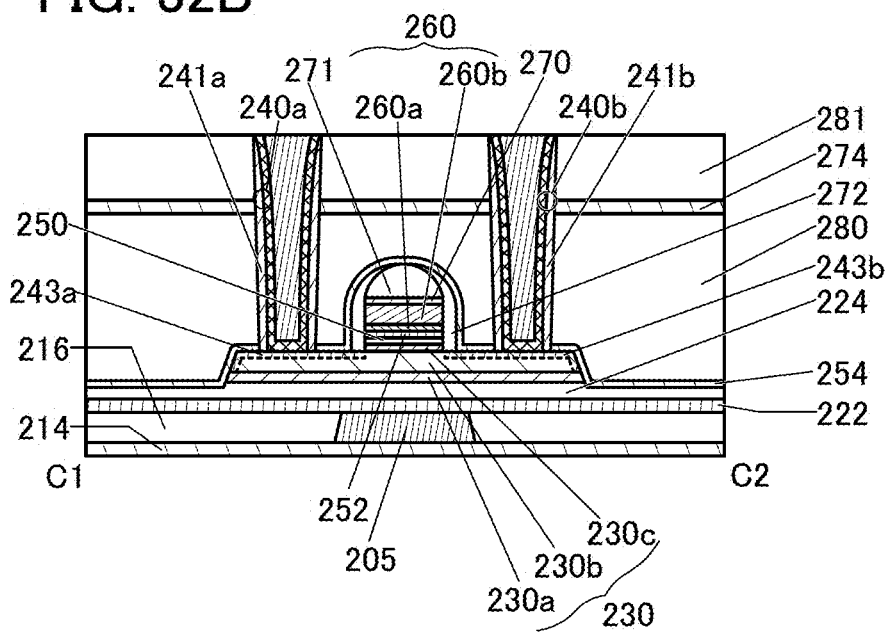

FIG. 32A, FIG. 32B, and FIG. 32C are a top view and cross-sectional views of a transistor 200C that can be used in the display device of one embodiment of the present invention and the periphery of the transistor 200C. The transistor 200C is a modification example of the transistor 200A.

FIG. 32A is a top view of the transistor 200C. FIG. 32B and FIG. 32C are cross-sectional views of the transistor 200C. Here, FIG. 32B is a cross-sectional view of a portion indicated by the dashed-dotted line C1—C2 in FIG. 32A and is a cross-sectional view in the channel length direction of the transistor 200C. FIG. 32C is a cross-sectional view of a portion indicated by the dashed-dotted line C3—C4 in FIG. 32A and is a cross-sectional view in the channel width direction of the transistor 200C. Note that some components are not illustrated in the top view of FIG. 32A for clarity of the drawing.

The transistor 200C includes the insulator 250 over the metal oxide 230c and a metal oxide 252 over the insulator 250. The conductor 260 is provided over the metal oxide 252, and an insulator 270 is provided over the conductor 260. An insulator 271 is provided over the insulator 270.

The metal oxide 252 preferably has a function of inhibiting oxygen diffusion. When the metal oxide 252 that inhibits oxygen diffusion is provided between the insulator 250 and the conductor 260, diffusion of oxygen into the conductor 260 is inhibited. In other words, a reduction in the amount of oxygen supplied to the metal oxide 230 can be inhibited. Moreover, oxidization of the conductor 260 due to oxygen can be inhibited.

Note that the metal oxide 252 may function as part of a gate electrode. For example, an oxide semiconductor that can be used for the metal oxide 230 can be used for the metal oxide 252. In that case, when the conductor 260 is formed by a sputtering method, the metal oxide 252 can have a reduced electric resistance and become a conductor. Such a conductor can be referred to as an OC(Oxide Conductor) electrode.

Note that the metal oxide 252 may function as part of a gate insulator. Thus, when silicon oxide, silicon oxynitride, or the like is used for the insulator 250, a metal oxide that is a high-k material with a high relative permittivity is preferably used for the metal oxide 252. Such a stacked-layer structure can be thermally stable and can have a high relative permittivity. Accordingly, a gate potential applied at the time of operation of the transistor can be lowered while the physical thickness is maintained. In addition, the equivalent oxide thickness (EOT) of an insulating layer functioning as a gate insulator can be reduced.

Although the metal oxide 252 in the transistor 200C is illustrated as a single layer, the metal oxide 252 may have a stacked-layer structure of two or more layers. For example, a metal oxide functioning as part of a gate electrode and a metal oxide functioning as part of a gate insulator may be stacked.

With the metal oxide 252 functioning as a gate electrode, the on-state current of the transistor 200C can be increased without a reduction in the influence of the electric field from the conductor 260. In addition, with the metal oxide 252 functioning as a gate insulator, the distance between the conductor 260 and the metal oxide 230 is kept by the physical thicknesses of the insulator 250 and the metal oxide 252, so that leakage current between the conductor 260 and the metal oxide 230 can be reduced. Thus, with the stacked-layer structure of the insulator 250 and the metal oxide 252, it is easy to adjust the physical distance between the conductor 260 and the metal oxide 230 and the intensity of electric fields applied from the conductor 260 to the metal oxide 230.

Specifically, for the metal oxide 252, a material obtained by reducing the resistance of an oxide semiconductor that can be used for the metal oxide 230 can be used. Alternatively, a metal oxide containing one or more of hafnium, aluminum, gallium, yttrium, zirconium, tungsten, titanium, tantalum, nickel, germanium, magnesium, and the like can be used.

In particular, it is preferable to use an insulating layer containing an oxide of one or both of aluminum and hafnium, such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is unlikely to be crystallized by heat treatment in a later step. Note that the metal oxide 252 is not an essential component. Design is appropriately determined in consideration of required transistor characteristics.

For the insulator 270, an insulating material having a function of inhibiting the passage of oxygen and impurities such as water or hydrogen is preferably used. For example, aluminum oxide or hafnium oxide is preferably used. Thus, oxidization of the conductor 260 due to oxygen from above the insulator 270 can be inhibited. Moreover, the entry of impurities such as water or hydrogen from above the insulator 270 into the metal oxide 230 through the conductor 260 and the insulator 250 can be inhibited.

The insulator 271 functions as a hard mask. By providing the insulator 271, the conductor 260 can be processed such that the side surface of the conductor 260 is substantially perpendicular; specifically, an angle formed by the side surface of the conductor 260 and a surface of the substrate can be greater than or equal to 75° and less than or equal to 100°, preferably greater than or equal to 80° and less than or equal to 95°.

Note that the insulator 271 may be formed using an insulating material having a function of inhibiting the passage of oxygen and impurities such as water or hydrogen so that the insulator 271 also functions as a barrier layer. In that case, the insulator 270 is not necessarily provided.

Parts of the insulator 270, the conductor 260, the metal oxide 252, the insulator 250, and the metal oxide 230c are selectively removed using the insulator 271 as a hard mask, whereby their side surfaces can be substantially aligned with each other and the surface of the metal oxide 230b can be partly exposed.

The transistor 200C includes a region 243a and a region 243b on part of the exposed surface of the metal oxide 230b. One of the region 243a and the region 243b functions as a source region, and the other of the region 243a and the region 243b functions as a drain region.

The region 243a and the region 243b can be formed by adding an impurity element such as phosphorus or boron to the exposed surface of the metal oxide 230b by an ion implantation method, an ion doping method, a plasma immersion ion implantation method, or plasma treatment, for example. In this embodiment and the like, an "impurity element" refers to an element other than main constituent elements.

Alternatively, the region 243a and the region 243b can be formed in such manner that, after part of the surface of the metal oxide 230b is exposed, a metal film is formed and then heat treatment is performed so that the element contained in the metal film is diffused into the metal oxide 230b.

The electrical resistivity of the regions of the metal oxide 230b to which the impurity element is added decreases. For that reason, the region 243a and the region 243b are sometimes referred to as "impurity regions" or "low-resistance regions".

The region 243a and the region 243b can be formed in a self-aligned manner by using the insulator 271 and/or the conductor 260 as a mask. Accordingly, the conductor 260 does not overlap with the region 243a and/or the region 243b, so that the parasitic capacitance can be reduced. Moreover, an offset region is not formed between the channel formation region and the source/drain region (the region 243a or the region 243b). The formation of the region 243a and the region 243b in a self-aligned manner achieves a higher on-state current, a lower threshold voltage, and a higher operating frequency, for example.

The transistor 200C includes an insulator 272 on the side surfaces of the insulator 271, the insulator 270, the conductor 260, the metal oxide 252, the insulator 250, and the metal oxide 230c. The insulator 272 is preferably an insulator having a low relative permittivity. The insulator 272 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin, for example. In particular, silicon oxide, silicon oxynitride, silicon nitride oxide, or porous silicon oxide is preferably used for the insulator 272, in which case an excess oxygen region can be easily formed in the insulator 272 in a later step. Silicon oxide and silicon oxynitride are preferable because they are thermally stable. The insulator 272 preferably has a function of diffusing oxygen.

Note that an offset region may be provided between the channel formation region and the source/drain region in order to further reduce the off-state current. The offset region is a region where the electrical resistivity is high and a region where the above-described addition of the impurity element is not performed. The offset region can be formed in such a manner that the insulator 272 is formed and then the above-described addition of the impurity element is performed. In that case, the insulator 272 also serves as a mask, like the insulator 271 or the like. Thus, the impurity element is not added to a region of the metal oxide 230b overlapping with the insulator 272, so that the electrical resistivity of the region can be kept high.

The transistor 200C also includes the insulator 254 over the insulator 272 and the metal oxide 230. The insulator 254 is preferably formed by a sputtering method. The insulator formed by a sputtering method can be an insulator containing few impurities such as water or hydrogen.

Note that an oxide film obtained by a sputtering method may extract hydrogen from the structured part over which the oxide film is deposited. For that reason, the hydrogen concentrations in the metal oxide 230 and the insulator 272 can be reduced when the insulator 254 absorbs hydrogen and water from the metal oxide 230 and the insulator 272.

<Materials for Transistor>

Materials that can be used for the transistor will be described.

[Substrate]

As a substrate where the transistor 200A, the transistor 200B, or the transistor 200C is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example includes a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided for the substrates include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

With further miniaturization and higher integration of a transistor, for example, a problem such as generation of leakage current may arise because of a thinned gate insulator.

When a high-k material is used for the insulator functioning as a gate insulator, the voltage at the time of operation of the transistor can be reduced while the physical thickness is maintained. By contrast, when a material with a low relative permittivity is used for the insulator functioning as an interlayer film, parasitic capacitance generated between wirings can be reduced. Thus, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including an oxide semiconductor is surrounded by insulators having a function of inhibiting the passage of oxygen and impurities such as hydrogen (e.g., the insulator 214, the insulator 222, the insulator 254, and the insulator 274), the electrical characteristics of the transistor can be stable. An insulator having a function of inhibiting the passage of oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator preferably includes a region containing oxygen released by heating. For example, a structure where silicon oxide or silicon oxynitride that includes a region containing oxygen released by heating is provided in contact with the metal oxide 230 can compensate oxygen vacancies in the metal oxide 230.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements;

an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A plurality of conductors formed using any of the above materials may be stacked. For example, a stacked-layer structure combining a material containing the above metal element and a conductive material containing oxygen may be employed. Alternatively, a stacked-layer structure combining a material containing the above metal element and a conductive material containing nitrogen may be employed.

Further alternatively, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably employs a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide in which the channel is formed. A conductive material containing the above metal element and nitrogen may be used. For example, a conductive material containing nitrogen such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

At least part of the structure examples, the drawings corresponding thereto, and the like described in this embodiment can be implemented in combination with any of the other structure examples, the other drawings, and the like as appropriate.

At least part of this embodiment can be implemented in combination with any of the other embodiments described in this specification as appropriate.

Embodiment 3

Described in this embodiment is a metal oxide (hereinafter also referred to as an oxide semiconductor) applicable to an OS transistor described in the above embodiment.

<Classification of Crystal Structures>

First, the classification of the crystal structures of an oxide semiconductor will be described with reference to FIG. 33A. FIG. 33A is a diagram showing the classification of crystal structures of an oxide semiconductor, typically IGZO (a metal oxide containing In, Ga, and Zn).

As shown in FIG. 33A, an oxide semiconductor is roughly classified into "Amorphous," "Crystalline," and "Crystal." The term "Amorphous" includes a completely amorphous structure. The term "Crystalline" includes CAAC (c-axis-aligned crystalline), nc (nanocrystalline), and CAC (cloud-aligned composite) structures. Note that the term "Crystalline" excludes single crystal, poly crystal, and completely amorphous structures. The term "Crystal" includes single crystal and poly crystal structures.

Note that the structures in the thick frame in FIG. 33A are in an intermediate state between "Amorphous" and "Crystal," and belong to a new crystalline phase. That is, these structures are completely different from "Amorphous," which is energetically unstable, and "Crystal."

A crystal structure of a film or a substrate can be analyzed with an X-ray diffraction (XRD) spectrum. FIG. 33B shows an XRD spectrum, which is obtained by GIXD (Grazing-Incidence XRD) measurement, of a CAAC-IGZO film classified into "Crystalline." Note that a GIXD method is also referred to as a thin film method or a Seemann-Bohlin method. The XRD spectrum that is shown in FIG. 33B and obtained by GIXD measurement is hereinafter simply referred to as an XRD spectrum. The CAAC-IGZO film in FIG. 33B has an atomic ratio of In:Ga:Zn=4:2:3 or a neighborhood thereof. The CAAC-IGZO film in FIG. 33B has a thickness of 500 nm.

As shown in FIG. 33B, a clear peak indicating crystallinity is observed in the XRD spectrum of the CAAC-IGZO film. Specifically, a peak indicating c-axis alignment is observed at 2θ of around 31° in the XRD spectrum of the CAAC-IGZO film. As shown in FIG. 33B, the peak at 2θ of around 31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 33C shows a diffraction pattern of the CAAC-IGZO film. FIG. 33C shows a diffraction pattern obtained by the NBED method in which an electron beam is incident in the direction parallel to the substrate. The CAAC-IGZO film in FIG. 33C has an atomic ratio of In:Ga:Zn=4:2:3 or a neighborhood thereof. In the nanobeam electron diffraction method, electron diffraction is performed with a probe diameter of 1 nm.

As shown in FIG. 33C, a plurality of spots indicating c-axis alignment are observed in the diffraction pattern of the CAAC-IGZO film.

[Structure of Oxide Semiconductor]

Oxide semiconductors might be classified in a manner different from the one in FIG. 33A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the elementM, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement.

This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

[Composition of Oxide Semiconductor]

Next, the CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has[In] higher than[In] in the composition of the CAC-OS film. Moreover, the second region has[Ga] higher than[Ga] in the composition of the CAC-OS film. Alternatively, for example, the first region has higher [In] than[In] in the second region and lower [Ga] than[Ga] in the second region. Moreover, the second region has higher [Ga] than [Ga] in the first region and lower [In] than[In] in the first region.

Specifically, the first region includes indium oxide, indium zinc oxide, or the like as its main component. The second region includes gallium oxide, gallium zinc oxide, or the like as its main component. That is, the first region can be rephrased with a region containing In as its main component. The second region can be rephrased with a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current 000, high field-effect mobility ($\mu$), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$ and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state.

Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon.

<Impurity>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including, as a semiconductor, an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

At least part of this embodiment can be implemented in combination with any of the other embodiments described in this specification as appropriate.

Embodiment 4

In this embodiment, electronic devices each including a display device that is one embodiment of the present invention are described.

Figure 34A:
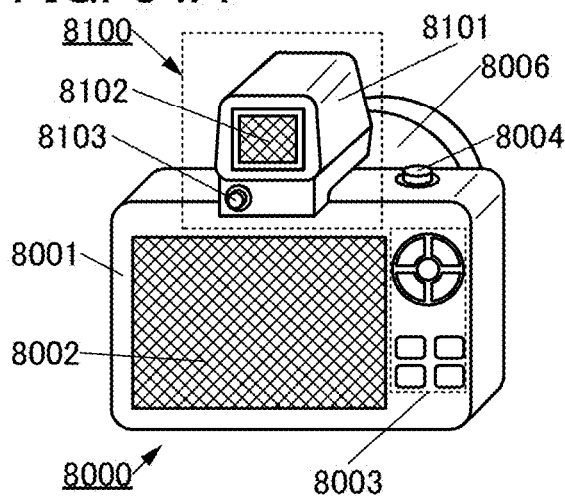
FIG. 34A, FIG. 34B, FIG. 34C, FIG. 34D, and FIG. 34E are perspective views of examples of electronic devices.

FIG. 34A is a diagram illustrating the appearance of a camera 8000 to which a finder 8100 is attached. The camera 8000 is provided with an imaging device. The camera 8000 can be a digital camera, for example. Note that although the camera 8000 and the finder 8100 are separate and detachable electronic devices in FIG. 34A, a finder including a display device may be incorporated in a housing 8001 of the camera 8000.

The camera 8000 includes the housing 8001, a display portion 8002, operation buttons 8003, a shutter button 8004, and the like. A detachable lens 8006 is attached to the camera 8000.

Although the lens 8006 of the camera 8000 here is detachable from the housing 8001 for replacement, the lens 8006 may be integrated with the housing.

The camera 8000 can take images at the press of the shutter button 8004. The display portion 8002 functions as a touch panel and images can also be taken at the touch of the display portion 8002.

The housing 8001 of the camera 8000 includes a mount including an electrode, so that the finder 8100, a strobo-scope, or the like can be connected to the housing.

The finder 8100 includes a housing 8101, a display portion 8102, a button 8103, and the like. The finder 8100 can be an electronic viewfinder.

The housing 8101 includes a mount for engagement with the mount of the camera 8000 so that the finder 8100 can be attached to the camera 8000. The mount includes an electrode, and an image or the like received from the camera 8000 through the electrode can be displayed on the display portion 8102.

The button 8103 functions as a power button. The on/off state of the display portion 8102 can be switched with the button 8103.

A display device of one embodiment of the present invention can be used for the display portion 8002 of the camera 8000 and the display portion 8102 of the finder 8100. The display device of one embodiment of the present invention has extremely high-resolution; thus, even when the display portion 8002 or the display portion 8102 is close to the user, a more realistic image can be displayed on the display portion 8002 or the display portion 8102 without perception of pixels by the user. In particular, an image displayed on the display portion 8102 provided in the finder 8100 is perceived when the user brings his/her eyes closer to the eyepiece of the finder 8100; thus, the distance between the user and the display portion 8102 becomes very short. Thus, in particular, the display device of one embodiment of the present invention is preferably used for the display portion 8102. Note that in the case where the display device of one embodiment of the present invention is used for the display portion 8102, the resolution of an image that can be displayed on the display portion 8102 can be 4K, 5K, or higher.

Note that the resolution of an image that can be taken by the imaging device provided in the camera 8000 is preferably the same as or higher than the resolution of an image that can be displayed on the display portion 8002 or the display portion 8102. For example, in the case where an image having a resolution of 4K can be displayed on the display portion 8102, the camera 8000 is preferably provided with an imaging device that can take an image of 4k or higher. Moreover, for example, in the case where an image having a resolution of 5K can be displayed on the display portion 8102, the camera 8000 is preferably provided with an imaging device that can take an image of 5k or higher.

Figure 34B:
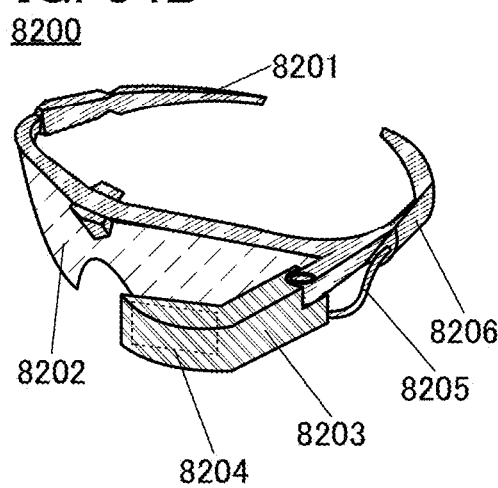

FIG. 34B is a diagram illustrating the appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display an image corresponding to the received image data or the like on the display portion 8204. The movement of the eyeball and the eyelid of the user is captured by a camera provided in the main body 8203 and then coordinates of the sight line of the user are calculated using the information to utilize the sight line of the user as an input means.

A plurality of electrodes may be provided in the mounting portion 8201 at a position in contact with the user. The main body 8203 may have a function of sensing current flowing through the electrodes along with the movement of the user's eyeball to recognize the user's sight line. The main body 8203 may have a function of sensing current flowing through the electrodes to monitor the user's pulse. The mounting portion 8201 may include various sensors such as a temperature sensor, a pressure sensor, and an acceleration sensor to have a function of displaying the user's biological information on the display portion 8204. The main body 8203 may sense the movement of the user's head or the like to change an image displayed on the display portion 8204 in synchronization with the movement.

The display portion 8204 can use the display device of one embodiment of the present invention. Accordingly, the head-mounted display 8200 can have a narrower bezel, a high-quality image can be displayed on the display portion 8204, and a more realistic image can be displayed.

Figure 34C:
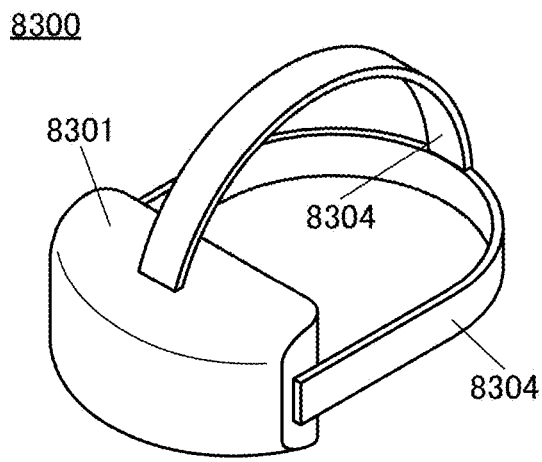
Figure 34D:
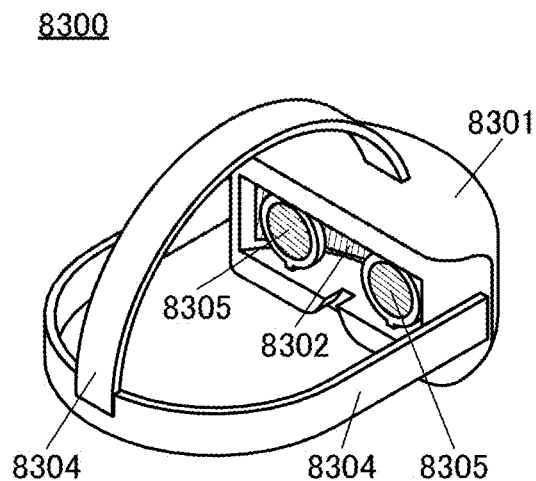
Figure 34E:
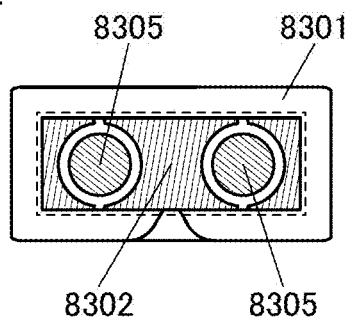

FIG. 34C, FIG. 34D, and FIG. 34E are diagrams illustrating the appearance of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. It is suitable that the display portion 8302 be curved and placed. When the display portion 8302 is curved and placed, a user can feel a high realistic sensation. Note that although the structure in which one display portion 8302 is provided is described in this embodiment as an example, the structure is not limited thereto, and a structure in which two display portions 8302 are provided may also be employed. In that case, one display portion is placed for one eye of the user, so that three-dimensional display using parallax or the like is possible.

Note that the display device of one embodiment of the present invention can be used in the display portion 8302. The display device of one embodiment of the present invention is extremely high-definition; thus, even when an image is magnified using the lenses 8305 as in FIG. 34E, the user does not perceive pixels, and a more realistic image can be displayed.

Next, FIG. 35A to FIG. 35G show examples of electronic devices that are different from the electronic devices illustrated in FIG. 34A to FIG. 34E.

Electronic devices illustrated in FIG. 35A to FIG. 35G include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIG. 35A to FIG. 35G have a variety of functions. Examples include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices illustrated in FIG. 35A to FIG. 35G are not limited thereto, and the electronic devices can have a variety of functions. Although not illustrated in FIG. 35A to FIG. 35G, the electronic devices may each include a plurality of display portions. The electronic devices may each include a camera and the like and have a function of taking a still image, a function of taking a moving image, a function of storing the taken image in a memory medium (external or incorporated in the camera), a function of displaying the taken image on the display portion, or the like.

The details of the electronic devices illustrated in FIG. 35A to FIG. 35G are described below.

FIG. 35A is a perspective view illustrating a television 9100. The television 9100 can include the display portion 9001 having a large screen size of, for example, 50 inches or more, or 100 inches or more.

The display device of one embodiment of the present invention can be used for the display portion 9001 included in the television 9100. Accordingly, the television 9100 can have a narrower bezel, a high-quality image can be displayed on the display portion 9001, and a more realistic image can be displayed.

FIG. 35B is a perspective view illustrating a portable information terminal 9101. The portable information terminal 9101 has a function of one or more selected from a telephone set, a notebook, an information browsing device, and the like, for example. Specifically, the portable information terminal can be used as a smartphone. Note that the portable information terminal 9101 may be provided with the speaker 9003, the connection terminal 9006, the sensor 9007, or the like. The portable information terminal 9101 can display characters and image information on its plurality of surfaces. For example, three operation buttons 9050 (also referred to as operation icons, or simply icons) can be displayed on one surface of the display portion 9001. Information 9051 indicated by dashed rectangles can be displayed on another surface of the display portion 9001. Note that examples of the information 9051 include display indicating reception of an e-mail, an SNS (social networking service), a telephone call, and the like, the title of an e-mail, an SNS, or the like, the sender of an e-mail, an SNS, or the like, date, time, remaining battery, and reception strength of an antenna. Alternatively, the operation buttons 9050 or the like may be displayed on the position where the information 9051 is displayed, in place of the information 9051.

The display device of one embodiment of the present invention can be used for the display portion 9001 included in the portable information terminal 9101. Accordingly, the size of the portable information terminal 9101 can be reduced, a high-quality image can be displayed on the display portion 9001, and a more realistic image can be displayed.

FIG. 35C is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user of the portable information terminal 9102 can see the display (here, the information 9053) with the portable information terminal 9102 put in a breast pocket of the clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

The display device of one embodiment of the present invention can be used for the display portion 9001 of the portable information terminal 9102. Accordingly, the size of the portable information terminal 9101 can be reduced, a high-quality image can be displayed on the display portion 9001, and a more realistic image can be displayed.

FIG. 35D is a perspective view illustrating a watch-type portable information terminal 9200. The portable information terminal 9200 is capable of executing a variety of applications such as mobile phone calls, e-mailing, reading and editing texts, music reproduction, Internet communication, and computer games. The display surface of the display portion 9001 is curved and provided, and display can be performed along the curved display surface. The portable information terminal 9200 can perform near field communication conformable to a communication standard. For example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

The display device of one embodiment of the present invention can be used in the display portion 9001 of the portable information terminal 9200. Accordingly, the portable information terminal 9200 can have a narrower bezel, a high-quality image can be displayed on the display portion 9001, and a more realistic image can be displayed.

FIG. 35E, FIG. 35F, and FIG. 35G are perspective views illustrating a foldable portable information terminal 9201. FIG. 35E is a perspective view of the portable information terminal 9201 in the opened state, FIG. 35F is a perspective view of the portable information terminal 9201 that is shifted from one of the opened state and the folded state to the other, and FIG. 35G is a perspective view of the portable information terminal 9201 in the folded state. The portable information terminal 9201 is highly portable in the folded state and is highly browsable in the opened state because of a seamless large display region. The display portion 9001 of the portable information terminal 9201 is supported by three housings 9000 joined by hinges 9055. By being folded at the hinges 9055 between two housings 9000, the portable information terminal 9201 can be reversibly changed in shape from the opened state to the folded state. For example, the portable information terminal 9201 can be bent with a radius of curvature of greater than or equal to 1 mm and less than or equal to 150 mm.

The display device of one embodiment of the present invention can be used in the display portion 9001 of the portable information terminal 9201. Accordingly, the portable information terminal 9201 can have a narrower bezel, a high-quality image can be displayed on the display portion 9001, and a more realistic image can be displayed.

At least part of the structure examples, the drawings corresponding thereto, and the like described in this embodiment can be implemented in combination with any of the other structure examples, the other drawings, and the like as appropriate.

At least part of this embodiment can be implemented in combination with any of the other embodiments described in this specification as appropriate.

REFERENCE NUMERALS

C1: capacitor, N1: node, N2: node, Tr11: transistor, Tr12: transistor, Tr13: transistor, 10: display device, 10A: display device, 20: first layer, 20*a*: first circuit layer, 20*b*: second circuit layer, 21: first circuit, 22: second circuit, 24: correction data generation circuit, 26: source driver circuit, 30: second layer, 31: wiring, 32: wiring, 33:display portion, 34: pixel, 36: wiring, 38: pixel block, 44:shift register circuit, 45: latch circuit, 46: digital-analog converter circuit, 47: amplifier circuit, 81: logic circuit, 91: current-voltage converter circuit, 92: analog-digital converter circuit, 93: memory circuit, 200A: transistor, 200B: transistor, 200C: transistor, 205: conductor, 214: insulator, 216: insulator, 222: insulator, 224: insulator, 230: metal oxide, 230*a*: metal oxide, 230*b*: metal oxide, 230*c*: metal oxide, 240: conductor, 240*a*: conductor, 240*b*: conductor, 241: insulator, 241*a*: insulator, 241*b*: insulator, 242: conductor, 242*a*: conductor, 242*b*: conductor, 243*a*: region, 243*b*: region, 244: insulator, 250: insulator, 252: metal oxide, 254: insulator, 260: conductor, 260*a*: conductor, 260*b*: conductor, 270: insulator, 271: insulator, 272: insulator, 274: insulator, 280: insulator, 281: insulator, 301*a*: conductor, 301*b*: conductor, 305: conductor, 311: conductor, 313: conductor, 317: conductor, 321: lower electrode, 323: insulator, 325: upper electrode, 331: conductor, 333: conductor, 335: conductor, 337: conductor, 341: conductor, 343: conductor, 347: conductor, 351: conductor, 353: conductor, 355: conductor, 357: conductor, 361: insulator, 363: insulator, 403: element isolation layer, 405: insulator, 407: insulator, 409: insulator, 411: insulator, 413: insulator, 415: insulator, 417: insulator, 419: insulator, 421: insulator, 441: transistor, 443:

conductor, 445: insulator, 447: semiconductor region, 449*a*: low-resistance region, 449*b*: low-resistance region, 451: conductor, 453: conductor, 455: conductor, 457: conductor, 459: conductor, 461: conductor, 463: conductor, 465: conductor, 467: conductor, 469: conductor, 471: conductor, 501: insulator, 503: insulator, 505: insulator, 507: insulator, 509: insulator, 552: transistor, 562: capacitor, 572: light-emitting element, 601: transistor, 602: transistor, 603: transistor, 613: insulator, 614: insulator, 616: insulator, 622: insulator, 624: insulator, 644: insulator, 654: insulator, 674: insulator, 680: insulator, 681: insulator, 701: substrate, 705: substrate, 712: sealant, 716:FPC, 721: hole-injection layer, 722: hole-transport layer, 723: light-emitting layer, 724: electron-transport layer, 725: electron-injection layer, 730: insulator, 732: sealing layer, 734: insulator, 736: coloring layer, 738: light-blocking layer, 750: transistor, 760: connection electrode, 772: conductor, 778: structured part, 780: anisotropic conductor, 782: light-emitting element, 786:EL layer, 786*a*:EL layer, 786*b*:EL layer, 786*c*:EL layer, 788: conductor, 790: capacitor, 792: charge generation layer, 800: transistor, 801*a*: conductor, 801*b*: conductor, 805: conductor, 811: conductor, 813: conductor, 814: insulator, 816: insulator, 817: conductor, 821: insulator, 822: insulator, 824: insulator, 844: insulator, 853: conductor, 854: insulator, 855: conductor, 874:

insulator, 880: insulator, 881: insulator, 901: subpixel, 901B: subpixel, 901G: subpixel, 901R: subpixel, 902: pixel, 911: conductor, 912: conductor, 913: semiconductor, 914: semiconductor, 915*a*: conductor, 915*b*: conductor, 916*a*: conductor, 916*b*: conductor, 917: conductor, 918: conductor, 919: conductor, 920: conductor, 921: conductor, 922: conductor, 923: conductor, 924: conductor, 925: conductor, 926: conductor, 927: conductor, 928: conductor, 929: conductor, 930: conductor, 931: conductor, 990: conductor, 991: bonding layer, 992: insulator, 993*a*: coloring layer, 993*b*: coloring layer, 994: bonding layer, 995: substrate, 1021: insulator, 1022: insulator, 1023: insulator, 1024: insulator, 1025: insulator, 1026: insulator, 1027: insulator, 8000: camera, 8001: housing, 8002: display portion, 8003: operation button, 8004: shutter button, 8006: lens, 8100: finder, 8101: housing, 8102: display portion, 8103: button, 8200: head-mounted display, 8201:

mounting portion, 8202: lens, 8203: main body, 8204: display portion, 8205: cable, 8206: battery, 8300: head-mounted display, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television, 9101: portable information terminal, 9102: portable information terminal, 9200: portable information terminal, 9201: portable information terminal

The invention claimed is:
1. A display device comprising a first layer and a second layer over the first layer,
wherein the first layer comprises first circuits arranged in m rows and n columns (m and n are each an integer greater than or equal to 1 and a product of m and n is an integer greater than or equal to 2),
wherein the second layer comprises pixel blocks arranged in the m rows and the n columns, wherein the pixel blocks each comprise pixels arranged in a rows and b columns (a and b are each an integer greater than or equal to 1), wherein the pixel block comprises a first wiring and a second wiring electrically connected to the pixel, wherein the first wiring and the second wiring included in the pixel block in an i-th row and a j-th column (i is an integer greater than or equal to 1 and less than or equal to m, and j is an integer greater than or equal to 1 and less than or equal to n) are each electrically connected to the first circuit in the i-th row and the j-th column, wherein the first wiring is configured to supply an input signal from the first circuit to the pixel, wherein the second wiring is configured to supply an output signal from the pixel to the first circuit, wherein each of the first circuits comprises a correction data generation circuit, a logic circuit, and a source driver circuit, wherein the correction data generation circuit is configured to convert the output signal into correction data, wherein the logic circuit is configured to correct a video signal input to the first circuit on the basis of the correction data and generating the corrected video signal, and wherein the source driver circuit is configured to convert the corrected video signal into the input signal.

2. The display device according to claim 1,
wherein the pixel block in the i-th row and the j-th column has a region overlapping with the first circuit in the i-th row and the j-th column.

3. The display device according to claim 1,
wherein the pixel block in a p-th row and a q-th column (p is an integer different from i and is greater than or equal to 1 and less than or equal to m, and q is an integer different from j and is greater than or equal to 1 and less than or equal to n) does not overlap with the first circuit in the p-th row and the q-th column.

4. The display device according to claim 1,
wherein the second layer further comprises m second circuits arranged in a column direction,
wherein the pixel block comprises a third wiring electrically connected to a plurality of pixels arranged in a row direction, and
wherein the third wiring included in the pixel block in the i-th row is electrically connected to an i-th second circuit.

5. The display device according to claim 1,
wherein the first layer further comprises m second circuits arranged in a column direction,
wherein the pixel block comprises a third wiring electrically connected to a plurality of pixels arranged in a row direction, and
wherein the third wiring included in the pixel block in the i-th row is electrically connected to an i-th second circuit.

6. The display device according to claim 5,
wherein the pixel block in the i-th row and the j-th column comprises a region overlapping with at least one of the second circuits.

7. The display device according to claim 1,
wherein the correction data generation circuit comprises a memory circuit,
wherein the first layer comprises a first circuit layer and a second circuit layer over the first circuit layer,
wherein the first circuit layer comprises the logic circuit,
wherein the logic circuit comprises a transistor comprising silicon in a channel formation region,
wherein the second circuit layer comprises the memory circuit,
wherein the memory circuit comprises a transistor comprising a metal oxide in a channel formation region, and
wherein the metal oxide comprises In, an element M (M is any one or more of Al, Ga, Y, and Sn), and Zn.

8. The display device according to claim 1,
wherein the pixel comprises a transistor comprising a metal oxide in a channel formation region, and
wherein the metal oxide comprises In, the element M (M is at least one of Al, Ga, Y, and Sn), and Zn.

9. The display device according to claim 1,
wherein the pixel comprises a transistor comprising silicon in a channel formation region.

10. A display device comprising a first layer and a second layer over the first layer,
wherein the first layer comprises first circuits arranged in m rows and n columns (m and n are each an integer greater than or equal to 1 and a product of m and n is an integer greater than or equal to 2),
wherein the second layer comprises pixel blocks arranged in the m rows and the n columns,
wherein the pixel blocks each comprise pixels arranged in a rows and b columns (a and b are each an integer greater than or equal to 1),
wherein the pixel block comprises a first wiring and a second wiring electrically connected to the pixel,
wherein the first wiring and the second wiring included in the pixel block in an i-th row and a j-th column (i is an integer greater than or equal to 1 and less than or equal to m, and j is an integer greater than or equal to 1 and less than or equal to n) are each electrically connected to the first circuit in the i-th row and the j-th column,
wherein the first wiring is configured to supply an input signal from the first circuit to the pixel,
wherein the second wiring is configured to supply an output signal from the pixel to the first circuit, and
wherein the pixel block in the i-th row and the j-th column has a region overlapping with the first circuit in the i-th row and the j-th column.

* * * * *